US010411162B2

(12) United States Patent
Chen et al.

(10) Patent No.: US 10,411,162 B2
(45) Date of Patent: Sep. 10, 2019

(54) SEMICONDUCTOR LIGHT-EMITTING DEVICE INCLUDING PENETRATING TRENCHES

(71) Applicant: EPISTAR CORPORATION, Hsinchu (TW)

(72) Inventors: Chao-Hsing Chen, Hsinchu (TW); Jia-Kuen Wang, Hsinchu (TW); Tzu-Yao Tseng, Hsinchu (TW); Tsung-Hsun Chiang, Hsinchu (TW); Bo-Jiun Hu, Hsinchu (TW); Wen-Hung Chuang, Hsinchu (TW); Yu-Ling Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/265,069

(22) Filed: Sep. 14, 2016

(65) Prior Publication Data
US 2017/0005232 A1   Jan. 5, 2017

Related U.S. Application Data

(63) Continuation of application No. 14/853,511, filed on Sep. 14, 2015, now Pat. No. 9,461,209, which is a (Continued)

(30) Foreign Application Priority Data

Aug. 27, 2013 (TW) .............................. 102130742 A
Nov. 27, 2013 (TW) .............................. 102143409 A
(Continued)

(51) Int. Cl.
*H01L 33/08* (2010.01)
*H01L 33/38* (2010.01)
(Continued)

(52) U.S. Cl.
CPC .......... *H01L 33/382* (2013.01); *H01L 33/387* (2013.01); *H01L 33/46* (2013.01);
(Continued)

(58) Field of Classification Search
CPC ......... H01L 33/22; H01L 33/46; H01L 33/62; H01L 33/382; H01L 33/387; H01L 33/08; H01L 33/38
See application file for complete search history.

(56) References Cited

U.S. PATENT DOCUMENTS 6,346,771 B1   2/2002  Salam
6,486,499 B1  11/2002  Krames et al.
(Continued)

FOREIGN PATENT DOCUMENTS

CN    103390713 A   11/2013
CN    104681702      6/2015
(Continued)

*Primary Examiner* — Mohsen Ahmadi
(74) *Attorney, Agent, or Firm* — Muncy, Geissler, Olds & Lowe, P.C.

(57) ABSTRACT

A semiconductor light-emitting device includes a semiconductor stack including a first semiconductor layer, a second semiconductor layer, and an active layer; a plurality of first trenches penetrating the second semiconductor layer and the active layer to expose the first semiconductor layer; a second trench penetrating the second semiconductor layer and the active layer to expose the first semiconductor layer, wherein the second trench is disposed near an outmost edge of the active layer, and surrounds the active layer and the plurality of first trenches; a patterned metal layer formed on the second semiconductor layer and formed in one of the plurality of first trenches or the second trench; and a first pad portion and a second pad portion both formed on the second
(Continued)

semiconductor layer and electrically connecting the second semiconductor layer and the first semiconductor layer respectively.

19 Claims, 38 Drawing Sheets

Related U.S. Application Data continuation-in-part of application No. 14/554,488, filed on Nov. 26, 2014, now Pat. No. 9,337,394, application No. 15/265,069, which is a continuation-in-part of application No. 14/948,733, filed on Nov. 23, 2015, now Pat. No. 9,761,774, and a continuation-in-part of application No. 14/470,396, filed on Aug. 27, 2014, now Pat. No. 9,768,227.

(60) Provisional application No. 62/092,422, filed on Dec. 16, 2014.

(30) Foreign Application Priority Data

Jun. 6, 2014 (TW) .............................. 103119845 A
Jul. 11, 2014 (TW) .............................. 103124091 A

(51) Int. Cl.
*H01L 33/46* (2010.01)
*H01L 33/62* (2010.01)
H01L 33/22 (2010.01)
H01L 33/00 (2010.01)

(52) U.S. Cl.
CPC .......... *H01L 33/62* (2013.01); *H01L 33/0012* (2013.01); *H01L 33/08* (2013.01); *H01L 33/22* (2013.01); *H01L 33/38* (2013.01); *H01L 2224/48091* (2013.01); *H01L 2224/73265* (2013.01)

(56) References Cited

U.S. PATENT DOCUMENTS

| | | |
|---|---|---|
| 6,885,036 B2 | 4/2005 | Tarsa et al. |
| 7,095,061 B2 | 8/2006 | Steigerwald et al. |
| 8,933,480 B2 | 1/2015 | Akimoto et al. |
| 2006/0192223 A1 | 8/2006 | Lee et al. |
| 2008/0096297 A1 | 4/2008 | Schiaffino et al. |
| 2010/0213474 A1 | 8/2010 | Hsu et al. |
| 2011/0068359 A1 | 3/2011 | Yahata et al. |
| 2011/0204396 A1* | 8/2011 | Akimoto ............... H01L 33/385 257/98 |
| 2012/0032218 A1 | 2/2012 | Choi et al. |
| 2012/0049223 A1 | 3/2012 | Yang et al. |
| 2012/0074441 A1* | 3/2012 | Seo ........ H01L 27/153 257/91 |
| 2012/0138969 A1 | 6/2012 | Moon et al. |
| 2013/0214308 A1 | 8/2013 | Lee et al. |
| 2014/0021505 A1* | 1/2014 | Huang ............... H01L 33/02 257/98 |
| 2014/0191677 A1 | 7/2014 | Kang et al. |
| 2014/0231839 A1* | 8/2014 | Jeon ........ H01L 33/46 257/96 |
| 2014/0353708 A1* | 12/2014 | Seo ........ H01L 27/153 257/98 |
| 2015/0108525 A1 | 4/2015 | Chae et al. |
| 2015/0115278 A1* | 4/2015 | Ichikawa ............... H01L 33/22 257/76 |
| 2015/0144984 A1* | 5/2015 | Chen ............... H01L 33/382 257/99 |
| 2015/0295152 A1* | 10/2015 | Yoneda ............... H01L 33/0095 257/98 |
| 2016/0064617 A1* | 3/2016 | Yang ............... H01L 33/46 257/98 |
| 2016/0155901 A1* | 6/2016 | Lopez ............... H01L 33/06 257/13 |
| 2017/0098734 A1* | 4/2017 | Matsui ............... H01L 33/382 |

FOREIGN PATENT DOCUMENTS

| | | |
|---|---|---|
| KR | 1020140002984 A | 1/2014 |
| TW | 200834982 | 8/2008 |
| TW | 200908399 | 2/2009 |
| TW | 201308674 A1 | 2/2013 |
| TW | 201508947 A | 3/2015 |

* cited by examiner

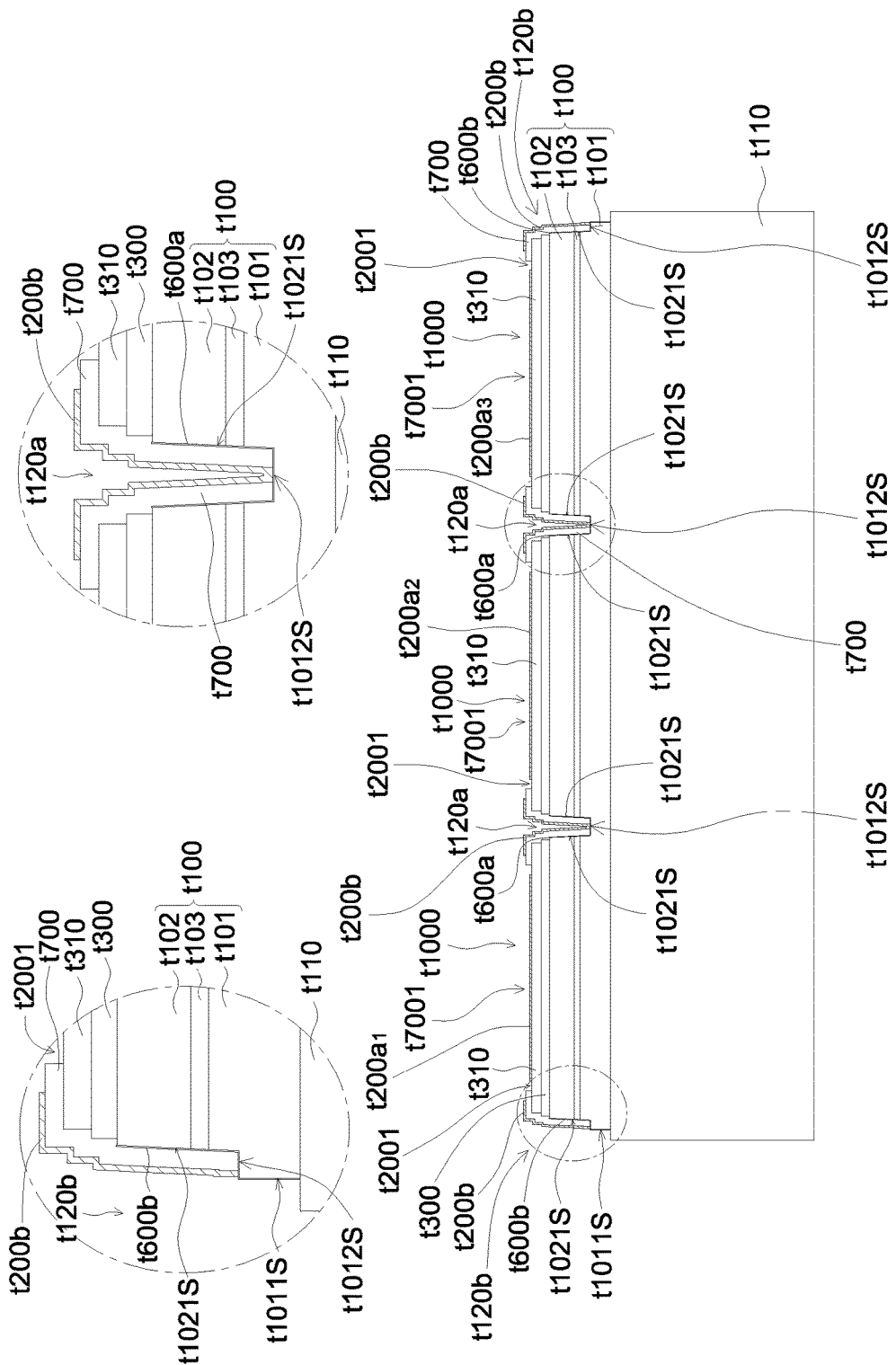

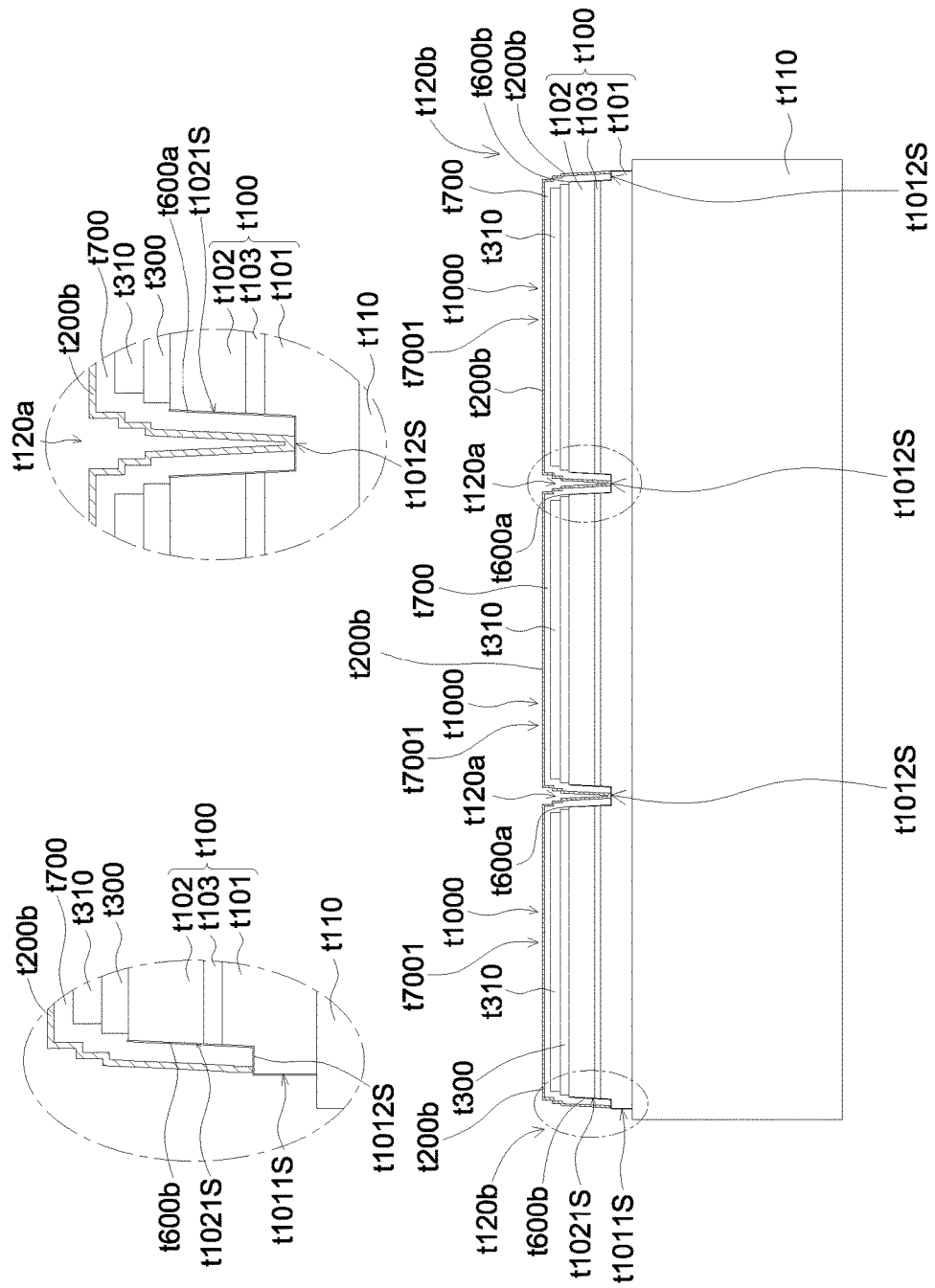

SEMICONDUCTOR LIGHT-EMITTING DEVICE INCLUDING PENETRATING TRENCHES

REFERENCE TO RELATED APPLICATION

This application is a continuation-in-part application of U.S. patent application Ser. No. 14/853,511, filed on Sep. 14, 2015, now issued, which is a continuation-in-part application of U.S. patent application Ser. No. 14/554,488, filed on Nov. 26, 2014, now issued, and which claims the right of priority based on TW Application Serial No. 102143409, filed on Nov 27, 2013; TW Application Serial No. 103119845, filed on Jun 6, 2014; TW Application Serial No. 103124091, filed on Jul 11, 2014, and the content of which is hereby incorporated by reference in the entirety.

This application is a continuation-in-part application of U.S. patent application Ser. No. 14/948,733, filed on Nov. 23, 2015, which claims the right of priority based on U.S. 62/092,422, filed on Dec. 16, 2014, and the content of which is hereby incorporated by reference in the entirety.

This application is a continuation-in-part application of U.S. patent application Ser. No. 14/470,396, filed on Aug. 27, 2014, which claims the right of priority based on TW Application Serial No. 102130742, filed on Aug. 27, 2013, and the content of which is hereby incorporated by reference in the entirety.

TECHNICAL FIELD

The application relates to a structure of a semiconductor light-emitting device, and more particularly, to a semiconductor light-emitting device comprising a depression.

BACKGROUND OF THE INVENTION

Light-emitting diode (LED) is widely applied to optical display apparatus, traffic lights, data storage apparatus, communication apparatus, lighting apparatus, and medical equipment. As shown in FIG. 7, a conventional LED includes an n-type semiconductor layer 1104, an active layer 1106, and a p-type semiconductor layer 1108 sequentially formed on a substrate 1102. Portions of the p-type semiconductor layer 1108 and the active layer 1106 are removed to expose a portion of the n-type semiconductor layer 1104. A p-type electrode a1 and an n-type electrode a2 are formed on the p-type semiconductor layer 1108 and the n-type semiconductor layer 1104 respectively. Because the n-type electrode a2 requires a sufficient surface for following process such as wire bonding, a substantial portion of the active layer 1106 has to be removed and the light extraction efficiency is therefore lowered.

Furthermore, the LED described above can be connected with other devices to form a light-emitting apparatus. FIG. 6 illustrates a diagram of a conventional light-emitting apparatus. As shown in FIG. 6, a light-emitting apparatus 1200 includes a sub-mount 1202 having an electrical circuit 1204; a solder 1206 formed on the sub-mount 1202 to adhere the LED 1210 to the sub-mount 1202, and electrically connecting a substrate 1212 of the LED 1210 and the electrical circuit 1204 of the sub-mount 1202; and an electrical connecting structure 1208 electrical connecting an electrode 1214 of the LED 1210 and the electrical circuit 1204 of the sub-mount 1202, wherein the sub-mount 1202 can be a lead frame or a large scaled mounting substrate suitable for the design of the electrical circuit of the light-emitting apparatus and improving heat dissipation.

SUMMARY OF THE APPLICATION

A semiconductor light-emitting device includes a semiconductor stack including a first semiconductor layer, a second semiconductor layer, and an active layer formed between the first semiconductor layer and the second semiconductor layer, wherein the semiconductor stack includes a first surface; a plurality of depressions penetrating from the first surface, through the first semiconductor layer and the active layer to expose the second semiconductor layer; a first contact structure formed on the first surface to ohmically contact the first surface; a second contact structure formed in the plurality of depressions to ohmically contact the second semiconductor layer; a first pad portion formed on the first surface to electrically connect the first semiconductor layer by the first contact structure; and a second pad portion formed on the first surface to electrically connect the second semiconductor layer by the second contact structure, wherein the first contact structure includes a plurality of extension electrodes, a portion of the second contact structure is formed between the plurality of extension electrodes.

A semiconductor light-emitting device includes a semiconductor stack including a side, a first surface, and a second surface opposite to the first surface, wherein the semiconductor stack includes a conductive via extending from the first surface to the second surface; a transparent conductive layer formed on the second surface; a first pad portion and a second pad portion formed on the first surface to electrically connect to the semiconductor stack; and an insulating layer formed between the first pad portion and the semiconductor stack, and between the second pad portion and the semiconductor stack.

A semiconductor light-emitting device includes a semiconductor stack including a first semiconductor layer, a second semiconductor layer, and an active layer between the first semiconductor layer and the second semiconductor layer, wherein the first semiconductor layer includes a periphery surface surrounding the active layer; a plurality of vias penetrating the semiconductor stack to expose the first semiconductor layer; a patterned metal layer formed on the plurality of vias and covered the periphery surface of the first semiconductor layer; a first pad portion formed on the semiconductor stack to electrically connected to the first semiconductor layer; and a second pad portion formed on the semiconductor stack to electrically connected to the second semiconductor layer.

A semiconductor light-emitting device having an outer periphery includes a semiconductor stack including a first semiconductor layer, a second semiconductor layer, and an active layer between the first semiconductor layer and the second semiconductor layer, wherein the first semiconductor layer includes a periphery surface along the outer periphery of the semiconductor light-emitting device; a plurality of vias penetrating the semiconductor stack to expose the first semiconductor layer; and a patterned metal layer formed on the plurality of vias and covered the periphery surface of the first semiconductor layer, wherein the patterned metal layer comprises an area larger than that of the active layer.

A semiconductor light-emitting device includes a semiconductor stack including a first semiconductor layer, a second semiconductor layer, and an active layer between the first semiconductor layer and the second semiconductor layer; a plurality of first trenches penetrating the second semiconductor layer and the active layer to expose the first semiconductor layer; a second trench penetrating the second semiconductor layer and the active layer to expose the first semiconductor layer, wherein the second trench is disposed near an outmost edge of the active layer, and surrounds the active layer and the plurality of first trenches; a patterned metal layer formed on the second semiconductor layer and formed in one of the plurality of first trenches or the second trench; a first pad portion formed on the second semiconductor layer and electrically connecting the second semiconductor layer; and a second pad portion formed on the second semiconductor layer and electrically connecting the first semiconductor layer.

A semiconductor light-emitting device includes a semiconductor stack including a first semiconductor layer, a second semiconductor layer, and an active layer between the first semiconductor layer and the second semiconductor layer, wherein the first semiconductor layer includes a periphery side surface surrounding the active layer wherein the periphery side surface connects a top surface of the first semiconductor layer; trenches penetrating the active layer and the second semiconductor layer to expose the top surface of the first semiconductor layer wherein the trenches are disposed near the periphery side surface of the first semiconductor layer; and a patterned metal layer formed on the second semiconductor layer and including a first metal region and a second metal region, wherein the second metal region formed in one of the trenches and covering the periphery side surface of the first semiconductor layer.

A semiconductor light-emitting device includes a semiconductor stack including a first semiconductor layer, a second semiconductor layer, and an active layer between the first semiconductor layer and the second semiconductor layer; a depression penetrating from a surface of the second semiconductor layer to expose a surface of the first semiconductor layer, wherein the depression comprises a path surrounding an outer periphery of the semiconductor stack, a longitudinal path, and a transversal path, wherein the path, the longitudinal path, and the transversal path are connected to each other; a first contact structure comprising a periphery formed on the second semiconductor layer; and a second contact structure surrounding the periphery of the first contact structure.

BRIEF DESCRIPTION OF THE DRAWINGS

FIGS. 24A-24B and 25A, 25B, 26A, 26B, 27A, 27B, 28A, 28B, 28C, 29A, 29B, 29C, 30A, 30B, 30C, 31A, 31B and 31C illustrate sequential steps of a method for fabricating a semiconductor light-emitting device T in accordance with an embodiment of the present application.

DETAILED DESCRIPTION OF PREFERRED EMBODIMENTS

Figure 1:
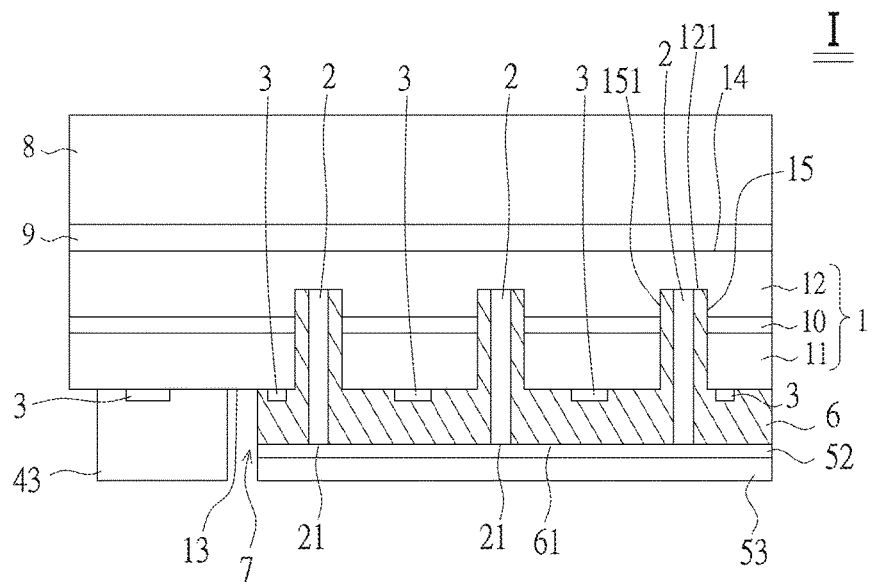
FIG. 1 illustrates a structure diagram of a semiconductor light-emitting device I in accordance with a first embodiment of the present application.

The present invention is illustrated by way of example and not limited by the figures of the accompanying drawings in which same references indicate similar elements. Many aspects of the disclosure can be better understood with reference to the following drawings. Moreover, in the drawings same reference numerals designate corresponding elements throughout. Wherever possible, the same reference numerals are used throughout the drawings to refer to the same or similar elements of an embodiment.

FIG. 1 illustrates a structure diagram of a semiconductor light-emitting device I in accordance with a first embodiment of the present application. The semiconductor light-emitting device I is a flip chip type light-emitting diode device including a semiconductor stack having depressions. The semiconductor light-emitting device I includes a semiconductor stack 1 including a first surface 13 and a second surface 14 opposite to the first surface 13. The semiconductor stack 1 includes a first semiconductor layer 11, a second semiconductor layer 12, and an active layer 10 formed between the first semiconductor layer 11 and the second semiconductor layer 12, wherein the first surface 13 is the surface of the first semiconductor layer 11 and the second surface 14 is the surface of the second semiconductor layer 12. The first semiconductor layer 11 and the second semiconductor layer 12 comprise different conductivity types, electricity, polarity, or dopant elements for providing electrons and holes. The active layer 10 is formed between the first semiconductor layer 11 and the second semiconductor layer 12. The active layer 10 converts electrical energy to optical energy. The dominant wavelength of the light is adjusted by changing physical and chemical compositions of one or more layers in the semiconductor stack 1. The material of the semiconductor stack 1 includes aluminum gallium indium phosphide (AlGaInP), aluminum gallium indium nitride (AlGaInN), or zinc oxide (ZnO). The active layer 10 includes single heterostructure (SH), double heterostructure (DH), double-side double heterostructure (DDH), or multi-quantum well (MQW) structure. Specifically, the active layer 10 includes i-type, p-type, or n-type semiconductor. The active layer 10 emits light when an electrical current passes through the semiconductor stack 1. When the active layer 10 includes AlGaInP based material, the active layer 10 emits amber series light, such as red light, orange light, or yellow light; when the active layer 10 includes AlGaInN based material, the active layer 10 emits blue or green light. The present embodiment illustrates the semiconductor stack 1 with aluminum gallium indium phosphide (AlGaInP) based material.

Figure 2:
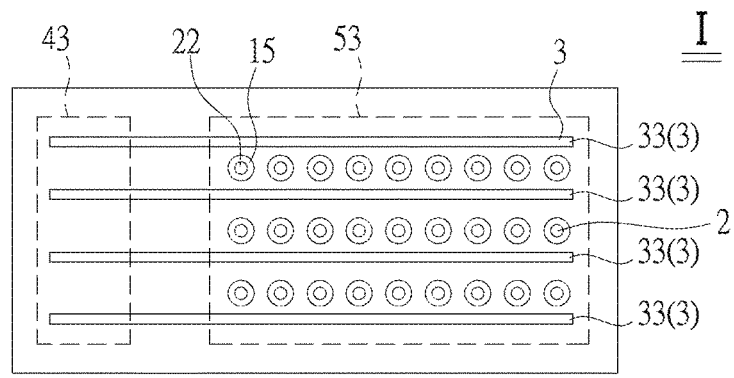
FIG. 2 illustrates a top view of the semiconductor light-emitting device I in accordance with the first embodiment of the present application.

A first contact structure 3 is formed on the first surface 13 to ohmically contact the first semiconductor layer 11, and a first pad portion 43 is formed on a portion of the first contact structure 3. When the electrical current is injected into the first pad portion 43, the electrical current is conducted to an area of the first semiconductor layer 11 not covered by the first pad portion 43 through the first contact structure 3 for improving the current spreading. FIG. 2 illustrates a top view of the semiconductor light-emitting device I. The first pad portion 43 is formed on a side of the semiconductor light-emitting device I, and the shape of the first contact structure 3 includes a plurality of finger electrodes extending from an area under the first pad portion 43 to another side opposite to that of the first pad portion 43 for spreading the current to all areas of the semiconductor stack 1. The material of the first pad portion 43 includes titanium (Ti), platinum (Pt), nickel (Ni), tin (Sn), gold (Au), or an alloy thereof; the material of the first contact structure 3 comprises gold (Au), germanium (Ge), beryllium (Be), or an alloy thereof.

A plurality of depressions 15 is formed in the semiconductor stack 1, and each depression 15 penetrates from the first surface 13 of the first semiconductor layer 11, through the first semiconductor layer 11 and the active layer 10, and into the second semiconductor layer 12 to expose a plurality of surfaces 121 on the second semiconductor layer 12. A plurality of second contact structures 2 is formed in the plurality of depressions 15 to ohmically contact the plurality of surfaces 121. A smallest distance between the second contact structure 2 and the first contact structure 3 ranges between 10 μm and 100 μm. A length of the second contact structure 2 is longer than a depth of the depression 15, thus the second contact structure 2 protrudes the first surface 13. An insulating layer 6 is formed between the second contact structure 2 and a sidewall 151 of the depression 15. The insulating layer 6 separates the second contact structure 2 and the sidewall 151 to avoid of the second contact structure 2 directly contacting the active layer 10 and the first semiconductor layer 11. In the embodiment, the plurality of depressions 15 is a plurality of vias. As shown in the top view of the first embodiment in FIG. 2, the plurality of depressions 15 is formed between a plurality of extension electrodes 33 of the first contact structure 3, and is arranged along an extending direction of the extension electrode 33. The second contact structure 2 includes a plurality of conductive rods 22 disposed in the plurality of depressions 15 respectively. A smallest distance between the conductive rod 22 and the extension electrode 33 ranges between 10 μm and 100 μm. The insulating layer 6 not only fills a space between the second contact structure 2 and the sidewall 151, but also covers a portion of the first contact structure 3 which is formed on the first surface 13. The insulating layer 6 covers a portion of the second contact structure 2 protruding from the first surface 13 and exposes a contact surface 21 of the second contact structure 2. The insulating layer 6 and the contact surface 21 of the second contact structure 2 form a flat surface 61. The material of the second contact structure 2 includes germanium (Ge), beryllium (Be), gold (Au), or an alloy thereof to ohmically contact the second semiconductor layer 12. The insulating layer 6 permits the light emitted from the active layer 10 to transmit thereof. In another embodiment, the first surface 13 can be a rough surface which reduces the total internal reflection of the light passing through the insulating layer 6 and the first surface 13. The material of the insulating layer 6 includes organic materials, such as benzocyclobutene (BCB), perfluorocyclobutane (PFCB), epoxy resin, acrylic resin, cyclic olefin polymer (COC), polymethyl methacrylate (PMMA), polyethylene terephthalate (PET), polycarbonate (PC), polyetherimide, or fluorocarbon polymers; or inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

A reflective layer 52 covers all of the surface 61 and contacts all of the contact surfaces 21 of the second contact structure 2. The material of the reflective layer 52 includes metal material with high reflectivity, such as silver (Ag), gold (Au), aluminum (Al), titanium (Ti), chromium (Cr), copper (Cu), nickel (Ni), platinum (Pt), or an alloy thereof.

A second pad portion 53 covers the reflective layer 52 to connect the reflective layer 52. The second pad portion 53 conducts the electrical current from the external power source into the semiconductor light-emitting device I, wherein the electrical current sequentially flows through the reflective layer 52, the second contact structure 2 and the semiconductor stack 1, and flows out from the first contact structure 3 and the first pad portion 43. The material of the second pad portion 53 includes titanium (Ti), platinum (Pt), nickel (Ni), tin (Sn), gold (Au), or an alloy thereof. A space 7 is formed between the first pad portion 43 and the second pad portion 53 to separate the first pad portion 43 and the second pad portion 53. A width of the space 7 ranges between 70 μm and 250 μm. When the semiconductor light-emitting device I includes a square shape with a side of 12 mil, the area of the first pad portion 43 and the second pad portion 53 is 15%~80% of the area of the semiconductor light-emitting device I; when the semiconductor light-emitting device I includes a square shape with a side of 28 mil, the area of the first pad portion 43 and the second pad portion 53 is 60%~92% of the area of the semiconductor light-emitting device I; when the semiconductor light-emitting device I includes a square shape with a side of 40 mil, the area of the first pad portion 43 and the second pad portion 53 is 75%~95% of the area of the semiconductor light-emitting device I.

An adhesive layer 9 covers the second surface 14, and the substrate 8 is bonded to the second surface 14 by the adhesive layer 9. The light emitted from the active layer 10 can transmit through the adhesive layer 9 and the substrate 8. In another embodiment, the second surface 14 is a rough surface which reduces the total internal reflection of the light transmitting through the adhesive layer 9 and the second surface 14. The refractive index of the adhesive layer 9 preferably ranges between the refractive index of the second semiconductor layer 12 and the refractive index of the substrate 8, and the refractive index of the substrate 8 is preferably smaller than the refractive index of the adhesive layer 9. In the embodiment, the refractive index of the adhesive layer 9 ranges between 1.77 and 3.3, and the refractive index of the substrate 8 ranges between 1 and 1.77. The material of the adhesive layer 9 includes material which is transparent with respect to the light emitted from the active layer 10, including organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, or fluorocarbon polymer; or inorganic materials, such as silicone, glass; dielectric material, such as aluminum oxide ($Al_2O_3$), silicon nitride (SiNx), silicon oxide ($SiO_2$), titanium oxide ($TiO_2$), or magnesium fluoride ($MgF_2$). A material of the substrate 8 includes transparent material which is transparent with respect to the light emitted from the active layer 10, such as gallium arsenide (GaAs), gallium phosphide (GaP), gallium nitride (GaN), sapphire, diamond, glass, quartz, acrylic, zinc oxide (ZnO), or aluminum nitride (AlN).

Figure 3:
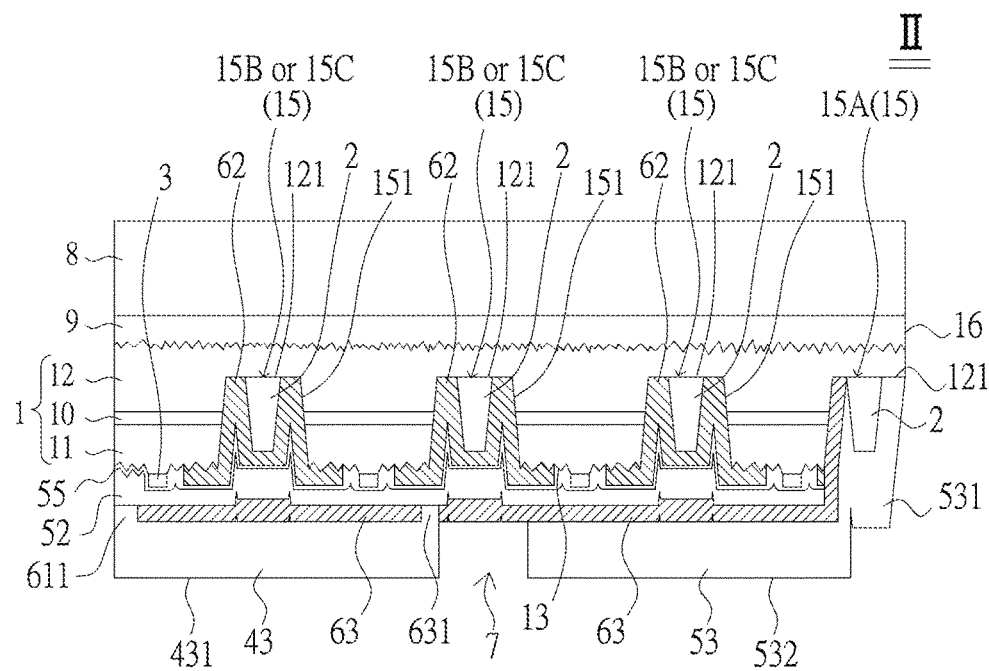
FIG. 3 illustrates a diagram of a semiconductor light-emitting device II in accordance with a second embodiment of the present application.

FIG. 3 illustrates a diagram of a semiconductor light-emitting device II in accordance with a second embodiment of the present application. The semiconductor light-emitting device II is a flip chip type light-emitting diode device including a semiconductor stack 1 having depressions. The semiconductor light-emitting device II includes the semiconductor stack 1 having a first surface 13 and a second surface 14 opposite to the first surface 13. The semiconductor stack 1 includes a first semiconductor layer 11, a second semiconductor layer 12, and an active layer 10 formed between the first semiconductor layer 11 and the second semiconductor layer 12, wherein the first surface 13 is the surface of the first semiconductor layer 11 and the second surface 14 is the surface of the second semiconductor layer 12. The first semiconductor layer 11 and the second semiconductor layer 12 includes different conductivity types, electricity, polarity, or dopant elements for providing electrons and holes. The active layer 10 is formed between the first semiconductor layer 11 and the second semiconductor layer 12. The active layer 10 converts electrical energy to optical energy. The dominant wavelength of the light is adjusted by changing physical and chemical compositions of one or more layers in the semiconductor stack 1. The material of the semiconductor stack 1 includes aluminum gallium indium phosphide (AlGaInP), aluminum gallium indium nitride (AlGaInN), or zinc oxide (ZnO). The active layer 10 includes single heterostructure (SH), double heterostructure (DH), double-side double heterostructure (DDH), or multi-quantum well (MQW) structure. Specifically, the active layer 10 includes i-type, p-type, or n-type semiconductor. The active layer 10 emits light when an electrical current passes through the semiconductor stack 1. When the active layer 10 includes AlGaInP based material, the active layer 10 emits amber series light, such as red light, orange light, or yellow light; when the active layer 10 includes AlGaInN based material, the active layer 10 emits blue or green light. The present embodiment illustrates the semiconductor stack 1 with aluminum gallium indium phosphide (AlGaInP) based material.

In the embodiment, the depression 15 is formed in the semiconductor stack 1, penetrates from the first surface 13 of the first semiconductor layer 11, through the first semiconductor layer 11, the active layer 10, and into the second semiconductor layer 12 to expose a plurality of surfaces 121 on the second semiconductor layer 12. As shown in the top view of the semiconductor light-emitting device II of FIG. 4 in accordance with the second embodiment of the present application, the depression 15 includes a path 15A formed on a side 16 of the semiconductor stack 1, a longitudinal path 15B, or a transversal path 15C, wherein the path 15A, the path 15B, and the path 15C are connected to each other. In a top view, a shape of the path 15B and the transversal path 15C includes a cross. The second contact structure 2 is formed in the depression 15, continuously along the path 15A, the path 15B, and the path 15C to ohmically contact the surface 121 for uniformly spreading the electrical current on the second semiconductor layer 12. An insulating layer 62 conformably covers the second contact structure 2, the path 15B, the path 15C, and the first surface 13 adjacent to the path 15B and the path 15C, but not covers the first contact structure 3. The insulating layer 62 separates the second contact structure 2 and the sidewall 151 to avoid of the second contact structure 2 directly contacting the active layer 10 and the first semiconductor layer 11. The material of the second contact structure 2 includes germanium (Ge), beryllium (Be), gold (Au), or an alloy thereof to ohmically contact the second semiconductor layer 12. The insulating layer 62 permits the light emitted from the active layer 10 to transmit thereof. The material of the insulating layer 62 includes organic materials, such as benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, or fluorocarbon polymer; or inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

Figure 4:
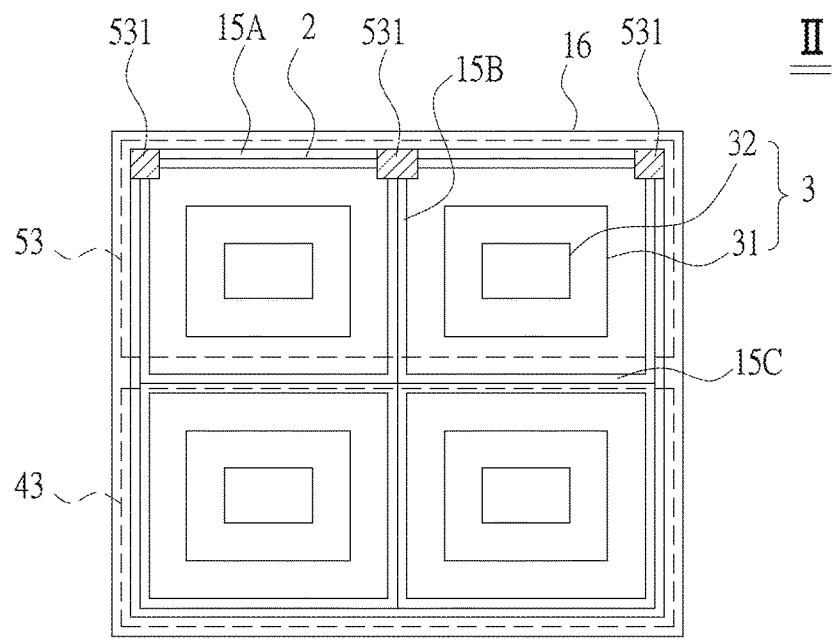
FIG. 4 illustrates a top view of the semiconductor light-emitting device II in accordance with the second embodiment of the present application.

In the embodiment, the first surface 13 can be a rough surface which reduces the total internal reflection of the light passing through the first surface 13 and the insulating layer 62. The method of forming the rough surface includes wet etch, such as soaking in acidic or alkaline etching solution, or dry etching, such as inductively coupled plasma (ICP). The contact structure 3 is formed on the first surface 13 to ohmically contact the first semiconductor layer 11. As shown in FIG. 4, the shape of the first contact structure 3 includes a pattern, such as point, line, circle, ellipse, square, or rectangular. In the embodiment, the first contact structure 3 is distributed on the first semiconductor layer 11 in a shape of a plurality of squares including a big square 31 and a small square 32, which are independent to each other and not directly contact with each other. The periphery of each square is surrounded by the second contact structure 2. The material of the first contact structure 3 includes gold (Au), germanium (Ge), beryllium (Be), or an alloy thereof to ohmically contact the first semiconductor layer 11.

A transparent conductive layer 55 conformably covers the first surface 13, the first contact structure 3, and the insulating layer 62. A reflective layer 52 conformably covers the transparent conductive layer 55. The transparent conductive layer 55 includes transparent conductive material and a thickness ranging between 1 μm and 10 μm for adhering with the reflective layer 52 and avoid of the reflective layer 52 from peeling. The material of the reflective layer 52 includes metal material with high reflectivity, such as silver (Ag), gold (Au), aluminum (Al), titanium (Ti), chromium (Cr), copper (Cu), nickel (Ni), platinum (Pt), or an alloy thereof, to reflect the light emitted from the active layer 10 toward the second surface 14.

A patterned insulating layer 63 conformably covers the reflective layer 52, forms along the periphery of the reflective layer 52 to cover the sidewall 151 of the path 15A. The insulating layer 63 includes a via 631 exposing the reflective layer 52. The insulating layer 63 includes non-conductive material organic materials, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

A first pad portion 43 and a second pad portion 53 are formed on the insulating layer 63. A bonding surface 431 of the first pad portion 43 and a bonding surface 532 of the second pad portion 53 are on the same planar surface by forming the insulating layer 63 under the first pad portion 43 and the second pad portion 53. A space 7 is formed between the first pad portion 43 and the second pad portion 53 to separate the first pad portion 43 and the second pad portion 53. In the embodiment, a width of the space 7 ranges between 70 μm and 250 μm. When the semiconductor light-emitting device includes a square shape with a side of 12 mil, the area of the first pad portion 43 and the second pad portion 53 is 15%~80% of the area of the semiconductor light-emitting device; when the semiconductor light-emitting device includes a square shape with a side of 28 mil, the area of the first pad portion 43 and the second pad portion 53 is 60%~92% of the area of the semiconductor light-emitting device; when the semiconductor light-emitting device includes a square shape with a side of 40 mil, the area of the first pad portion 43 and the second pad portion 53 is 75%~95% of the area of the semiconductor light-emitting device. The first pad portion 43 directly contacts the reflective layer 52 through the via 631, the second pad portion 53 is separated from the reflective layer 52 by the insulating layer 63. The second pad portion 53 includes a connecting part 531 covering the path 15A to directly connect the second contact structure 2. The connecting part 531 covers the insulating layer 63 of the sidewall 151 of the path 15A to avoid of directly contacting the active layer 10 and the first semiconductor layer 11. The first pad portion 43 and the second pad portion 53 conduct the electrical current from the external power source into the semiconductor light-emitting device II for emitting light. The electrical current flows into the first pad portion 43, through the hole 631, the reflective layer 52, into the semiconductor stack 1 by way of the areas having lower contact resistance which is between the first contact structure 3 and the first semiconductor layer 11, the electrical current sequentially flows through the first semiconductor layer 11, the active layer 10, and the second semiconductor layer 12, and flows out the second pad portion 53 by the second contact structure 2. The material of the first pad portion 43 and the second pad portion 53 include titanium (Ti), platinum (Pt), nickel (Ni), tin (Sn), gold (Au), or an alloy thereof. In another embodiment, the insulating layer 63 is disposed only between the second pad portion 53 and the reflective layer 52, and the first pad portion 43 directly contacts the reflective layer 52 for increasing the heat dissipation efficiency. The first pad portion 43 can be further processed through evaporation for forming the bonding surface 431 of the first pad portion 43 and the bonding surface 532 of the second pad portion 53 on the same planar surface.

An adhesive layer 9 covers the second surface 14, and the substrate 8 is bonded to the second surface 14 by the adhesive layer 9. The light emitted from the active layer 10 can transmit through the adhesive layer 9 and the substrate 8. The second surface 14 can form a rough surface which reduces the total internal reflection and increases the light extraction efficiency when the light transmits through the adhesive layer 9 and the second surface 14. The method of forming the rough surface includes wet etch, such as soaking in acidic or alkaline etching solution, or dry etching, such as ICP. The refractive index of the adhesive layer 9 preferably ranges between the refractive index of the second semiconductor layer 12 and the refractive index of the substrate 8, and the refractive index of the substrate 8 is preferably smaller than the refractive index of the adhesive layer 9. In the present embodiment, the refractive index of the adhesive layer 9 ranges between 1.77 and 3.3, and the refractive index of the substrate ranges between 1 and 1.77. The material of the adhesive layer 9 includes material which is transparent with respect to the light emitted from the active layer 10, including organic materials, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, glass; dielectric materials, such as aluminum oxide ($Al_2O_3$), silicon nitride (SiNx), silicon oxide ($SiO_2$), titanium oxide ($TiO_2$), or magnesium fluoride ($MgF_2$). A material of the substrate 8 includes transparent material which is transparent with respect to the light emitted from the active layer 10, such as gallium arsenide (GaAs), gallium phosphide (GaP), gallium nitride (GaN), sapphire, diamond, glass, quartz, acryl, zinc oxide (ZnO), or aluminum nitride (AlN).

Figure 8:
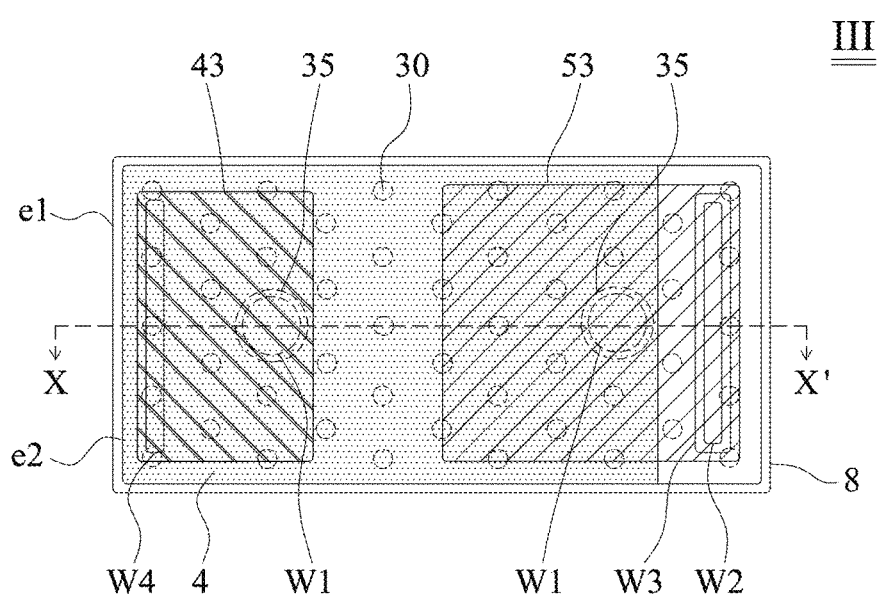
FIG. 8 illustrates a top view of a semiconductor light-emitting device III in accordance with another embodiment of the present application.
Figure 9:
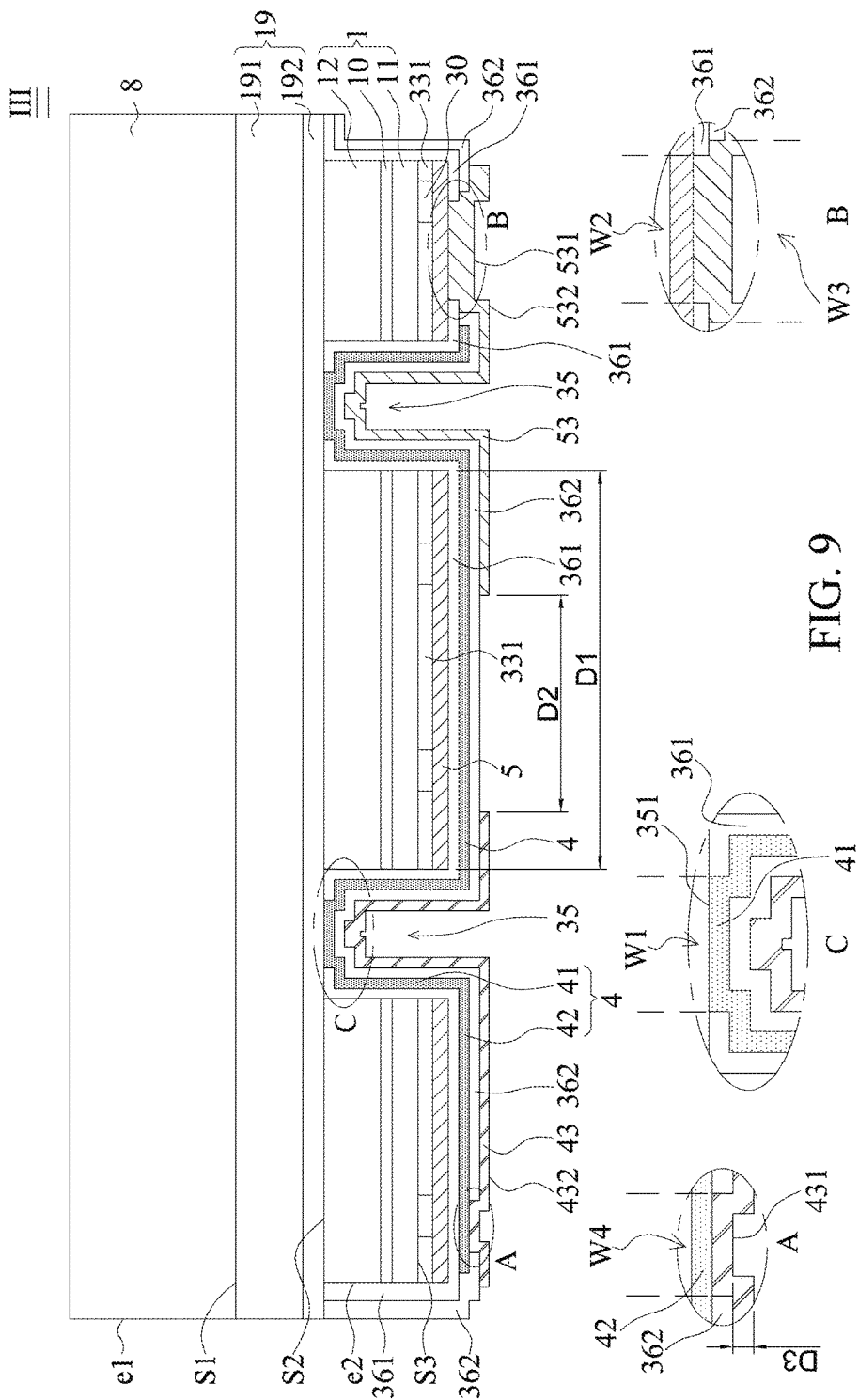
FIG. 9 illustrates a cross-sectional view along line X-X' of FIG. 8.

FIG. 8 illustrates a top view of a semiconductor light-emitting device III in accordance with another embodiment of the present application. FIG. 9 illustrates a cross-sectional view along line X-X' of FIG. 8. The semiconductor light-emitting device III is a flip chip type light-emitting diode device. As shown in FIG. 9, the semiconductor light-emitting device III includes a semiconductor stack 1 including a first surface S3 and a second surface S2 opposite to the first surface S3. The semiconductor stack 1 includes a first semiconductor layer 11, a second semiconductor layer 12, and an active layer 10 formed between the first semiconductor layer 11 and the second semiconductor layer 12, wherein the first surface 13 is the surface of the first semiconductor layer 11 and the second surface 14 is the surface of the second semiconductor layer 12. The first semiconductor layer 11 and the second semiconductor layer 12, such as cladding layers or confinement layers, comprise different conductivity types, electricity, polarity, or dopant elements to provide electrons and holes. The active layer 10 is formed between the first semiconductor layer 11 and the second semiconductor layer 12 so the electrons and the holes combine in the active layer 10 under an electrical current to convert electrical energy to optical energy for emitting a light. The dominant wavelength of the light is adjusted by changing physical and chemical compositions of one or more layers in the semiconductor stack 1. The material of the semiconductor stack 1 includes group III-V semiconductor materials, such as $Al_xIn_yGa_{(1-x-y)}N$ or $Al_xIn_yGa_{(1-x-y)}P$, wherein $0 \leq x$, $y \leq 1$; $(x+y) \leq 1$. In accordance with the material of the active layer 10, the semiconductor stack 1 can emit a red light with a dominant wavelength between 610 nm and 650 nm, a green light with a dominant wavelength between 530 nm and 570 nm, or a blue light with a dominant wavelength between 450 nm and 490 nm. The active layer 10 includes single heterostructure (SH), double heterostructure (DH), double-side double heterostructure (DDH), or multi-quantum well (MQW) structure. The material of the active layer 10 includes i-type, p-type, or n-type semiconductor.

A plurality of contact structures 30 is uniformly distributed on the first surface S3 of the semiconductor stack 1 to ohmically contact the first semiconductor layer 11 for spreading the current on the first semiconductor layer 11. For example, a metal layer can be deposited on the first surface S3 of the semiconductor stack 1 and patterned to form a plurality of contact structures 30. The material of the contact structure 30 includes gold (Au), germanium (Ge), beryllium (Be), or an alloy thereof. The shape of the contact structure 30 includes circle or polygon. As shown in the top view of the semiconductor light-emitting device III of FIG. 8, the shape of the contact structure 30 is circle and a plurality of contact structures 30 is arranged into a plurality of rows on the semiconductor stack 1, wherein the plurality of contact structures 30 on adjacent two rows are staggered.

A first reflective layer 331 including low refractive index materials is formed on the first surface S3 of the semiconductor stack 1, and/or between the plurality of contact structures 30. Furthermore, the plurality of contact structures 30 can be formed between the first reflective layer 331 and the semiconductor stack 1. Because the refractive index of the group III-V semiconductor materials is between 2 and 4, a material having a refractive index lower than that of the group III-V semiconductor materials is chosen to totally reflect the light emitted from the active layer 10 between the first surface S3 and the first reflective layer 331 for increasing the light extraction efficiency of the semiconductor light-emitting device III. The low refractive index material includes oxide, fluoride, or metal oxide. The fluoride includes magnesium fluoride ($MgF_2$) or calcium fluoride ($CaF_2$). Metal oxide includes titanium oxide ($TiO_2$), tantalum oxide ($Ta_2O_5$), tellurium dioxide ($TeO_2$), yttrium oxide ($Y_2O_3$), hafnium oxide ($HfO_2$), aluminum oxide ($Al_2O_3$), indium zinc oxide (IZO), or indium tin oxide (ITO).

In order to increase the light extraction efficiency of the semiconductor light-emitting device III, the first surface S3 of the semiconductor stack 1 can be a rough surface, and/or a second reflective layer 5 is formed on the first surface S3. The method for forming the rough surface includes etching, polishing, or printing. The etching method includes wet etch, such as soaking in acidic or alkaline etching solution, or dry etching, such as ICP. The structure of the second reflective layer 5 can be one or more layers. The material of the second reflective layer 5 includes metal material with high reflectivity, such as silver (Ag), gold (Au), aluminum (Al), titanium (Ti), chromium (Cr), copper (Cu), nickel (Ni), platinum (Pt), or an alloy thereof. The high reflectivity is 80% or above with respect to the dominant wavelength of the light emitted from the semiconductor light-emitting device III. The second reflective layer 5 is more away from the semiconductor stack 1 than the first reflective layer 331 so the light not reflected by the first reflective layer 331 can be further reflected by the second reflective layer 5. As shown in FIG. 9, the second reflective layer 5 contacts with the first reflective layer 331 and/or the plurality of contact structures 30 for forming electrical connection when electrical current is injected.

A transparent conductive layer 19 is formed on the second surface S2 of the semiconductor stack 1 and electrically connected to the semiconductor stack 1 when electrical current is injected. The material of the transparent conductive layer 19 includes transparent material which is transparent to the light emitted from the active layer 10. In order to reduce the possibility of total internal reflection of the light emitted from the active layer 10 on the second surface S2, the transparent conductive layer 19 includes non-group III-V semiconductor materials, wherein the refractive index of the material of the transparent conductive layer 19 is lower than that of the semiconductor stack 1, and the structure of the transparent conductive layer 19 can be one or more layers, for example, including a first transparent conductive layer 191 and a second transparent conductive layer 192. Specifically, when the transparent conductive layer 19 is a structure of multi layers, the first transparent conductive layer 191, which is more away from the semiconductor stack 1 than other transparent conductive layers, includes material for improving lateral current spreading, for example, indium zinc oxide (IZO). The second transparent conductive layer 192, which is closer to the semiconductor stack 1 than other transparent conductive layers, includes material for forming ohmically contact with the second semiconductor layer 12, for example, indium tin oxide (ITO).

In order to increase the light extraction efficiency of the semiconductor light-emitting device III, the second surface S2 of the semiconductor stack 1 can be a rough surface to reduce total internal reflection. The method for forming the rough surface includes etching, polishing, or printing. The etching method includes wet etch, such as soaking in acidic or alkaline etching solution, or dry etching, such as ICP.

In other embodiments of the present application, a substrate 8 can be optionally formed on the semiconductor stack 1. The substrate 8 can be bonded to the second surface S2 of the semiconductor stack 1 by the transparent conductive layer 19. The substrate 8 includes transparent material which is transparent to the light emitted from the active layer 10, such as gallium arsenide (GaAs), gallium phosphide (GaP), gallium nitride (GaN), sapphire, diamond, glass, quartz, acrylic, zinc oxide (ZnO), or aluminum nitride (AlN). In order to reduce the total internal reflection of the light emitted from the active layer 10 on the interface 51 between the substrate 8 and the transparent conductive layer 19, the refractive index of the material of the substrate 8 is smaller than that of the transparent conductive layer 19, and the refractive index of the transparent conductive layer 19 is between the refractive index of the substrate 8 and the refractive index of the semiconductor stack 1. Concerning the process yield, a side e1 of the substrate 8 can be planar with a side e2 of the semiconductor stack 1, or the side e1 of the substrate 8 protrudes the side e2 of the semiconductor stack 1, as shown in FIG. 9.

In an embodiment of the present application, the semiconductor stack 1 includes a conductive via 35 extending from the first surface S3 to the second surface S2. As shown in FIG. 8, the semiconductor light-emitting device III includes a plurality of conductive vias 35, wherein the plurality of conductive vias 35 is separated from each other from a top view of the semiconductor light-emitting device III, and each of the plurality of conductive vias 35 is surrounded by the semiconductor stack 1. As shown in FIG. 9, the plurality of conductive vias 35 penetrates from the first surface S3 of the semiconductor stack 1, through the semiconductor stack 1 by removing a portion of the semiconductor stack 1. In a variant of the embodiment, an end 351 of the conductive via 35 exposes on the second surface S2 of the semiconductor stack 1 as shown in FIG. 9. In another variant of the embodiment, the end 351 of the conductive via 35 extends a depth into the transparent conductive layer 19 (not shown). The forming position of the conductive via 35 is staggered with the forming position of the contact structure 30, as shown in FIG. 8, the plurality of contact structures 30 surrounds the conductive via 35 and is disposed on the periphery of the conductive via 35.

A first insulating layer 361 can be deposited on the semiconductor stack 1 and in the conductive via 35 through evaporation. A portion of the first insulating layer 361 covering the end 351 of the conductive via 35 and a portion of the first insulating layer 361 covering the second reflective layer 5 can be removed through pattering to form a first opening W1 on the end 351 of the conductive via 35 and expose the transparent conductive layer 19, and to form a second opening W2 on the second reflective layer 5 and expose the second reflective layer 5. The material of the first insulating layer 361 includes non-conductive material including organic materials, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

As shown in FIG. 8 and FIG. 9, a conductive material, such as metal, is deposited in the conductive via 35 through evaporation or sputtering to cover the first opening W1 and cover a portion of the first insulating layer 361 to form a connecting layer 4. The connecting layer 4 includes a first connecting layer 41 formed in the conductive via 35 and a second connecting layer 42 formed on the first insulating layer 361, wherein the first connecting layer 41 surrounds the periphery of the conductive via 35, the first insulating layer 361 is formed between the semiconductor stack 1 and the first connecting layer 41 to electrically insulate the semiconductor stack 1 and the first connecting layer 41, and a plurality of connecting layers 41 formed in the plurality of conductive vias 35 is electrically connected to each other through the second connecting layer 42. As shown in FIG. 9, the end 351 of the plurality of conductive vias 35 is exposed on the second surface S2 of the semiconductor stack 1, the first opening W1 and the second opening W2 are formed on the second surface S2 and the first surface S3 respectively by pattering the first insulating layer 361, and the connecting layer 4 covers the first opening W1 and exposes the second opening W2. When the transparent conductive layer 19 includes a structure of multi layers, for example, includes the first transparent conductive layer 191 and the second transparent conductive layer 192, the end 351 of the conductive via 35 can extend into the first transparent conductive layer 191 which is more away from the semiconductor stack 1 than other transparent conductive layers. In view of the better lateral current spreading ability of the first transparent conductive layer 191, the current injected from the connecting layer 4 is uniformly spreads in the first transparent conductive layer 191 and conducted to the second semiconductor layer 12 through the second transparent conductive layer 192.

A second insulating layer 362 can be deposited on the semiconductor stack 1 by evaporation or sputtering. A portion of the second insulating layer 362 covering the second connecting layer 42 and a portion of the second insulating layer 362 covering the second reflective layer 5 can be removed through pattering to form a third opening W3 on the second reflective layer 5 and expose the second reflective layer 5, and to form a fourth opening W4 on the second connecting layer 42 and expose the second connecting layer 42. From the top view of the semiconductor light-emitting device III, the third opening W3 is larger than the second opening W2, the position of the third opening W3 and the position of the second opening W2 are overlapped, and the position of the fourth opening W4 and the position of the first opening W1 can be overlapped or staggered, as shown in FIG. 8. The material of the second insulating layer 362 includes non-conductive material including organic materials, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

A first pad portion 43 and a second pad portion 53 are formed on the same side of the semiconductor stack 1. The first pad portion 43 is formed on partial surface of the second insulating layer 362 to cover the fourth opening W4 for electrically connecting to the connecting layer 4. In an embodiment of the present application, a metal material is deposited in the fourth opening W4 and the conductive via 35, the metal material is continuously deposited along the conductive via 35, the sidewall of the first insulating layer 361, and/or the second insulating layer 362 to cover partial surface of the second insulating layer 362 to form the first pad portion 43. As shown in the cross-sectional view of the semiconductor light-emitting device III, the first pad portion 43 includes a first face 431 and a second face 432 protruding the first face 431, wherein the first face 431 and the second face 432 are approximately parallel with the first surface S3 of the semiconductor stack 1. A height D3 is formed between the first face 431 and the second face 432, and the height D3 is larger than or equal to a thickness of the second insulating layer 362.

As shown in FIG. 9, a portion of the surface of the second reflective layer 5 is not covered by the first insulating layer 361 and/or the second insulating layer 362. The metal material can be evaporated in the conductive via 35, the second opening W2 and/or the third opening W3, and the metal material is continuously deposited along the conductive via 35, the sidewall of the first insulating layer 361 and/or the sidewall of the second insulating layer 362 to extend onto a portion of the second insulating layer 362 for forming the second pad portion 53. As shown in the cross-sectional view of the semiconductor light-emitting device III of FIG. 9, the second pad portion 53 includes a first face 531 and a second face 532 protruding the first face 531, wherein the first face 531 and the second face 532 are approximately parallel with the first surface S3 of the semiconductor stack 1. From a top view of the semiconductor light-emitting device III, the conductive via 35 is formed on an area covered by the first pad portion 43 and/or the second pad portion 53. In an embodiment of the present application, concerning the current spreading ability of the transparent conductive layer 19, one of the plurality of conductive vias 35 is formed in a region covered by the first pad portion 43 and another one of the plurality of conductive vias 35 is formed in a region covered by the second pad portion 53. The shortest distance D1 between the two conductive vias 35 is larger than the shortest distance D2 between the first pad portion 43 and the second pad portion 53 as shown in FIG. 9.

From the top view of the semiconductor light-emitting device III, the connecting layer 4 extends from the side e2 of the semiconductor stack 1 to the side of the conductive via 35 to overlap with the forming regions of the first pad portion 43 and the second pad portion 53, and cover the plurality of conductive vias 35 so as to connect the plurality of conductive vias 35 as shown in FIG. 8, or locally forms between the plurality of conductive vias 35 to connect the plurality of conductive vias 35 with a patterned structure (not shown), for example, line or mesh.

An electrical current from external power source can be injected from the first pad portion 43 and conducted to the second semiconductor layer 12 through the connecting layer 4 and the transparent conductive layer 19. The material of the first pad portion 43 includes titanium (Ti), platinum (Pt), nickel (Ni), tin (Sn), gold (Au), or an alloy thereof.

The second pad portion 53 is formed on a portion of the contact structure 30. When an electrical current from external power source is injected into the second pad portion 53, the second pad portion 53 is electrically connected with the first semiconductor layer 11 through the contact structure 30. The material of the second pad portion 53 includes titanium (Ti), platinum (Pt), nickel (Ni), tin (Sn), gold (Au), or an alloy thereof. An area of the first pad portion 43 can be the same as or different from that of the second pad portion 53.

Figure 10:
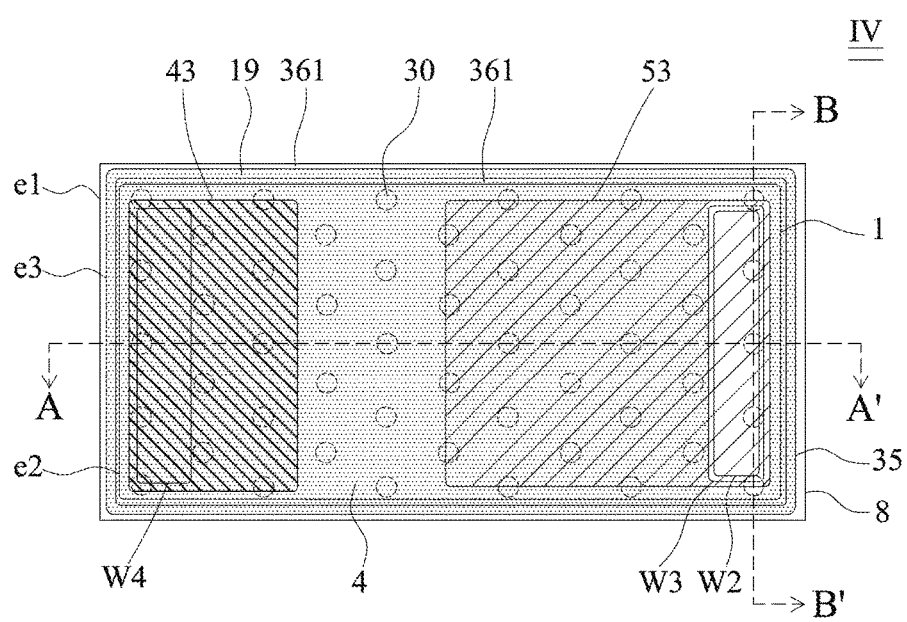
FIG. 10 illustrates a top view of a semiconductor light-emitting device IV in accordance with another embodiment of the present application.
Figure 11:
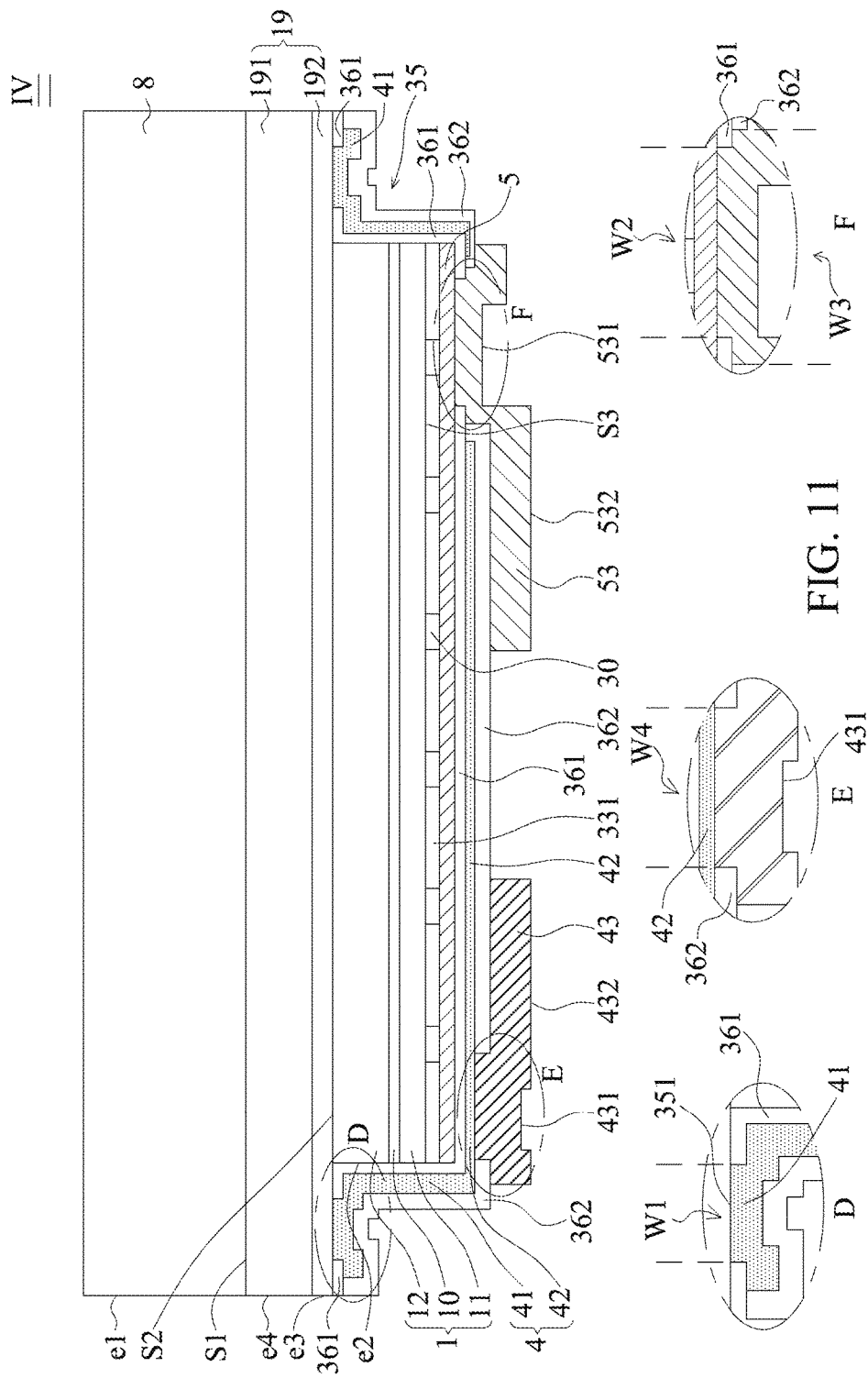
FIG. 11 illustrates a cross-sectional view along line A-A' of FIG. 10.
Figure 12:
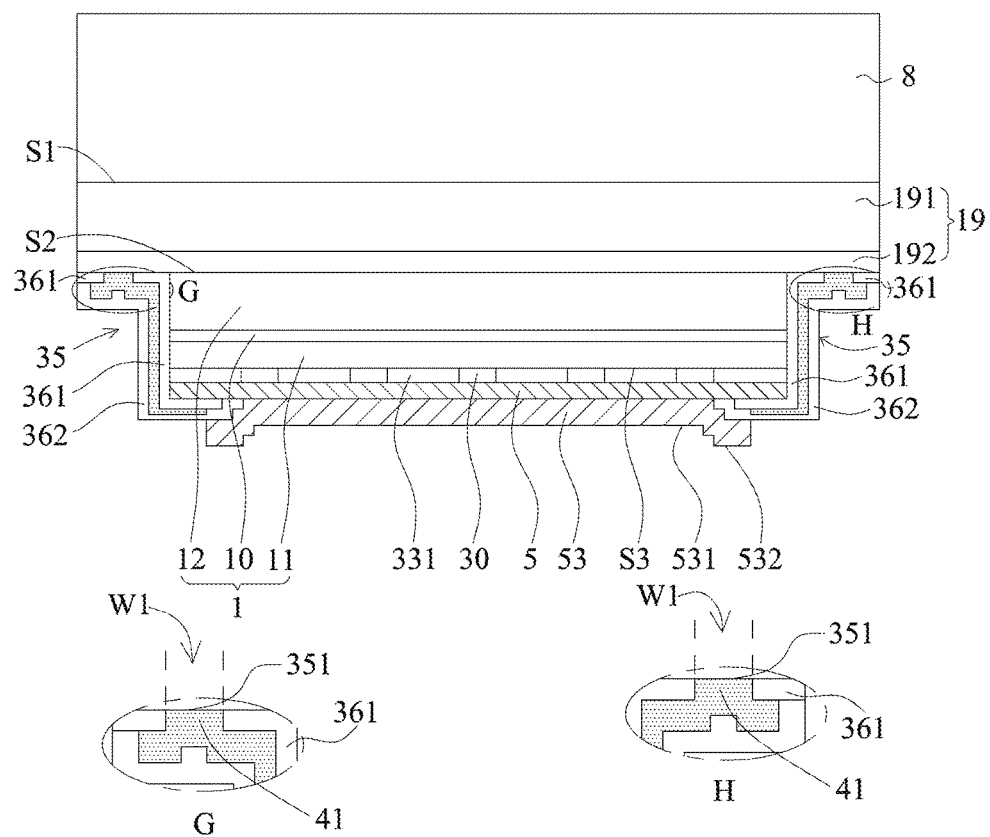
FIG. 12 illustrates a cross-sectional view along line B-B' of FIG. 10.

FIG. 10 illustrates a top view of a semiconductor light-emitting device IV in accordance with another embodiment of the present application. FIG. 11 illustrates a cross-sectional view along line A-A' of FIG. 10. FIG. 12 illustrates a cross-sectional view along line B-B' of FIG. 10. The semiconductor light-emitting device IV is a flip chip type light-emitting diode device. As shown in FIG. 11 and FIG. 12, the semiconductor light-emitting device IV includes a semiconductor stack 1 including a first surface S3, a second surface S2 opposite to the first surface S3, and a side e2 connecting the first surface S3 and the second surface S2. The semiconductor stack 1 includes a first semiconductor layer 11, a second semiconductor layer 12, and an active layer 10 formed between the first semiconductor layer 11 and the second semiconductor layer 12, wherein the first surface S3 is the surface of the first semiconductor layer 11 and the second surface S2 is the surface of the second semiconductor layer 12. The first semiconductor layer 11 and the second semiconductor layer 12 such as cladding layers or confinement layers comprise different conductivity types, electricity, polarity, or dopant elements to provide electrons and holes. The active layer 10 is formed between the first semiconductor layer 11 and the second semiconductor layer 12 so the electrons and the holes combine in the active layer 10 under an electrical current to convert electrical energy to optical energy for emitting a light. The dominant wavelength of the light is adjusted by changing physical and chemical compositions of one or more layers in the semiconductor stack 1. The material of the semiconductor stack 1 includes group III-V semiconductor materials, such as $Al_xIn_yGa_{(1-x-y)}N$ or $Al_xIn_yGa_{(1-x-y)}P$, wherein $0 \leq x$, $y \leq 1$; $(x+y) \leq 1$. In accordance with the material of the active layer 10, the semiconductor stack 1 can emit a red light with a dominant wavelength between 610 nm and 650 nm, a green light with a dominant wavelength between 530 nm and 570 nm, or a blue light with a dominant wavelength between 450 nm and 490 nm. The active layer 10 includes single heterostructure (SH), double heterostructure (DH), double-side double heterostructure (DDH), or multi-quantum well (MQW) structure. The material of the active layer 10 includes i-type, p-type, or n-type semiconductor.

A plurality of contact structures 30 is uniformly distributed on the first surface S3 of the semiconductor stack 1 to ohmically contact the first semiconductor layer 11 for spreading the current on the first semiconductor layer 11. For example, a metal layer can be deposited on the first surface S3 of the semiconductor stack 1 and patterned to form a plurality of contact structures 30. The material of the contact structure 30 includes gold (Au), germanium (Ge), beryllium (Be), or an alloy thereof. The shape of the contact structure 30 includes circle or polygon. From the top view of the semiconductor light-emitting device IV of FIG. 10, the shape of the contact structure 30 is circle and a plurality of contact structures 30 is arranged into a plurality of rows on the semiconductor stack. 1, wherein the plurality of contact structures 30 disposed on adjacent two rows is staggered.

A first reflective layer 331 including low refractive index materials is formed on the first surface S3 of the semiconductor stack 1, and/or between the plurality of contact structures 30. Furthermore, the plurality of contact structures 30 can be formed between the first reflective layer 331 and the semiconductor stack 1. Because the refractive index of the group III-V semiconductor materials is between 2 and 4, a material having a refractive index lower than that of the group III-V semiconductor materials is chosen to totally reflect the light emitted from the active layer 10 between the first surface S3 and the first reflective layer 331 for increasing the light extraction efficiency of the semiconductor light-emitting device IV. The low refractive index material includes oxide, fluoride, or metal oxide. The fluoride includes magnesium fluoride ($MgF_2$) or calcium fluoride ($CaF_2$). Metal oxide includes titanium oxide ($TiO_2$), tantalum oxide ($Ta_2O_5$), tellurium dioxide ($TeO_2$), yttrium oxide ($Y_2O_3$), hafnium oxide ($HfO_2$), aluminum oxide ($Al_2O_3$), indium zinc oxide (IZO), or indium tin oxide (ITO).

In order to increase the light extraction efficiency of the semiconductor light-emitting device IV, the first surface S3 of the semiconductor stack 1 can be a rough surface and/or a second reflective layer 5 is formed on the first surface S3. The method for forming the rough surface includes etching, polishing, or printing. The etching method includes wet etch, such as soaking in acidic or alkaline etching solution, or dry etching, such as ICP. The structure of the second reflective layer 5 can be one or more layers. The material of the second reflective layer 5 includes metal material with high reflectivity, such as silver (Ag), gold (Au), aluminum (Al), titanium (Ti), chromium (Cr), copper (Cu), nickel (Ni), platinum (Pt), or an alloy thereof. The high reflectivity is 80% or above with respect to the dominant wavelength of the light emitted from the semiconductor light-emitting device III. The second reflective layer 5 is more away from the semiconductor stack 1 than the first reflective layer 331 so the light not reflected by the first reflective layer 331 can be further reflected by the second reflective layer 5. As shown in FIG. 11 and FIG. 12, the second reflective layer 5 contacts with the first reflective layer 331 and/or the plurality of contact structures 30 for forming electrical connection when electrical current is injected, A transparent conductive layer 19 is formed on the second surface S2 of the semiconductor stack 1. The transparent conductive layer 19 includes a first side e3 and a second side e4. In a variant of the embodiment, the first side e3 and the second side e4 are approximately planar; in another variant of the embodiment, the second side e4 protrudes the first side e3. The first side e3 of the transparent conductive layer 19 and the side e2 of the semiconductor stack 1 are approximately planar. The transparent conductive layer 19 is electrically connected to the semiconductor stack 1 when the electrical current is injected. The material of the transparent conductive layer 19 includes transparent material which is transparent to the light emitted from the active layer 10. In order to reduce the total internal reflection of a light emitted from the active layer 10 on the second surface S2, the transparent conductive layer 19 includes non-group III-V semiconductor material. The refractive index of the material of the transparent conductive layer 19 is lower than that of the semiconductor stack 1, and the structure of the transparent layer 19 can be one or more layers, for example, includes a first transparent conductive layer 191 and a second transparent conductive layer 192. Specifically, when the transparent conductive layer is a structure of multi layers, the first transparent conductive layer 191, which is more away from the semiconductor stack 1 than other transparent conductive layers, includes material for improving lateral current spreading, for example, indium zinc oxide (IZO). The second transparent conductive layer 192, which is closer to the semiconductor stack 1 than other transparent conductive layers, includes material for forming ohmically contact with the second semiconductor layer 12, for example, indium tin oxide (ITO).

In order to increase the light extraction efficiency of the semiconductor light-emitting device IV, the second surface S2 of the semiconductor stack 1 can be a rough surface to reduce total internal reflection. The method for forming the rough surface includes etching, polishing, or printing. The etching method includes wet etch, such as soaking acidic or alkaline etching solution, or dry etching, such as ICP.

In other embodiments of the present application, a substrate 8 can be optionally formed on the semiconductor stack 1. The substrate 8 can be bonded to the second surface S2 of the semiconductor stack 1 through the transparent conductive layer 19. The substrate 8 includes transparent material which is transparent to the light emitted from the active layer 10, such as gallium arsenide (GaAs), gallium phosphide (GaP), gallium nitride (GaN), sapphire, diamond, glass, quartz, acrylic, zinc oxide (ZnO), or aluminum nitride (AlN). In order to reduce the total internal reflection of the light emitted from the active layer 10 on the interface 51 between the substrate 8 and the transparent conductive layer 19, the refractive index of the material of the substrate 8 is smaller than that of the transparent conductive layer 19, and the refractive index of the transparent conductive layer 19 is between the refractive index of the substrate 8 and the refractive index of the semiconductor stack 1. Concerning the process yield, a side e1 of the substrate 8 and the second side e4 of the transparent conductive layer 19 are approximately planar, and the side e1 of the substrate 8 protrudes the side e2 of the semiconductor stack 1, as shown in FIG. 11.

In an embodiment of the present application, the conductive via 35 extends from the first surface S3 to the second surface S2. As shown in FIG. 10, the conductive vias 35 surrounds the periphery of the semiconductor stack 1 from the top view of the semiconductor light-emitting device IV. As shown in FIG. 11, the conductive via 35 is formed on the side e2 of the semiconductor stack 1 by removing a portion of the semiconductor stack 1 such that the conductive via 35 is formed along the side e2 of the semiconductor stack 1 by penetrating from the first surface S3 of the semiconductor stack 1, through the semiconductor stack 1 and exposing an end 351 of the conductive via 35 on a surface of the transparent conductive layer 19. In a variant of the embodiment, the end 351 of the conductive via 35 extends a depth into the transparent conductive layer 19 (not shown) by removing a portion of the semiconductor stack 1 and a portion of the transparent conductive layer 19. When the transparent conductive layer 19 includes a multi-layer structure, for example, includes a first transparent conductive layer 191 and a second transparent conductive layer 192, the end 351 of the conductive via 35 extends into the first transparent conductive layer 191 which is more away from the semiconductor stack 1 than other transparent conductive layers. The electrical current is uniformly distributed in the first transparent conductive layer 191 through the first transparent conductive layer 191 having better lateral current spreading ability than other transparent conductive layers. Then the electrical current is conducted to the second semiconductor layer 12 through the second transparent conductive layer 192. The forming positions of the conductive vias 35 and the contact structure 30 are staggered as shown in FIG. 10 and FIG. 11. A plurality of contact structures 30 is formed on the first surface S3 of the semiconductor stack 1, and the conductive via 35 is formed on the side e2 of the semiconductor stack 1 to surround the plurality of contact structures 30.

A first insulating layer 361 can be deposited on the semiconductor stack 1 and the conductive via 35 by evaporation. A portion of the first insulating layer 361 covering the end 351 of the conductive via 35 and a portion of the first insulating layer 361 covering the second reflective layer 5 can be removed through patterning to form a first opening W1 on the end 351 of the conductive via 35 and expose the transparent conductive layer 19, and to form a second opening W2 on the second reflective layer 5 and expose the second reflective layer 5. The material of the first insulating layer 361 includes non-conductive material including organic materials, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

As shown in FIG. 11, a conductive material, such as metal, is deposited in the conductive via 35 through evaporation or sputtering to cover the first opening W1 and a portion of the first insulating layer 361 to form a connecting layer 4. The connecting layer 4 includes a first connecting layer 41 formed in the conductive via 35 and a second connecting layer 42 formed on a side of the first insulating layer 361 opposite to the second reflective layer 5, wherein the first insulating layer 361 is formed between the semiconductor stack 1 and the first connecting layer 41 to electrically insulate the semiconductor stack 1 and the first connecting layer 41. From a top view of the semiconductor light-emitting device IV (not shown), the connecting layer 4 can be a patterned structure, for example, line or mesh, formed on the first surface S3 to electrically connect to the conductive via 35. As shown in FIG. 11, the connecting layer 4 can be connected to a side of the conductive via 35, or connected to a plurality of sides of the conductive via 35. As shown in FIG. 11 and FIG. 12, the connecting layer 4 surrounds the sidewall of the semiconductor stack 1 and connects the transparent conductive layer 192 through the first opening W 1.

A second insulating layer 362 can be deposited on the semiconductor stack 1 and the conductive via 35 by evaporation. A portion of the second insulating layer 362 covering the second connecting layer 42 and a portion of the second insulating layer 362 covering the second reflective layer 5 can be removed through patterning to form a third opening W3 on the second reflective layer 5 and expose the second reflective layer 5, and to form a fourth opening W4 on the second connecting layer 42 and expose the second connecting layer 42. From the top view of the semiconductor light-emitting device IV, the third opening W3 is larger than the second opening W2, the position of the third opening W3 and the position of the second opening W2 are overlapped, and the position of the fourth opening W4 and the position of the first opening W1 can be overlapped or staggered, as shown in FIG. 8. The material of the second insulating layer 362 includes non-conductive material including organic materials, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, glass; dielectric materials, such as aluminum oxide ($Al_2O_3$), silicon nitride ($SiN_x$), silicon oxide ($SiO_2$), titanium oxide ($TiO_2$), or magnesium fluoride ($MgF_2$).

A first pad portion 43 and a second pad portion 53 are formed on the same side of the semiconductor stack 1. The first pad portion 43 forms on a part surface of the second insulating layer 362 and covers the fourth opening W4 to electrically connect the connecting layer 4. In an embodiment of the present application, a metal material is deposited on the fourth opening W4 and continuously deposited to cover a part surface of the second insulating layer 362 to form the first pad portion 43. As shown in the cross-sectional view of the semiconductor light-emitting device IV, the first pad portion 43 includes a first face 431 and a second face 432 protruding the first face 431, wherein the first face 431 and the second face 432 are approximately parallel with the first surface S3 of the semiconductor stack 1, a height is formed between the first face 431 and the second face 432, and the height is larger than or equal to a thickness of the second insulating layer 362.

As shown in FIG. 11, a part of the surface of the second reflective layer 5 is not covered by the first insulating layer 361 and/or the second insulating layer 362, a metal material can be evaporated in the second opening W2 and/or the third opening W3, and continuously deposited along the sidewall of the first insulating layer 361 and/or the sidewall of the second insulating layer 362 to extend onto a part of the second insulating layer 362 to form the second pad portion 53. As shown in the cross-sectional view of the semiconductor light-emitting device IV of FIG. 11, the second pad portion 53 includes a first face 531 and a second face 532 protruding the first face 531, wherein the first face 531 and the second face 532 are approximately parallel with the first surface S3 of the semiconductor stack 1. From a top view of the semiconductor light-emitting device IV, the connecting layer 4 is formed beyond the region of the second opening W2 and/or the third opening W3. The conductive via 35 surrounds the first pad portion 43 and/or the second pad portion 53, and the connecting layer 4 is formed in the region of the first pad portion 43 and/or the second pad portion 53.

An electrical current from external power source can be injected from the first pad portion 43, and the electrical current is conducted to the second semiconductor layer 12 through the connecting layer 4 and the transparent conductive layer 19. The material of the first pad portion 43 includes titanium (Ti), platinum (Pt), nickel (Ni), tin (Sn), gold (Au), or an alloy thereof.

The second pad portion 53 is formed on a part of the contact structure 30. When an electrical current from external power source is injected into the second pad portion 53, the second pad portion 53 is electrically connected with the first semiconductor layer 11 through the contact structure 30. The material of the second pad portion 53 includes titanium (Ti), platinum (Pt), nickel (Ni), tin (Sn), gold (Au), or an alloy thereof. An area of the first pad portion 43 can be the same as or different from that of the second pad portion 53.

FIGS. 13-20 illustrate a method of manufacturing a semiconductor light-emitting device V in accordance with an embodiment of the present application, in which FIGS. 13A, 14A, 15A, 16A, 17A, 18A, 19A, and 20A are plan views, and FIGS. 13B, 14B, 15B, 16B, 17B, 18B, 19B, 20B are sectional views respectively taken along line X-X' in FIGS. 13A, 14A, 15A, 16A, 17A, 18A, 19A, and 20A.

Figure 13A:
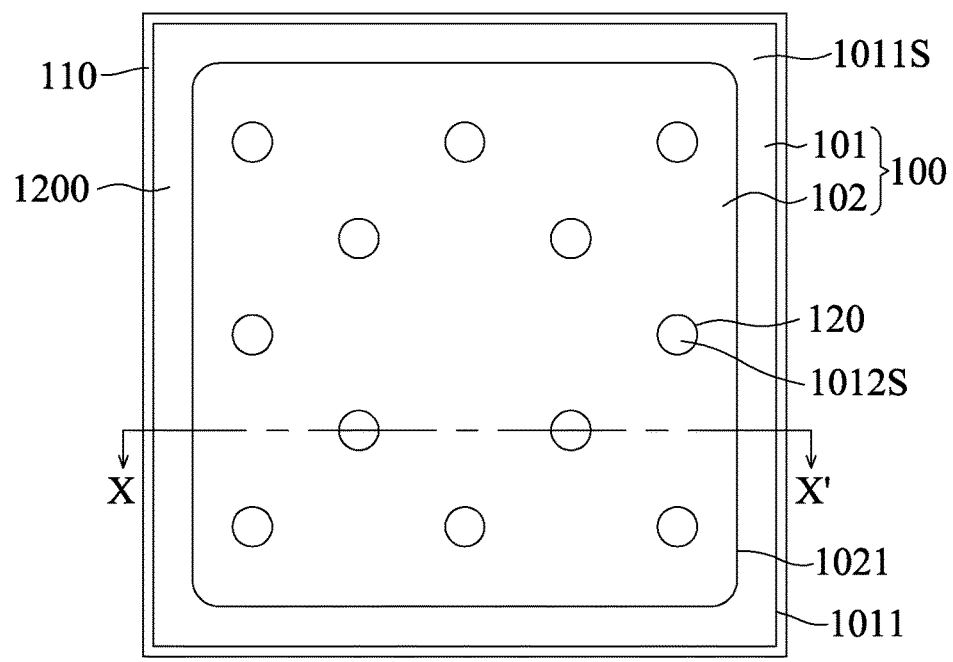
FIGS. 13A, 13B, 14A, 14B, 15A, 15B, 16A, 16B, 17A, 17B, 18A, 18B, 19A, 19B, 20A, and 20B illustrate a method of manufacturing a semiconductor light-emitting device V.
Figure 13B:
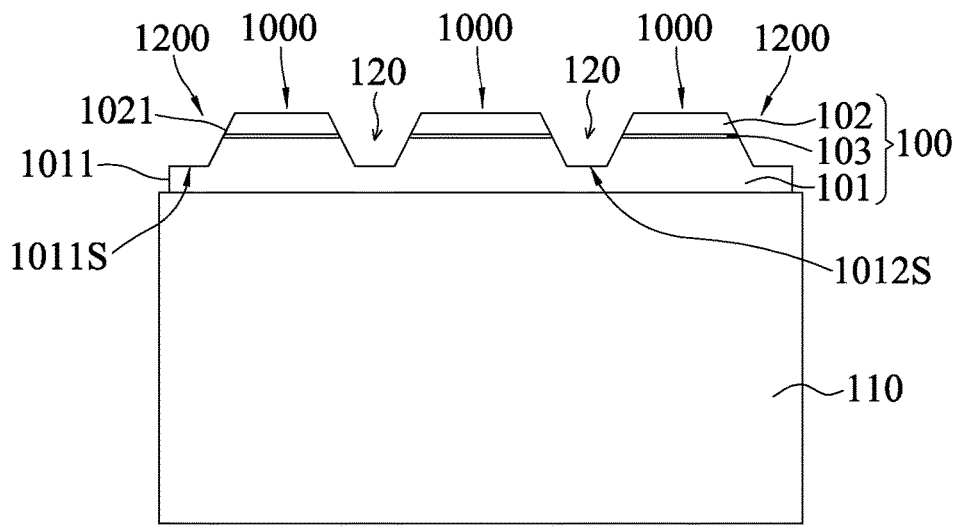

Referring to FIG. 13A and FIG. 13B, a semiconductor stack 100 is formed on a growth substrate 110. The growth substrate 110 can be a sapphire substrate, but is not limited thereto. The semiconductor stack 100 includes a first semiconductor layer 101, a second semiconductor layer 102, and an active layer 103 formed between the first semiconductor layer 101 and the second semiconductor layer 102. Each of the first semiconductor layer 101 and the second semiconductor layer 102 can be composed of a single layer or multiple layers. Further, the active layer 103 can have a single-quantum well structure or multi-quantum well structure. The semiconductor stack 100 can be formed of group III nitride based compound semiconductor on the growth substrate 110 by metal organic chemical vapor deposition (MOCVD) or molecular beam epitaxy (MBE). A buffer layer (not shown) can be formed before forming the compound semiconductor layers. The buffer layer is formed to relieve lattice mismatch between the growth substrate 110 and the semiconductor stack 100 and can be formed of a GaN-based material layer, such as gallium nitride, aluminum gallium nitride or aluminum nitride. The semiconductor stack 100, including an outer periphery 1011, is patterned by removing portions of the first semiconductor layer 101, the second semiconductor layer 102, and the active layer 103 to form a plurality of vias 120 exposing a surface 1012S of the first semiconductor layer 101, a surrounding region 1200 exposing a periphery surface 1011S of the first semiconductor layer 101, and one or a plurality of semiconductor constructions 1000 surrounded by the surrounding region 1200. The semiconductor stack 100 can be patterned by photolithography and etching process. The plurality of semiconductor constructions 1000 is connected to each other through the first semiconductor layer 101. The semiconductor construction 1000 includes an upper part and a lower part, wherein the lower part includes a width larger than a width of the upper part in a sectional view. The plurality of vias 120 includes a circular shape in a plan view, and/or the surrounding region 1200 includes a rectangular shape in a plan view, but is not limited thereto. The one or the plurality of semiconductor constructions 1000 includes an inclined sidewall 1021. The second semiconductor layer 102 and the active layer 103 are exposed to the surrounding region 1200 and the plurality of vias 120. The upper part of the semiconductor construction 1000 and the periphery surface 1011S of the first semiconductor layer 101 is connected by the inclined sidewall 1021.

Figure 14A:
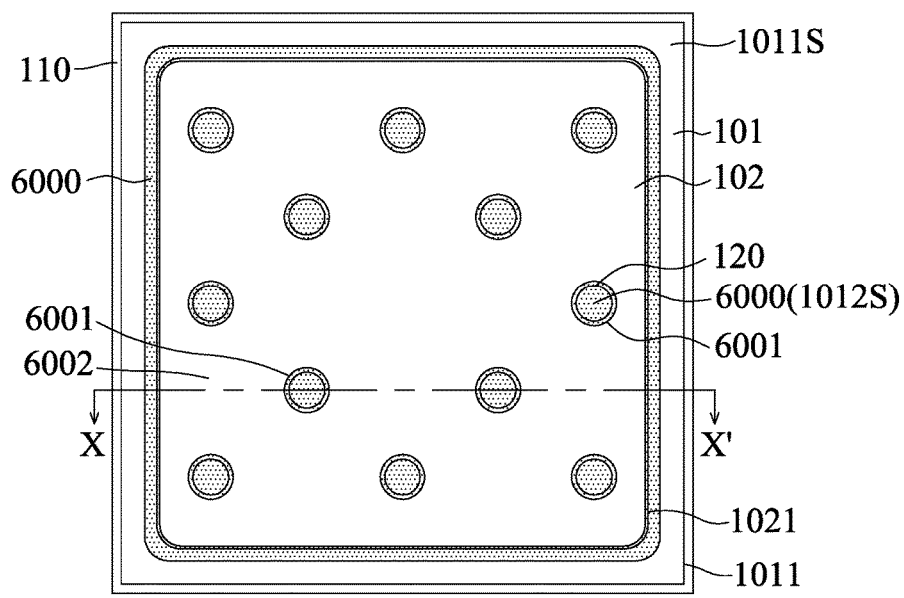
Figure 14B:
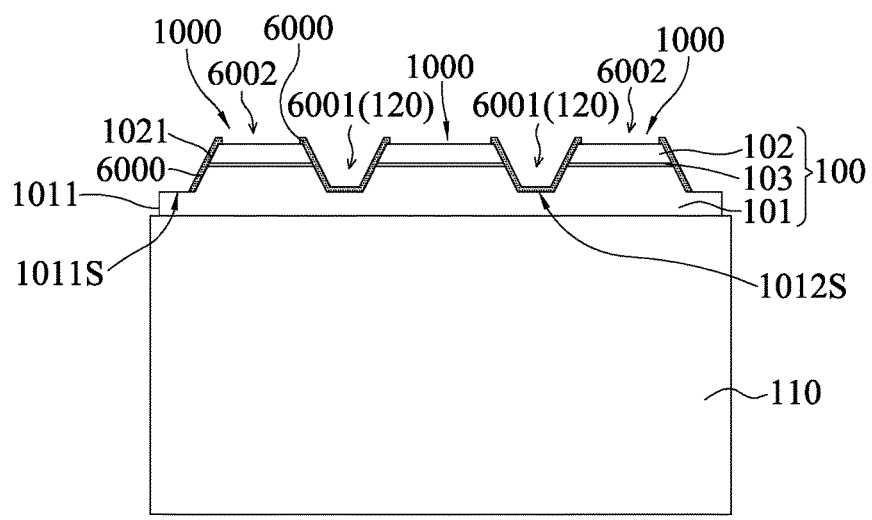

Referring to FIG. 14A and FIG. 14B, a first insulating layer 6000 is formed to cover the surface 1012S of the first semiconductor layer 101 in the plurality of vias 120, and the inclined sidewall 1021 of the semiconductor construction 1000. In other words, the first insulating layer 6000 includes a first group of first insulating regions 6001 corresponding to the plurality of vias 120, and a second group of first insulating openings 6002 respectively formed on the upper part of the one or the plurality of semiconductor constructions 1000 to expose the second semiconductor layer 102. The first insulating layer 6000 includes a single layer or multiple layers, such as a silicon oxide or silicon nitride film. Alternatively, the first insulating layer 6000 includes a distributed Bragg reflector, which is formed by alternately stacking insulation layers having different refraction indices. For example, the first insulating layer 6000 can be formed by alternately stacking $SiO_x/TiO_x$.

Figure 15A:
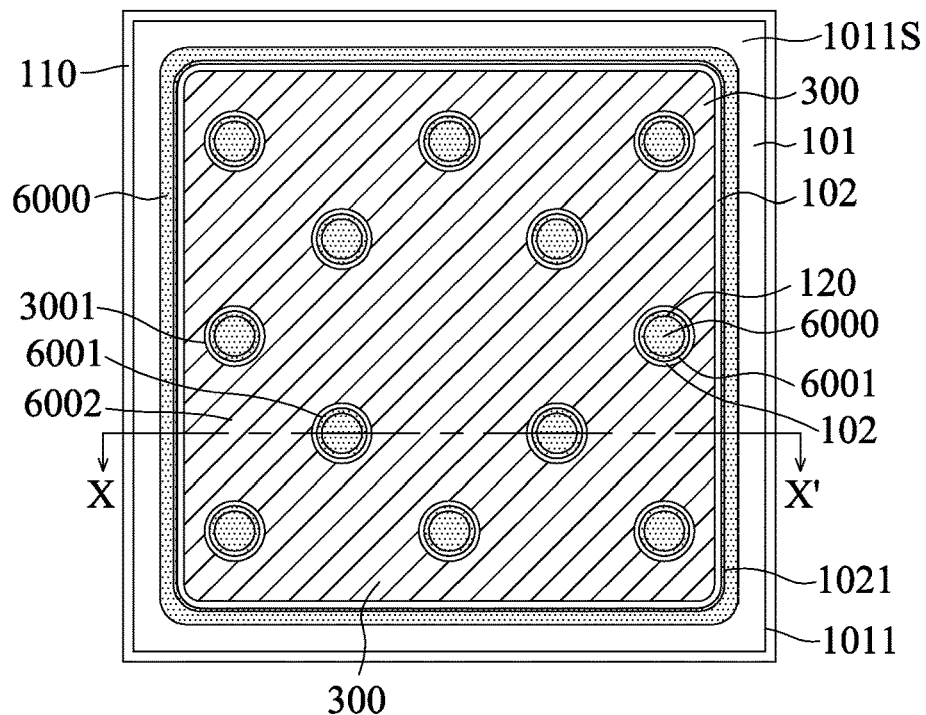
Figure 15B:
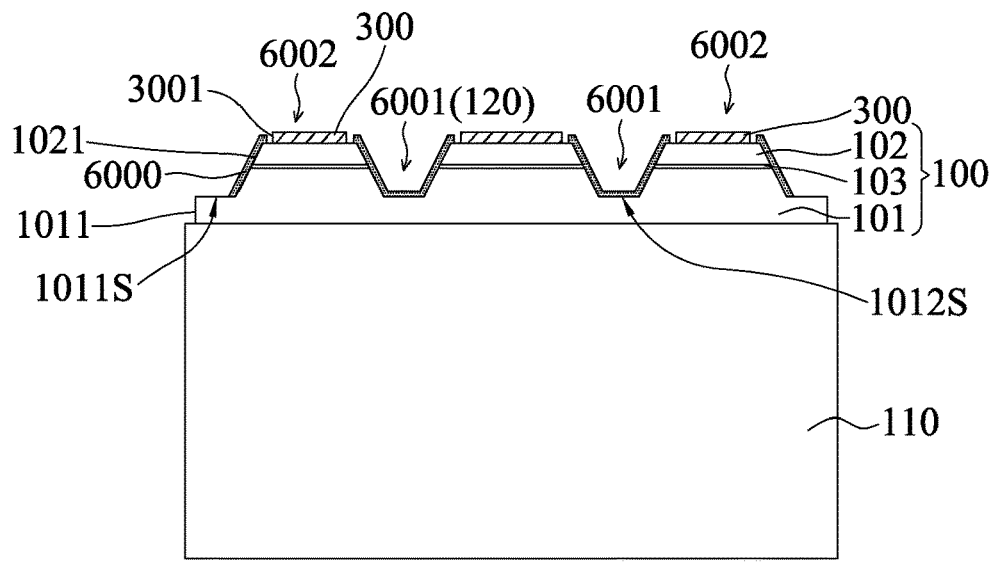

Referring to FIG. 15A and FIG. 15B, a transparent conductive layer 300 is formed on the second semiconductor layer 102 except for the first group of first insulating regions 6001. In other words, the transparent conductive layer 300 is only formed in the second group of first insulating openings 6002 and directly contacts the second semiconductor layer 102. A periphery 3001 of the transparent conductive layer 300 does not contact the first insulating layer 6000. The transparent conductive layer 300 includes a transparent conductive oxide film, such as indium tin oxide (ITO), or a thin metal film, such as silver (Ag) or aluminum (Al). The transparent conductive layer 300 can be configured to form an ohmic contact with the second semiconductor layer 102. The transparent conductive layer 300 includes a single layer or multiple layers.

Figure 16A:
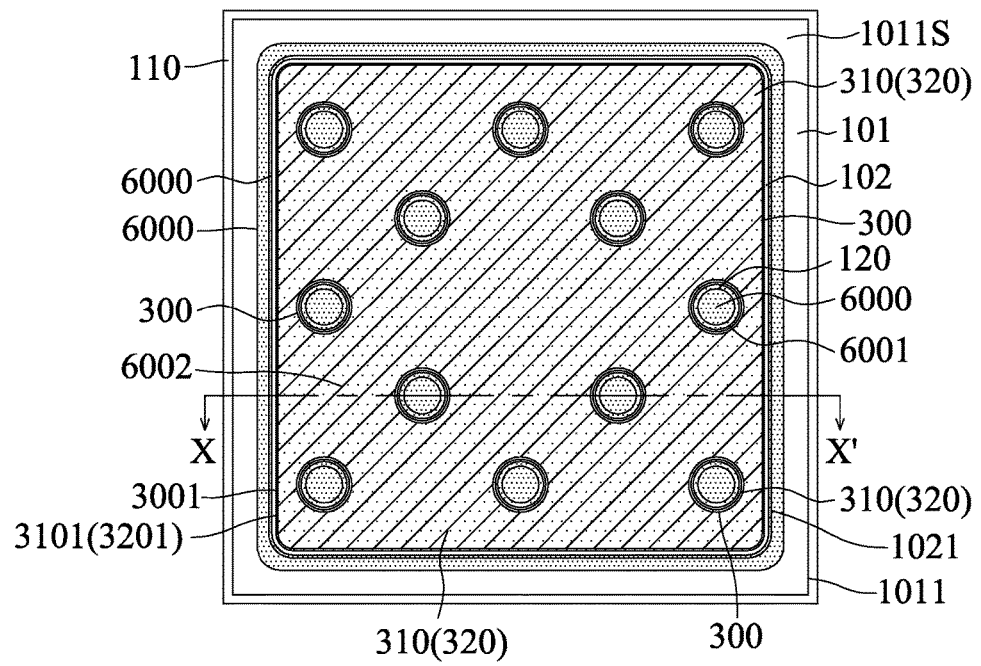
Figure 16B:
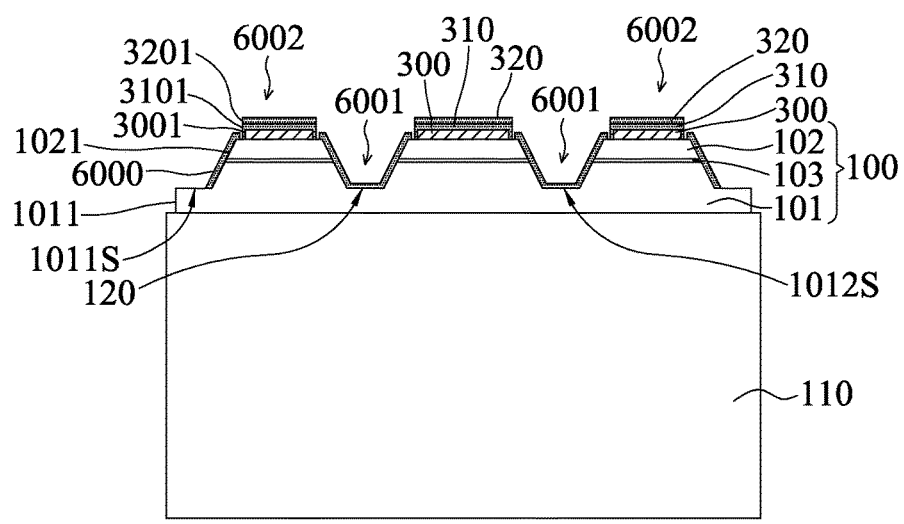

Referring to FIG. 16A and FIG. 16B, a reflective layer 310 is formed on the second semiconductor layer 102 except for the first group of first insulating regions 6001, and a barrier layer 320 is formed on the reflective layer 310 except for the first group of first insulating regions 6001. In other words, the reflective layer 310 and the barrier layer 320 are only formed in the second group of first insulating openings 6002. A periphery 3101 of the reflective layer 310 can be aligned with the periphery 3001 of the transparent conductive layer 300 or be formed outside of the periphery 3001 of the transparent conductive layer 300. A periphery 3201 of the barrier layer 320 can be aligned with the periphery 3101 of the reflective layer 310 or be formed outside of the periphery 3101 of the reflective layer 310. When the periphery 3201 of the barrier layer 320 is formed outside the periphery 3101 of the reflective layer 310, the reflective layer 310 is covered by the barrier layer 320, and the barrier layer 320 contacts the second semiconductor layer 102. Both the periphery 3201 of the barrier layer 320 and the periphery 3101 of the reflective layer 310 are separated from the first insulating layer 6000. The reflective layer 310 can comprise a single layer structure or a multi-layer structure, and the material of the reflective layer 310 includes metal material with high reflectivity, such as silver (Ag), gold (Au), aluminum (Al), titanium (Ti), chromium (Cr), copper (Cu), nickel (Ni), platinum (Pt), or an alloy thereof. The barrier layer 320 can comprise a single layer structure or a multi-layer structure, and the material of the barrier layer 320 includes Cr, Pt, Ti, TiW, W, or Zn. When the barrier layer 320 is a multi-layer structure, the barrier layer 320 is alternately stacked by a first barrier layer (not shown) and a second barrier layer (not shown), for example, Cr/Pt, Cr/Ti, Cr/TW, Cr/W, Cr/Zn, Ti/Pt, Ti/W, Ti/TiW, Ti/ W, Ti/Zn, Pt/TiW, Pt/W, Pt/Zn, TiW/W, TiW/Zn, or W/Zn.

Figure 17A:
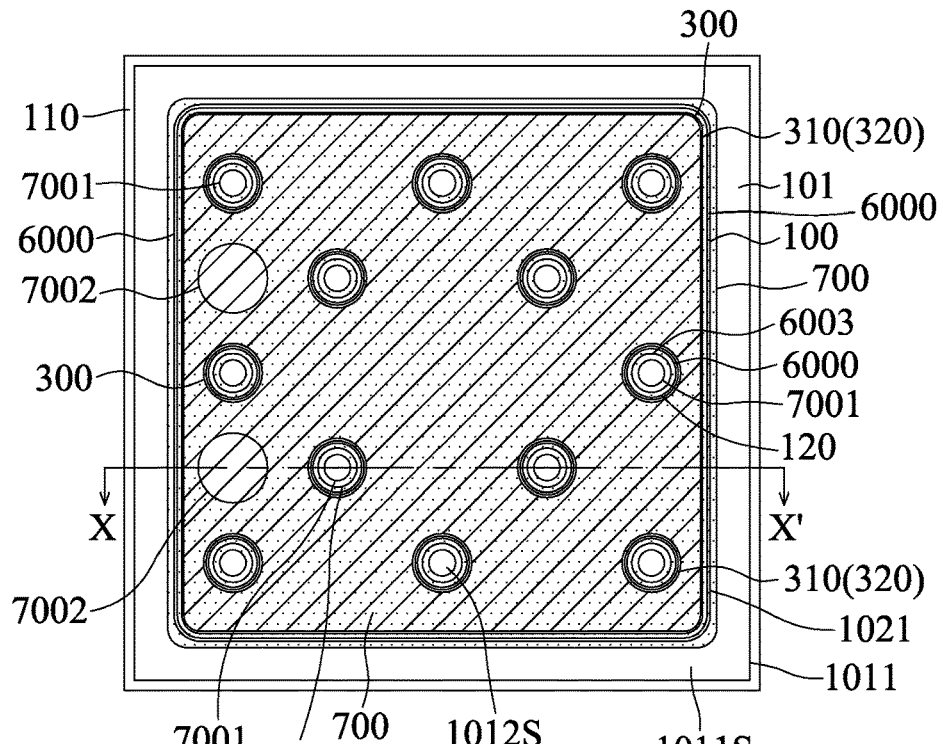
Figure 17B:
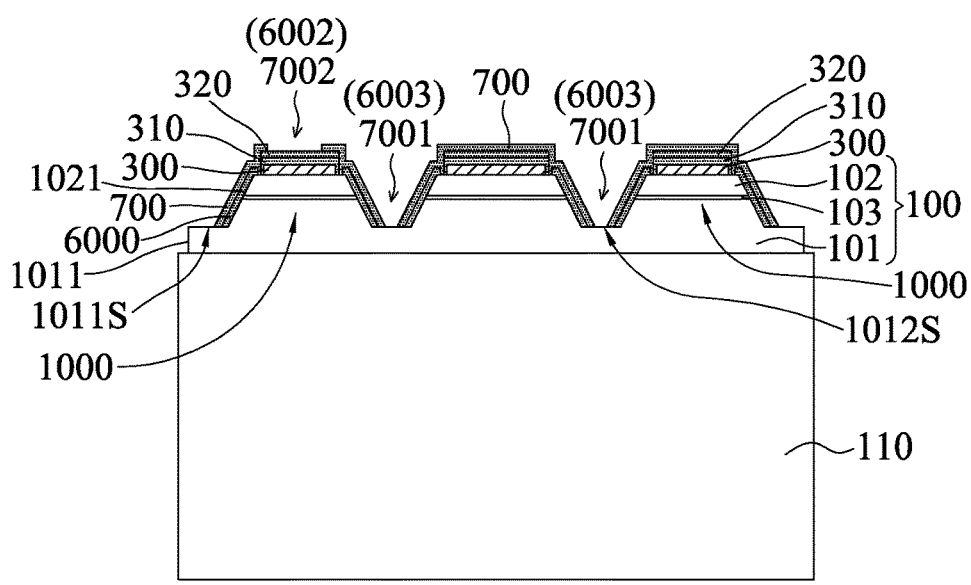

Referring to FIG. 17A and FIG. 17B, a second insulating layer 700 is formed to continuously cover the upper part and the inclined sidewalls 1021 of the one or the plurality of semiconductor constructions 1000. The second insulating layer 700 includes a first group of second insulating openings 7001 respectively corresponding to the plurality of vias 120, wherein the first group of first insulating regions 6001 of the first insulating layer 6000 formed in the plurality of vias 120 is partially removed to form a plurality of first insulating openings 6003 by etching at the step of forming the first group of second insulating openings 7001, and the first group of second insulating openings 7001 and the plurality of first insulating openings 6003 expose the surface 1012S of the first semiconductor layer 101. The second insulating layer 700 further includes a second group of second insulating openings 7002 formed on the upper part of part of the plurality of semiconductor constructions 1000 to expose the barrier layer 320 and/or the reflective layer 310. The second insulating layer 700 includes a single layer or multiple layers, such as a silicon oxide or silicon nitride film. Alternatively, the second insulating layer 700 includes a distributed Bragg reflector, which is formed by alternately stacking insulation layers having different refraction indices. For example, the second insulating layer 700 can be formed by alternately stacking $SiO_x/TiO_x$.

Figure 18A:
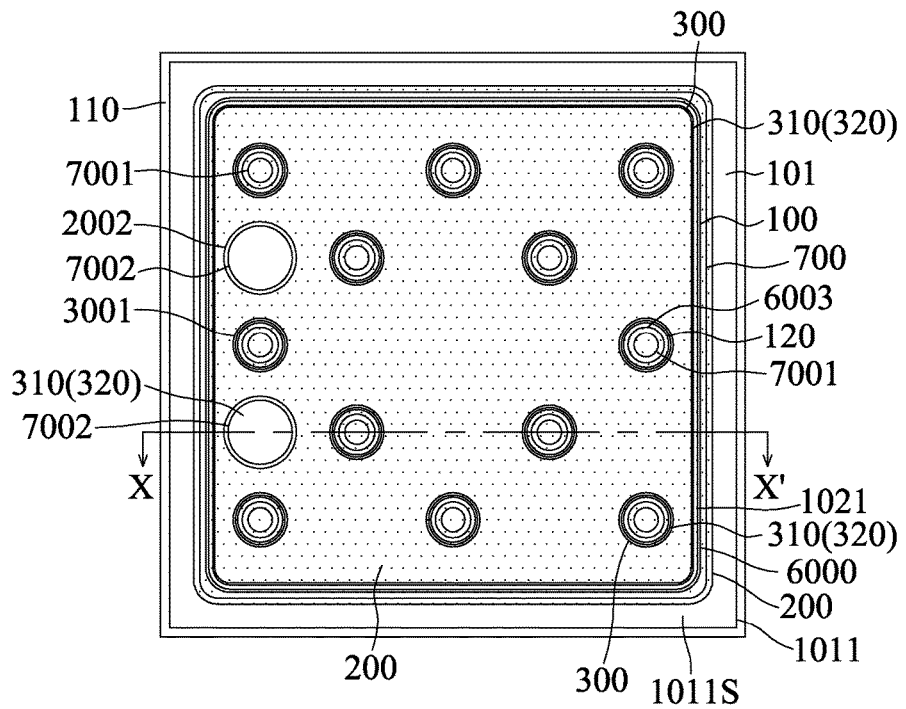
Figure 18B:
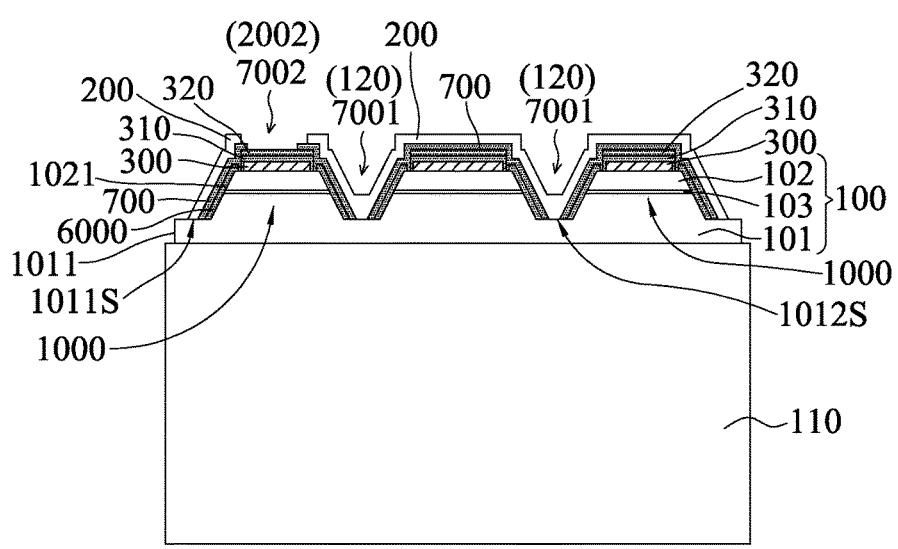

Referring to FIG. 18A and FIG. 18B, a metal layer 200 is formed to cover the one or the plurality of semiconductor constructions 1000 and the plurality of vias 120, except for regions corresponding to the second group of second insulating openings 7002. Specifically, the metal layer 200 is formed to continuously cover the upper part and the inclined sidewalls 1021 of the one or the plurality of semiconductor constructions 1000, the plurality of vias 120, and the periphery surface 1011S of the first semiconductor layer 101. The patterned metal layer 200 is as the contact structure of prior embodiments and includes one or more opening 2002 to expose the reflective layer 310 and/or the barrier layer 320, wherein a position of the one or more opening 2002 is corresponding to that of the second group of second insulating openings 7002.

Figure 19A:
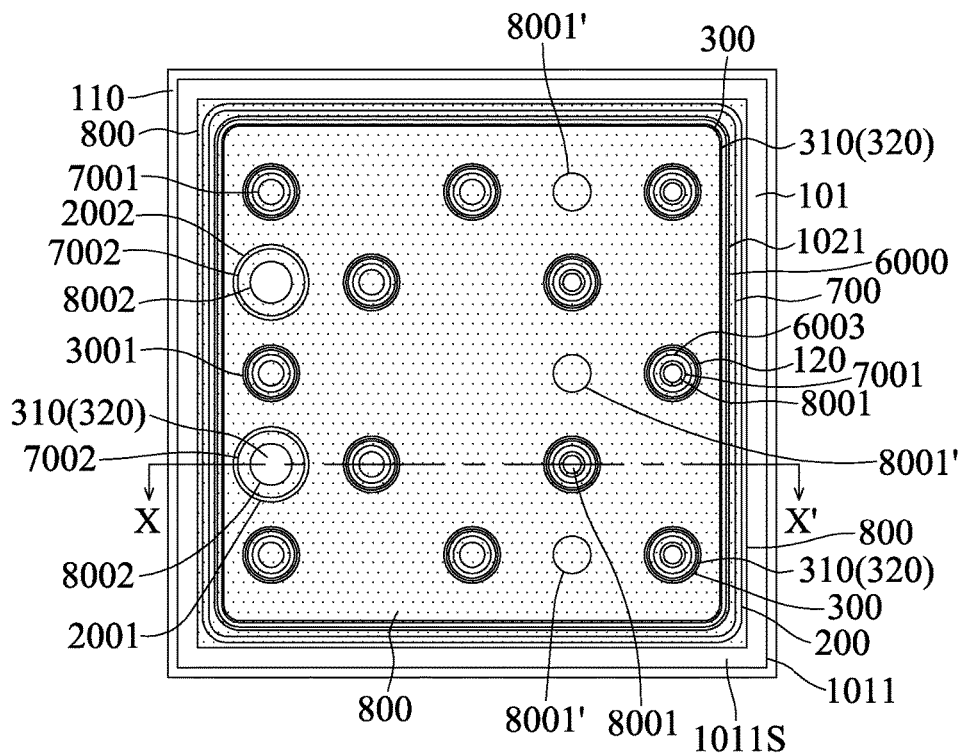
Figure 19B:
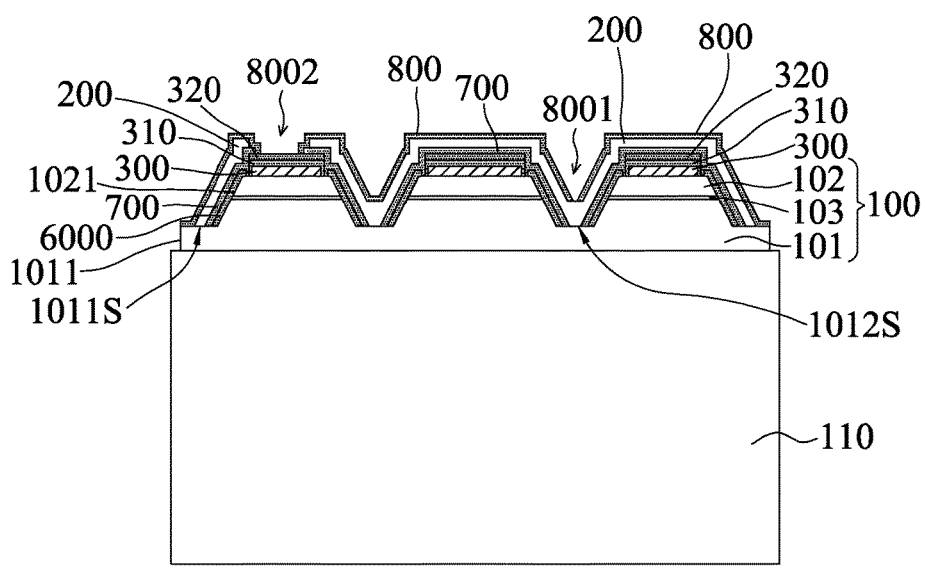

Referring to FIG. 19A and FIG. 19B, a third insulating layer 800 is formed to continuously cover the upper part and the inclined sidewalls 1021 of the one or the plurality of semiconductor constructions 1000, and the plurality of vias 120. The third insulating layer 800 includes one or a first group of third insulating openings 8001 formed on the first metal layer 200 at regions corresponding to part of the plurality of vias 120, wherein the one or the first group of third insulating openings 8001 exposes the first metal layer 200. In other words, the one or the first group of third insulating openings 8001 and part of the plurality of vias 120 are overlapped. In another example of the embodiment, the one or the first group of third insulating openings 8001 is formed on the first metal layer 200 except for regions corresponding to the plurality of vias 120. In other words, the one or the first group of third insulating openings 8001' and the plurality of vias 120 are not overlapped as shown in FIG. 19A. The third insulating layer 800 further includes one or a second group of third insulating openings 8002 respectively corresponding to the one or the second group of second insulating openings 7002, wherein the one or the second group of third insulating openings 8002 expose the barrier layer 320 and/or the reflective layer 310. The third insulating layer 800 includes a single layer or multiple layers, such as a silicon oxide or silicon nitride film. Alternatively, the third insulating layer 800 includes a distributed Bragg reflector, which is formed by alternately stacking insulation layers having different refraction indices. For example, the third insulating layer 800 can be formed by alternately stacking $SiO_x/TiO_x$.

Figure 20A:
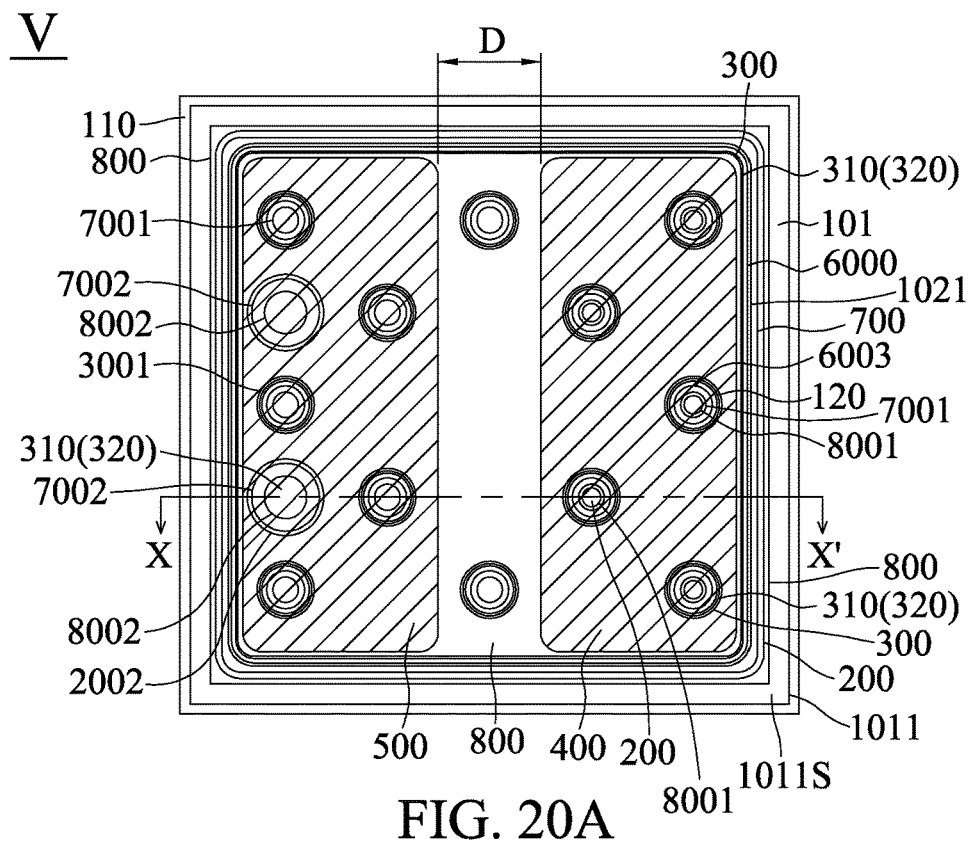
Figure 20B:
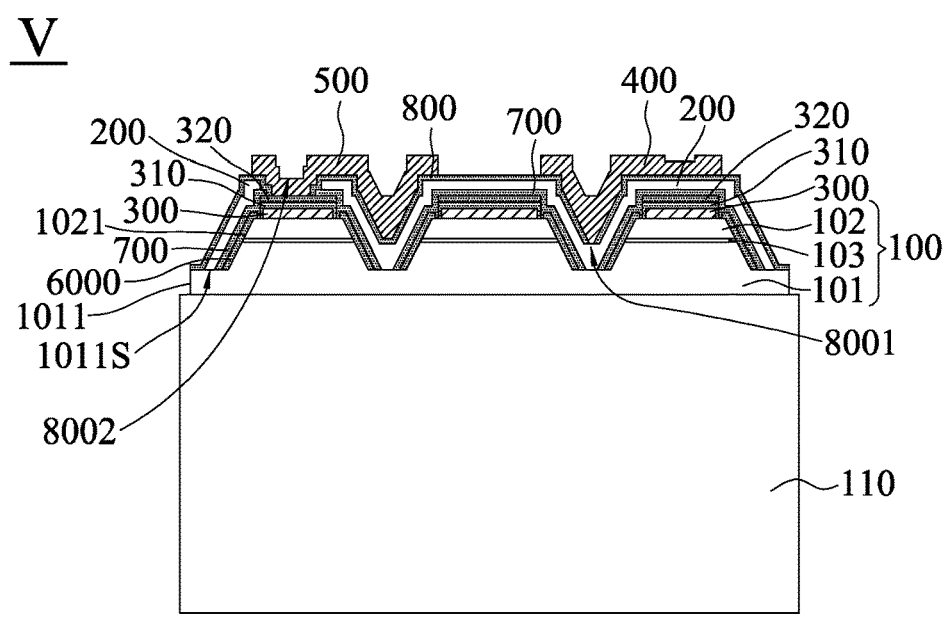

Referring to FIG. 20A and FIG. 20B, a first pad portion 400 and a second pad portion 500 are formed on the third insulating layer 800. The first pad portion 400 is separated from the second pad portion 500 with a shortest distance D larger than 30 µm, preferable a space between the first pad portion 400 and the second pad portion 500 is between 50 µm and 250 µm. The first pad portion 400 is connected to the first metal layer 200 through the one or the first group of third insulating openings 8001, and the second pad portion 500 is connected to the reflective layer 310 and/or the barrier layer 320 through the one or the second group of third insulating openings 8002.

Figure 21:
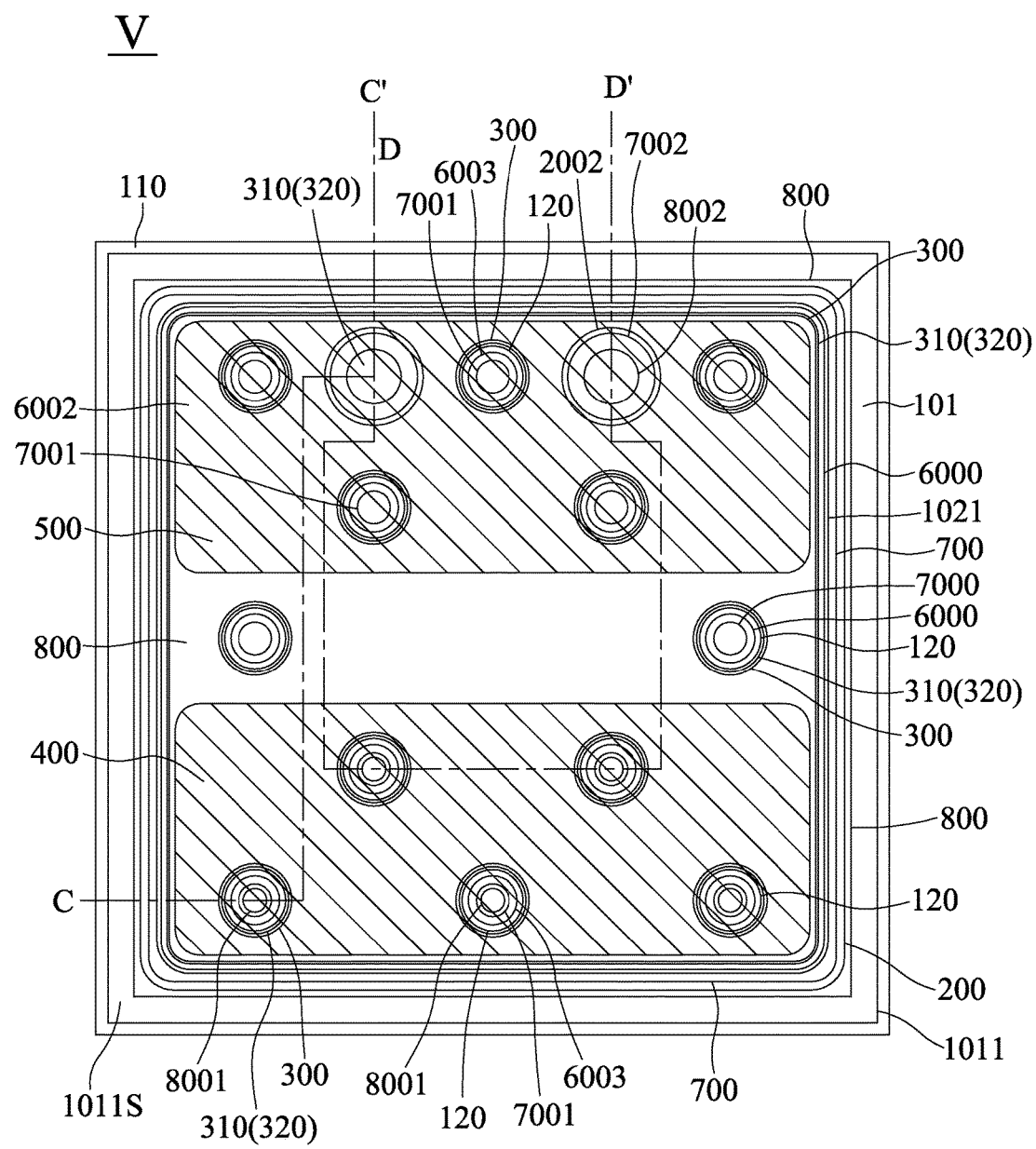
FIG. 21 illustrates a top view of the semiconductor light-emitting device V in accordance with an embodiment of the present application.
Figure 22:
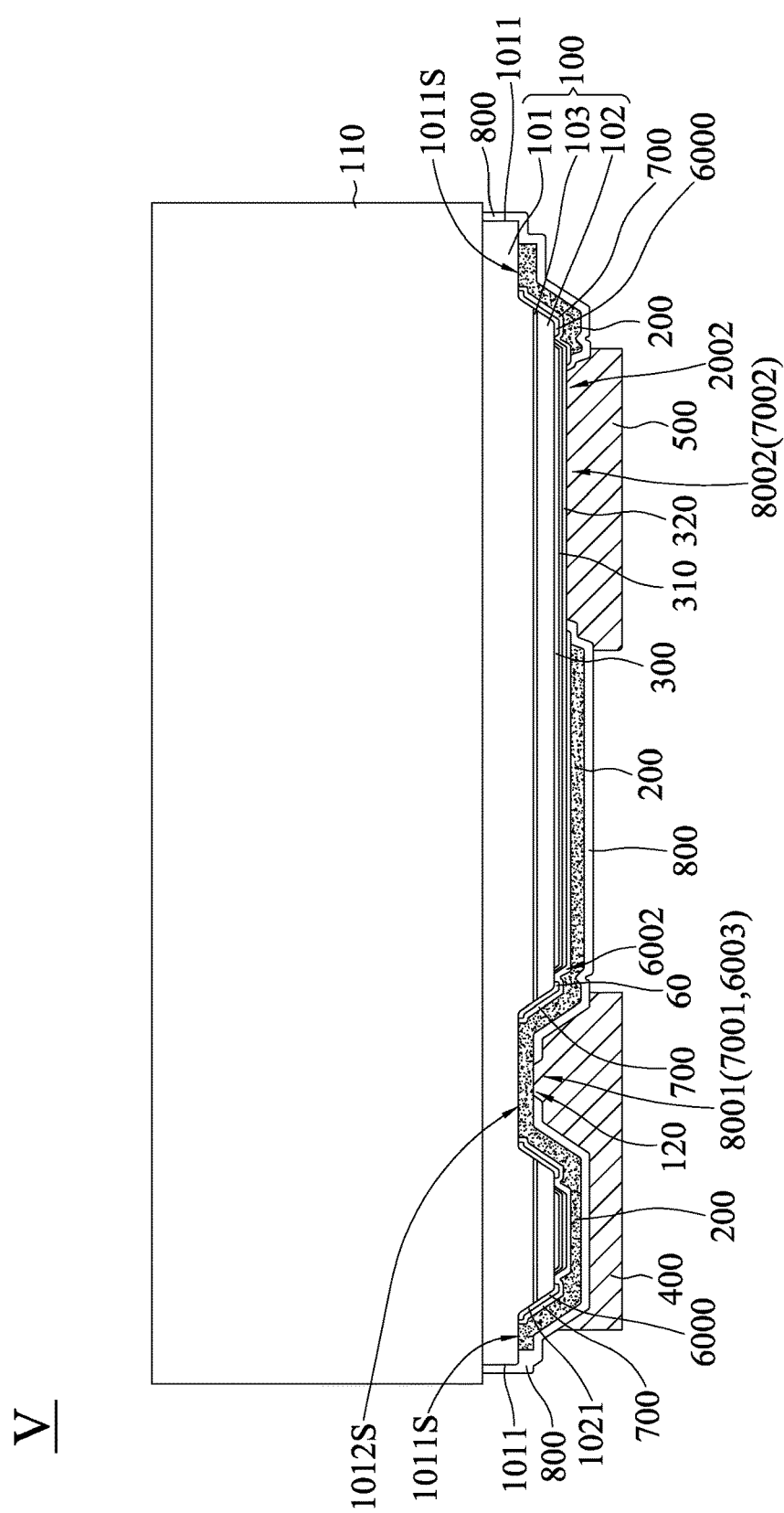
FIG. 22 illustrates a cross-sectional view of the semiconductor light-emitting device V along line C-C' of FIG. 21.
Figure 23:
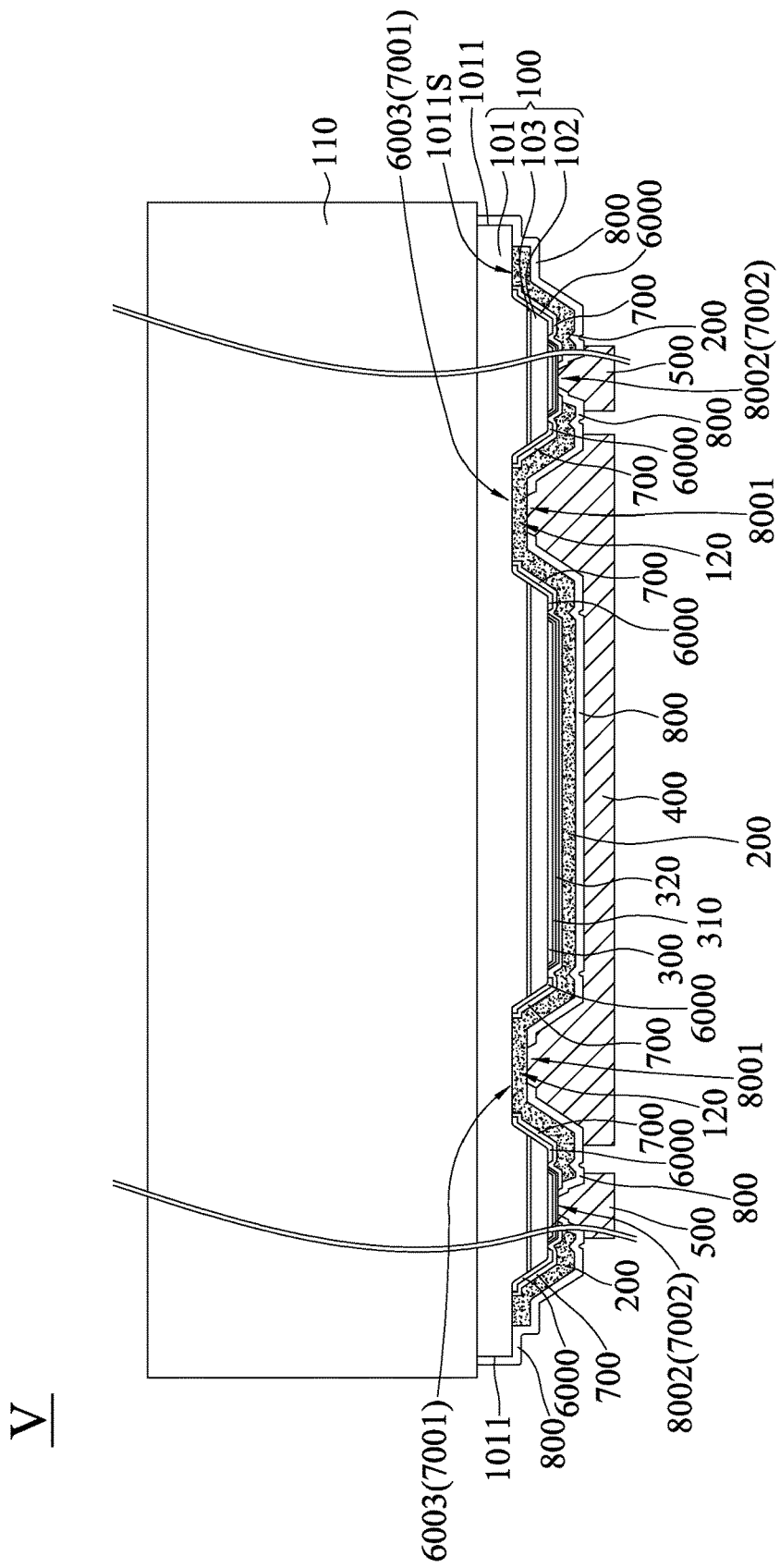
FIG. 23 illustrates a cross-sectional view of the semiconductor light-emitting device V along line D-D' of FIG. 21.

FIG. 21 illustrates a top view of the semiconductor light-emitting device V in accordance with an embodiment of the present application; FIG. 22 illustrates a cross-sectional view along line C-C' of FIG. 21; and FIG. 23 illustrates a cross-sectional view along line D-D' of FIG. 21.

The semiconductor light-emitting device V is a flip chip type light-emitting diode device. As shown in FIG. 22 and FIG. 23, the semiconductor light-emitting device V includes a substrate 110, a semiconductor stack 100 formed on the substrate 110. the semiconductor stack 100 includes a first semiconductor layer 101, a second semiconductor layer 102, and an active layer 103 formed between the first semiconductor layer 101 and the second semiconductor layer 102. In an example of the embodiment, the substrate 110 can be a growth substrate of the semiconductor stack 100, and the material of the substrate 110 includes gallium arsenide (GaAs), gallium phosphide (GaP), gallium nitride (GaN), sapphire, silicon carbide (SiC), diamond, glass, quartz, acrylic, zinc oxide (ZnO), or aluminum nitride (AlN). In another example of the embodiment, the substrate 110 can be a support substrate, which is bonded to the semiconductor stack 100 through adhesive materials including organic material, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, or glass; or dielectric materials, such as aluminum oxide ($Al_2O_3$), silicon nitride ($SiN_x$), silicon oxide ($SiO_2$), titanium oxide ($TiO_2$), or magnesium fluoride ($MgF_2$). The first semiconductor layer 101 and the second semiconductor layer 102, such as cladding layers, or confinement layers, comprise different conductivity types, electricity, polarity, or dopant elements to provide electrons and holes. The active layer 103 is formed between the first semiconductor layer 101 and the second semiconductor layer 102, so the electrons and the holes combine in the active layer 103 under an electrical current to convert electrical energy to optical energy for emitting a light. The dominant wavelength of the light is adjusted by changing physical and chemical compositions of one or more layers in the semiconductor stack 100. The material of the semiconductor stack 100 includes group III-V semiconductor materials, such as $Al_xIn_yGa_{(1-x-y)}N$ or $Al_xIn_yGa_{(1-x-y)}P$, wherein $0 \leq x, y \leq 1$; $(x+y) \leq 1$. In accordance with the material of the active layer 103, the semiconductor stack 100 can emit a red light with a dominant wavelength between such as 610 nm and 650 nm, a green light with a dominant wavelength between such as 530 nm and 570 nm, a blue light with a dominant wavelength between such as 450 nm and 490 nm, or an ultraviolet (UV) light with a dominant wavelength between such as 230 nm and 400 nm. The active layer 103 includes single heterostructure (SH), double heterostructure (DH), double-side double heterostructure (DDH), or multi-quantum well (MQW) structure. The material of the active layer 103 includes i-type, p-type, or n-type semiconductor.

Parts of the active layer 103 and the second semiconductor layer 102 away from an outer periphery 1011 of the semiconductor stack 100 are removed to form a plurality of vias 120. The plurality of vias 120 penetrates the semiconductor stack 100 to expose the surface 1012S of the first semiconductor layer 101. Another part of the active layer 103 and the second semiconductor layer 102 near the outer periphery 1011 of the semiconductor stack 100 are removed to form a ring-like exposing periphery surface 1011S of the first semiconductor layer 101, wherein the ring-like exposing periphery surface 1011S is along an outer periphery of the semiconductor light-emitting device V. In other words, the ring-like exposing periphery surface 1011S surrounds the active layer 103 and the second semiconductor layer 102. In an example of the embodiment, the plurality of vias 120 is arranged into a plurality of rows. The plurality of vias 120 disposed on adjacent two rows can be aligned or staggered. Each of the plurality of vias 120 includes a shape, such as circle, ellipse, or finger in top view of the semiconductor light-emitting device V. The method for forming the plurality of vias 120 includes wet etching or dry etching.

A first insulating layer 6000 is deposited on the semiconductor stack 100 to surround the active layer 103 to protect the epitaxial quality of the active layer 103 from being damaged by the following process. The first insulating layer 6000 is patterned by lithography technique to provide a plurality of first insulating openings 6002, 6003 on the semiconductor stack 100. As shown in FIG. 22, the plurality of first insulating openings 6002, 6003 of the first insulating layer 6000 respectively exposes the second semiconductor layer 102 and the first semiconductor layer 101.

A transparent conductive layer 300 is formed on the first insulating opening 6002 provided on the second semiconductor layer 102. The transparent conductive layer 300 is electrically connected to the semiconductor stack 100 when the electrical current is injected. The material of the transparent conductive layer 300 includes transparent material which is transparent to the light emitted from the active layer 103. The structure of the transparent conductive layer 300 can be one or more layers.

A reflective layer 310 is formed on the second semiconductor layer 102 for increasing the light extraction efficiency of the semiconductor light-emitting device V, and a barrier layer 320 is formed on the reflective layer 310 for protecting the reflective layer 310 and preventing the metal element of the reflective layer 310 diffusing out. In an example of the embodiment, the reflective layer 310 directly contacts the second semiconductor layer 102. In an example of the embodiment, the reflective layer 310 directly contacts the transparent conductive layer 300. A sidewall of the barrier layer 320 can be aligned with a sidewall of the reflective layer 310 or extend to outside of a sidewall of the reflective layer 310. When the sidewall of the barrier layer 320 is formed beyond the sidewall of the reflective layer 310, the reflective layer 310 is covered by the barrier layer 320, and a portion of the barrier layer 320 directly contacts the second semiconductor layer 102 or the transparent conductive layer 300. The reflective layer 310 can include a single layer structure or a multi-layer structure, and the material of the reflective layer 310 includes metal material with high reflectivity, such as silver (Ag), gold (Au), aluminum (Al), titanium (Ti), chromium (Cr), copper (Cu), nickel (Ni), platinum (Pt), or an alloy thereof. The barrier layer 320 can include a single layer structure or a multi-layer structure, and the material of the barrier layer 320 includes Cr, Pt, Ti, TiW, W, or Zn. When the barrier layer 320 is a multi-layer structure, the barrier layer 320 is alternately stacked by a first barrier layer (not shown) and a second barrier layer (not shown), for example, Cr/Pt, Cr/Ti, Cr/TW, Cr/W, Cr/Zn, Ti/Pt, Ti/W, Ti/TiW, Ti/ W, Ti/Zn, Pt/TiW, Pt/W, Pt/Zn, TiW/W, TiW/Zn, or W/Zn.

A second insulating layer 700 is deposited on the semiconductor stack 100 to surround the active layer 103. The second insulating layer 700 is patterned by lithography technique to provide a first group of second insulating openings 7001 and a second group of second insulating openings 7002 on the semiconductor stack 100. As shown in FIG. 22 and FIG. 23, the first group of second insulating openings 7001 of the second insulating layer 700 exposes the first semiconductor layer 101, and the second group of second insulating openings 7002 of the second insulating layer 700 exposes the barrier layer 320. In an example of the embodiment, the first group of second insulating openings 7001 includes a width different from that of the second group of second insulating openings 7002. In another example of the embodiment, a number of the first group of second insulating openings 7001 is different from that of the second group of second insulating openings 7002. In another example of the embodiment, the second group of second insulating openings 7002 is only formed on one side of the semiconductor stack 100 from a top view of the semiconductor light-emitting device V. In another example of the embodiment, a position of the first group of second insulating openings 7001 is respectively corresponding to that of the plurality of vias 120.

A patterned metal layer 200 covers a portion of the second semiconductor layer 102, the plurality of vias 120, and the ring-like exposing periphery surface 1011S, except for regions corresponding to the second group of second insulating openings 7002 and the side wall of the outer periphery 1011 of the semiconductor light-emitting device V, wherein the ring-like exposing surface 1011S is formed along the outer periphery 1011 of the semiconductor light-emitting device V. Specifically, from a top view of the semiconductor light-emitting device V, the patterned metal layer 200 includes an area larger than that of the active layer 103. As shown in FIG. 22 and FIG. 23, a portion of the patterned metal layer 200 is formed on the transparent conductive layer 300, the reflective layer 310, or the barrier layer 320. The patterned metal layer 200 comprises one or more opening 2002 to expose the reflective layer 310 and/or the barrier layer 320.

In another embodiment, the patterned metal layer 200 covers a portion of the second semiconductor layer 102, the plurality of vias 120, covers the ring-like exposing periphery surface 1011S, and also extends to the side wall of the outer periphery 1011 of the semiconductor light-emitting device V which is the side wall of the first semiconductor layer 101. In another embodiment, similar to above embodiments, the patterned metal layer 200 can extend to the surface of the substrate 110 not covered by the first semiconductor layer 101. The patterned metal layer 200 can be a single layer structure or a multi-layer structure. The material of the patterned metal layer 200 includes metal such as Al, Cr, Pt, Ti, TiW, W, or Zn.

A third insulating layer 800 is deposited on the semiconductor stack 100. The third insulating layer 800 is patterned by lithography technique to provide a first group of third insulating openings 8001 and a second group of third insulating openings 8002 on the semiconductor stack 100. As shown in FIG. 22 and FIG. 23, the first group of third insulating openings 8001 of the third insulating layer 800 exposes the patterned metal layer 200. The second group of third insulating openings 8002 of the third insulating layer 800 exposes the transparent conductive layer 300, the reflective layer 310, or the barrier layer 320. In an example of the embodiment, the first group of third insulating openings 8001 and the second group of third insulating openings 8002 are formed on two sides of the semiconductor stack 100 from a top view of the semiconductor light-emitting device V. In another example of the embodiment, a number of the first group of third insulating openings 8001 is different from that of the second group of third insulating openings 8002.

The material of the first insulating layer 6000, the second insulating layer 700, and the third insulating layer 800 includes non-conductive material comprising organic materials, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, or glass; or dielectric materials, such as aluminum oxide ($Al_2O_3$), silicon nitride ($SiN_x$), silicon oxide ($SiO_2$), titanium oxide ($TiO_2$), or magnesium fluoride ($MgF_2$). The first insulating layer 6000, the second insulating layer 700, and the third insulating layer 800 can be formed by printing, evaporation or sputtering.

A first pad portion 400 covers one portion of the plurality of vias 120 and electrically connected to the first semiconductor layer 101. A second pad portion 500 covers another portion of the plurality of vias 120 and electrically connected to the second semiconductor layer 102. The first pad portion 400 is electrically connected to the first semiconductor layer 101 through the first group of third insulating opening 8001 of the third insulating layer 800, and the second pad portion 500 is electrically connected to the second semiconductor layer 102 through the second group of third insulating opening 8002 of the third insulating layer 800 and the opening 2002 of the patterned metal layer 200. The material of the first pad portion 400 and the second pad portion 500 includes titanium (Ti), platinum (Pt), nickel (Ni), tin (Sn), gold (Au), or an alloy thereof. An area of the first pad portion 400 can be the same as or different from that of the second pad portion 500.

Figure 5:
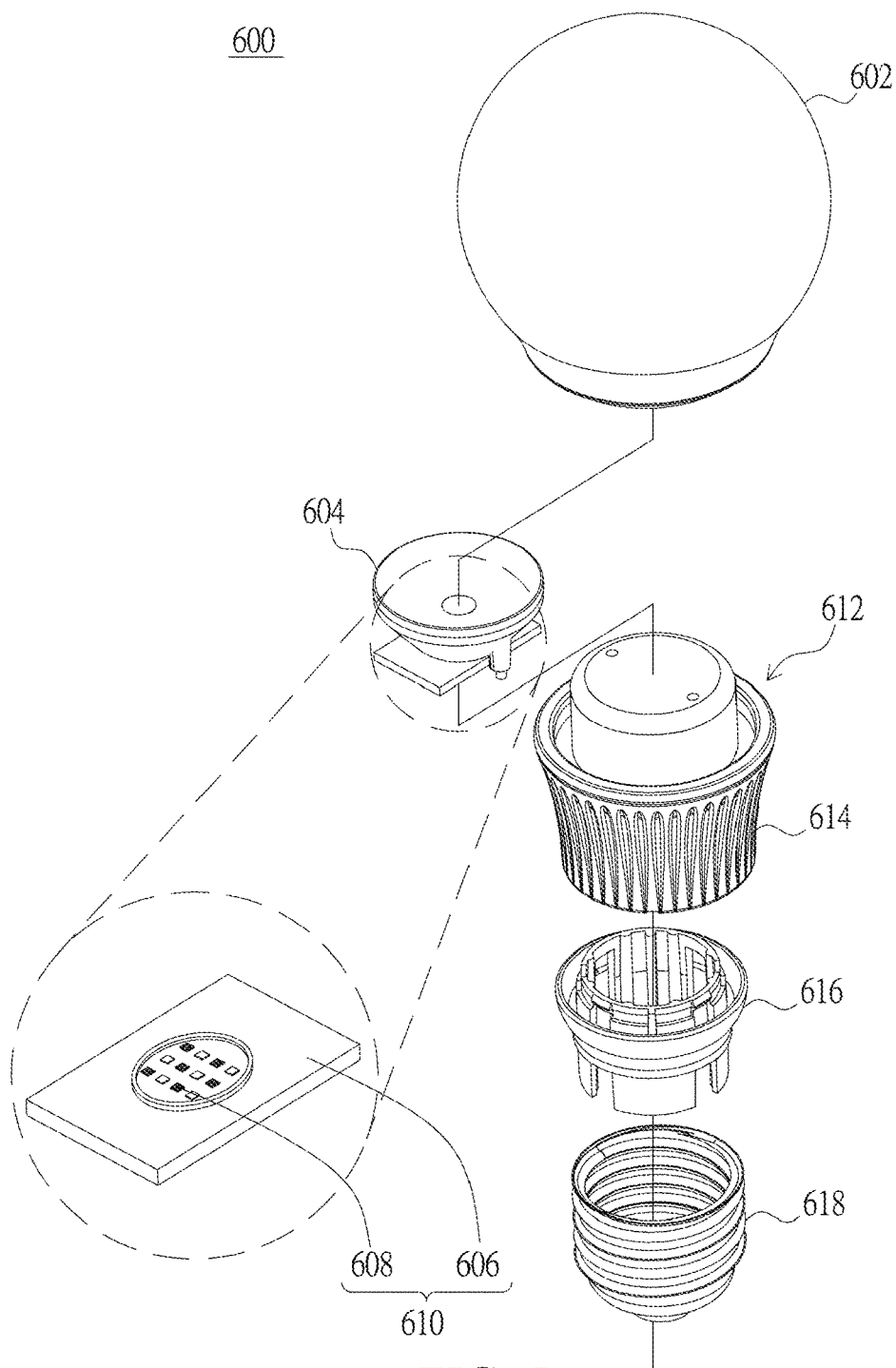
FIG. 5 illustrates a structure diagram in accordance with another embodiment of the present application.
Figure 6:
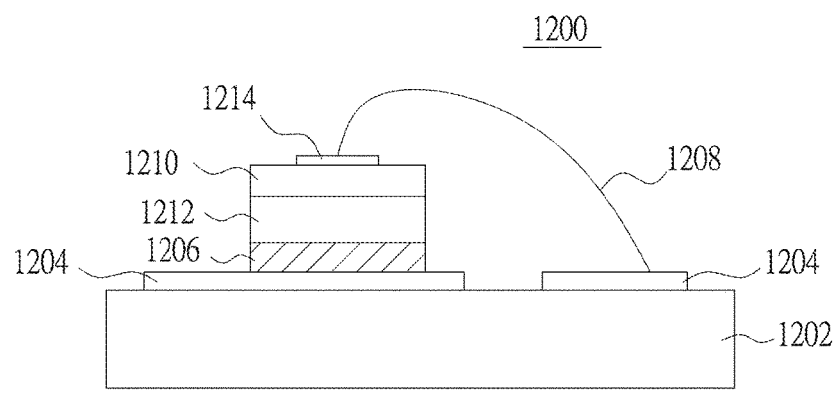
FIG. 6 illustrates a structure diagram of a conventional light-emitting apparatus.
Figure 7:
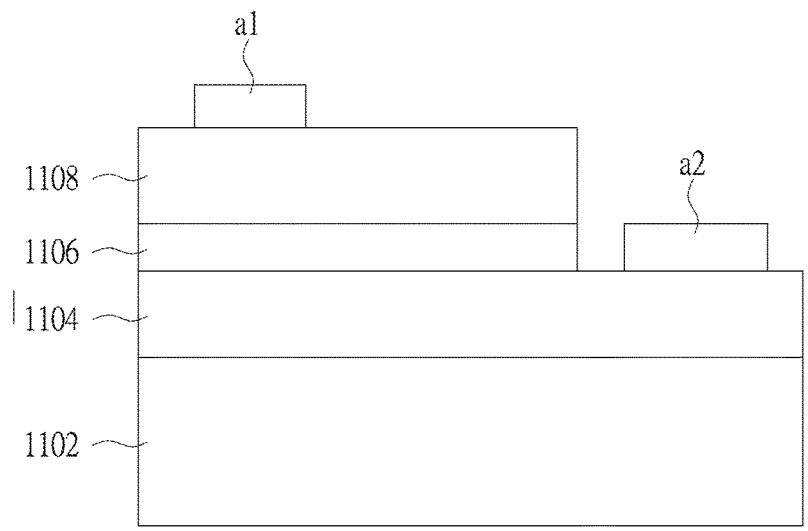
FIG. 7 illustrates a cross-sectional view of a conventional LED.

FIG. 5 illustrates a structure diagram in accordance with another embodiment of the present application. A light bulb 600 includes an envelope 602, a lens 604, a light-emitting module 610, a base 612, a heat sink 614, a connector 616 and an electrical connecting device. The light-emitting module 610 includes a submount 60 and a plurality of light-emitting devices 608, which is described in above embodiments, formed on the submount 606.

FIGS. 24A, 24B, and 25A-31C illustrate a method of manufacturing a semiconductor light-emitting device T in accordance with an embodiment of the present application, in which FIGS. 24A, 25A, 26A, 27A, 28A, 29A, 30A, and 31A are plan views, FIGS. 24B, 25B, 26B, 27B, 28B, 29B, 30B, 31B are sectional views respectively taken along line α-α' shown in FIGS. 24A, 25A, 26A, 27A, 28A, 29A, 30A, and 31A, and FIGS. 28C, 29C, 30C, 31C are sectional views respectively taken along line β-β' shown in FIGS. 28A, 29A, 30A, and 31A.

Figure 24A:
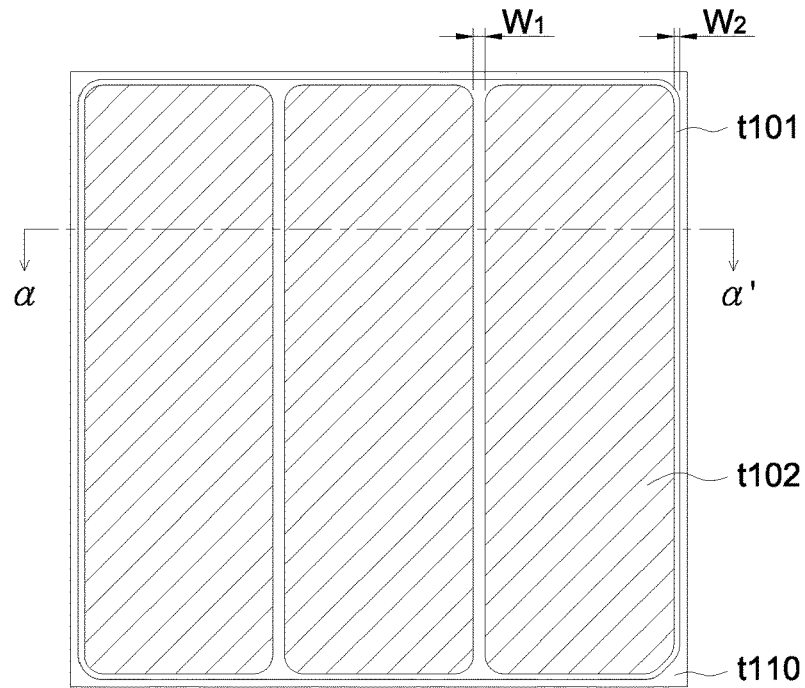
Figure 24B:
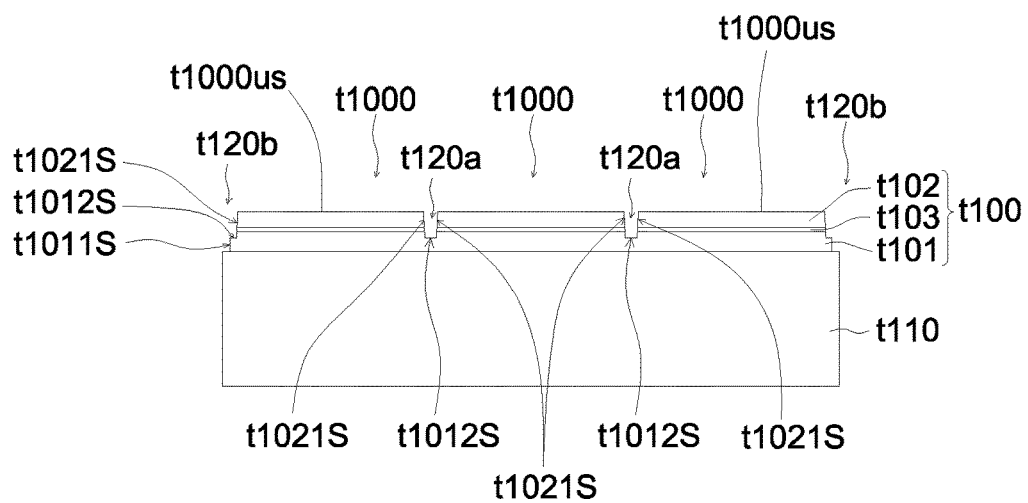

Referring to FIG. 24A and FIG. 24B, a method of manufacturing a semiconductor light-emitting device T includes forming a semiconductor stack t100 on a growth substrate t110. The growth substrate t110 can be a sapphire substrate, but is not limited thereto. In one embodiment, the growth substrate t110 includes a patterned surface. The pattern surface includes a plurality of patterns. The shape of the pattern includes corn, pyramid or hemisphere. The semiconductor stack t100 includes a first semiconductor layer t101 having a periphery side surface t1011S, a second semiconductor layer t102, and an active layer t103 formed between the first semiconductor layer t101 and the second semiconductor layer t102. Each of the first semiconductor layer t101 and the second semiconductor layer t102 can be composed of a single layer or multiple layers. Further, the active layer t103 can have a single-quantum well structure or multi-quantum well structure. The semiconductor stack t100 can be formed of group III nitride based compound semiconductor on the growth substrate t110 by metal organic chemical vapor deposition (MOCVD) or molecular beam epitaxy (MBE). A buffer layer (not shown) can be formed before forming the semiconductor stack t100. The buffer layer is formed to relieve lattice mismatch between the growth substrate t110 and the semiconductor stack t100 and can be formed of a GaN-based material layer, such as gallium nitride and aluminum gallium nitride, or an AlN-based material layer. The buffer layer can be a single layer or multiple layers. The buffer layer can be formed by metal organic chemical vapor deposition (MOCVD), molecular beam epitaxy (MBE) or physical vapor deposition (PVD). The PVD method includes a sputtering method, for example, reactive sputtering method or an evaporation method, such as e-beam evaporation method and thermal evaporation method. In one embodiment the buffer layer includes an AlN buffer layer and is formed by the sputtering method. The AlN buffer layer is formed on a growth substrate with a patterned surface. The sputtering method can produce a dense buffer layer with high uniformity, and therefore the AlN buffer layer can conformably deposit on the patterned surface of the growth substrate.

After forming the semiconductor stack t100, the semiconductor stack t100 is patterned by photolithography and etching process, and a plurality of first trenches t120a and a second trench t120b are formed in the semiconductor stack t100 accordingly. In the embodiment, the plurality of first trenches t120a and the second trench t120b are similar to the depressions/paths of prior embodiments. A plurality of semiconductor constructions t1000 is defined by the plurality of first trenches t120a and the second trench t120b. Specifically, the plurality of first trenches t120a and the second trench t120b are formed by removing portions of the first semiconductor layer t101, the second semiconductor layer t102, and the active layer t103 so that a surface t1012S of the first semiconductor layer t101 is exposed, and the plurality of semiconductor constructions t1000 is formed. Herein the periphery side surface t1011S of the first semiconductor layer t101 connects the surface t1012S of the first semiconductor layer t101.

The plurality of semiconductor constructions t1000 is connected to each other through a portion of the first semiconductor layer t101 corresponding to the first trenches t120a and the second trench t120b. Additionally, each of the plurality of semiconductor constructions t1000 includes an inclined sidewall t1021S, and an upper surface t1000uS of the semiconductor construction t1000 and the surface t1012S of the first semiconductor layer t101 are connected by the inclined sidewall t1021S.

In the embodiment, the plurality of first trenches t120a and the second trench t120b penetrate the second semiconductor layer t102 and the active layer t103. The second trench t120b exposes the periphery region of the first semiconductor layer t101. The second trench t120b is disposed near outmost edges of the semiconductor stack t100 and also near outmost edges of the active layer 103. In other words, the second trench t120b is disposed near a periphery of the growth substrate t110. Each of the plurality of first trenches t120a is interposed between the semiconductor constructions t1000, and the plurality of first trenches t120a is surrounded by the second trench t120b. The plurality of first trenches t120a and the second trench t120b surround the active layer t103 and the second semiconductor layer t102. Herein a width $W_1$ of one of the plurality of first trenches t120a is greater than a width $W_2$ of the second trench t120b, for example, $W_1=2W_2$. The first trenches t120a are parallel to each other, and two ends of each of the plurality of first trenches t120a are connected to the second trench t120b. In a top view, a shape of one of the plurality of first trenches t120a includes a stripe, a shape of the second trench t120b includes a geometric shape, for example, a ring-like shape. The second trench t120b surrounds the active layer t103 and the second semiconductor layer t102 and is disposed near the periphery side surface t1011S of the first semiconductor layer t101. The plurality of first trenches t120a and the second trench t120b compose a plurality of closed geometric shapes, for example, rectangles. In the embodiment, the number of the second trench t120b is one, and the active layer t103 and the second semiconductor layer t102b are surrounded by the second trench t120b in a top view, but the application is not limited hereto.

Figure 24C:
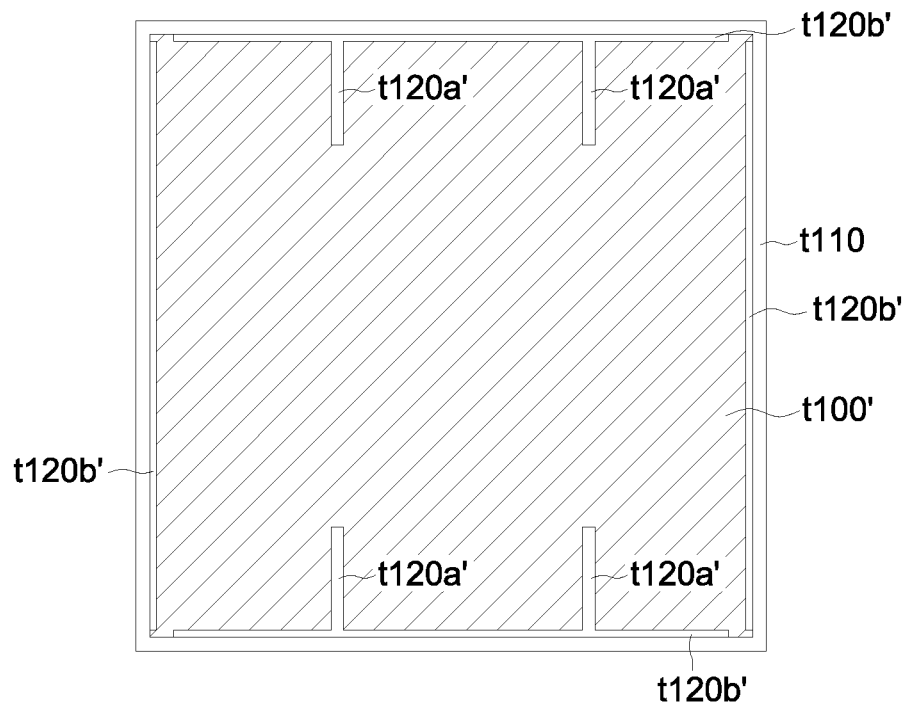
FIGS. 24C and 24D illustrate top views of trenches in accordance with other embodiments of the present application.
Figure 24D:
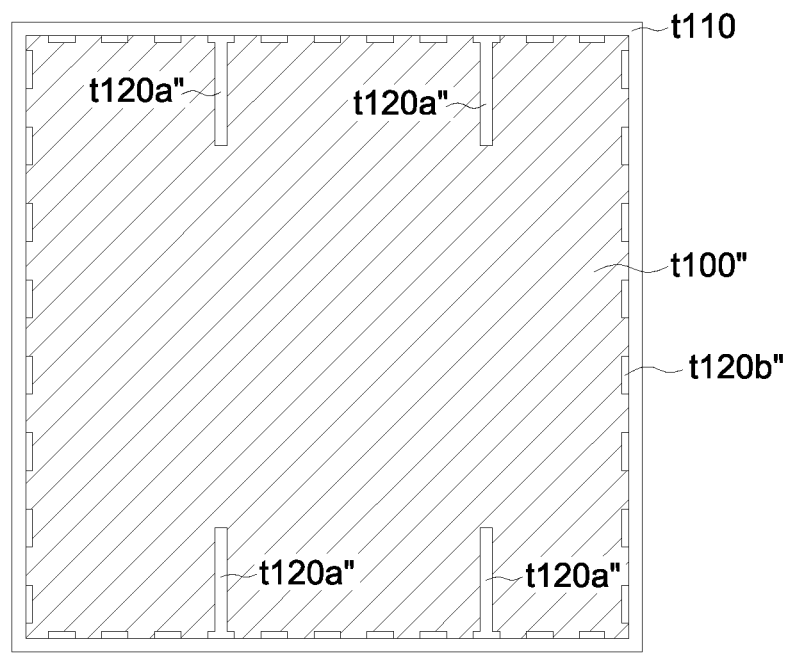

Referring to FIGS. 24C and 24D, FIG. 24C illustrates a top view of trenches in a semiconductor stack t100' on the substrate t110 in accordance with one embodiment of the present application, and FIG. 24D illustrates a top view of trenches in a semiconductor stack t100'' on the substrate t110 in accordance with one embodiment of the present application. The structures of the semiconductor stacks t100', t100'' are the same as that of the semiconductor stacks t100. The difference is that, in FIG. 24C, there are a plurality of first trenches t120a' and a plurality of second trenches t120b', wherein the second trenches t120b' can be separated from one another and surround the active layer. Specifically, there are four first trenches t120a' shown in FIG. 24C, each two of the first trenches t120a' are branched from two of the plurality of second trenches t120b' respectively. Additionally, in FIG. 24D, there are a plurality of first trenches t120a'' and a plurality of second trenches t120b''. The plurality of second trenches t120b'' surrounds the active layer (not shown in the figure) and is disposed near the periphery of the substrate t110 and also near the periphery of the substrate t110. The plurality of second trenches t120b'' composes a rectangular dashed ring.

Figure 25A:
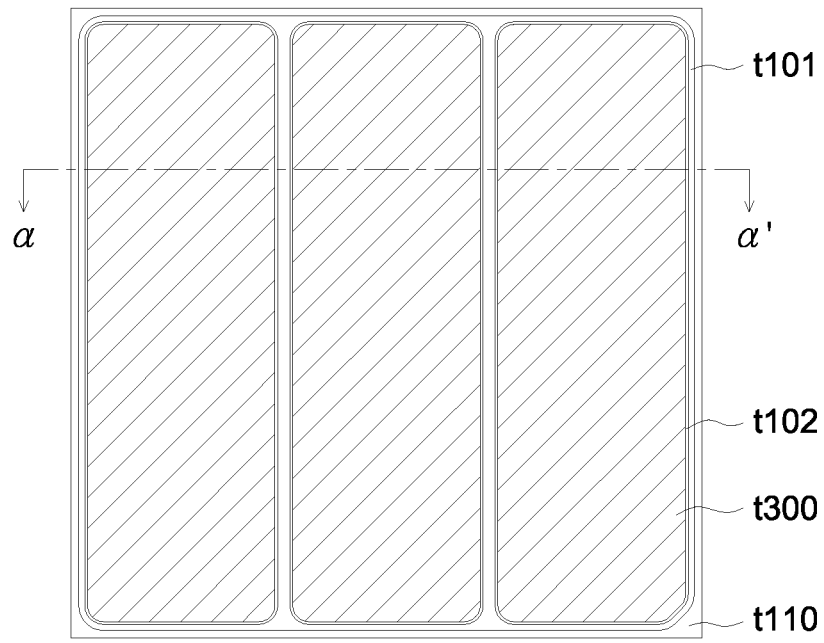
Figure 25B:
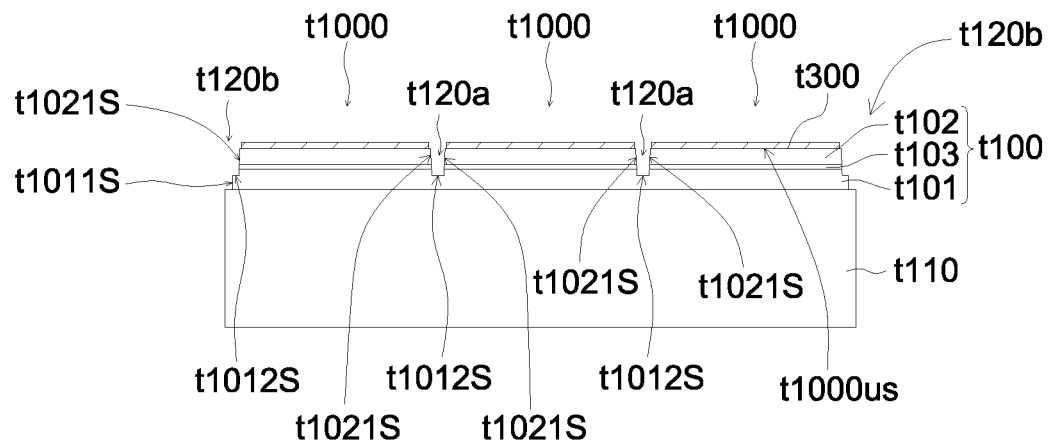

Referring to FIG. 25A and FIG. 25B, a transparent conductive layer t300 is formed on the second semiconductor layer t102 in the following step. In one embodiment, the transparent conductive layer t300 directly contacts the second semiconductor layer t102, spreads current and then injects current to the second semiconductor layer t102. The transparent conductive layer t300 does not contact the first semiconductor layer t101. The transparent conductive layer t300 includes a transparent conductive oxide film, such as indium tin oxide (ITO), or indium zinc oxide (IZO). The transparent conductive layer t300 can be configured to form a low-resistance contact, for example, ohmic contact, with the second semiconductor layer t102. The transparent conductive layer t300 includes a single layer or multiple layers. For example, as the transparent conductive layer t300 includes multiple sub-layers, the transparent conductive layer t300 can be a distributed Bragg reflector (DBR) which includes a plurality pairs of sub-layers and each sub-layer has a refractive index different from that of adjacent sub-layers. Specifically, the transparent conductive layer t300 can be formed by alternately stacking two sub-layers made of different materials with different refractive index to be the distributed Bragg reflector (DBR).

Figure 26A:
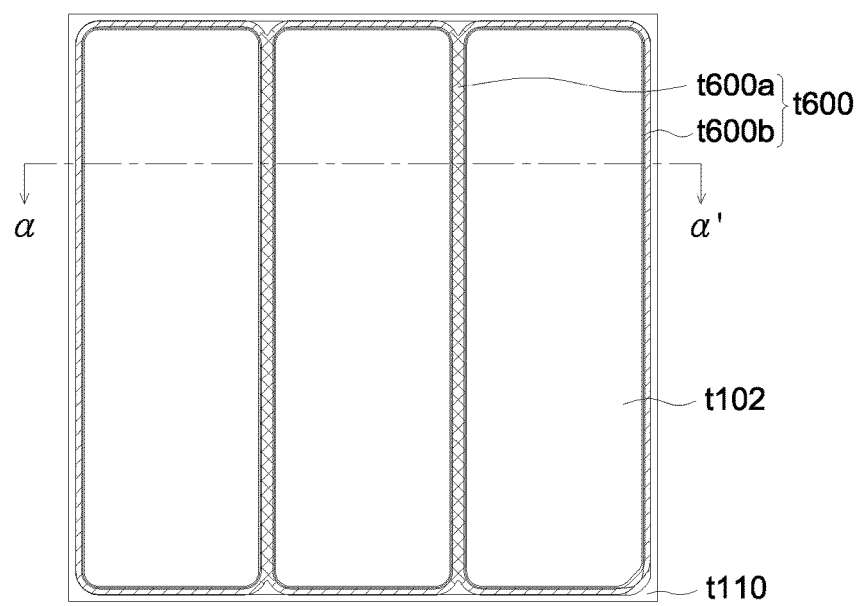
Figure 26B:
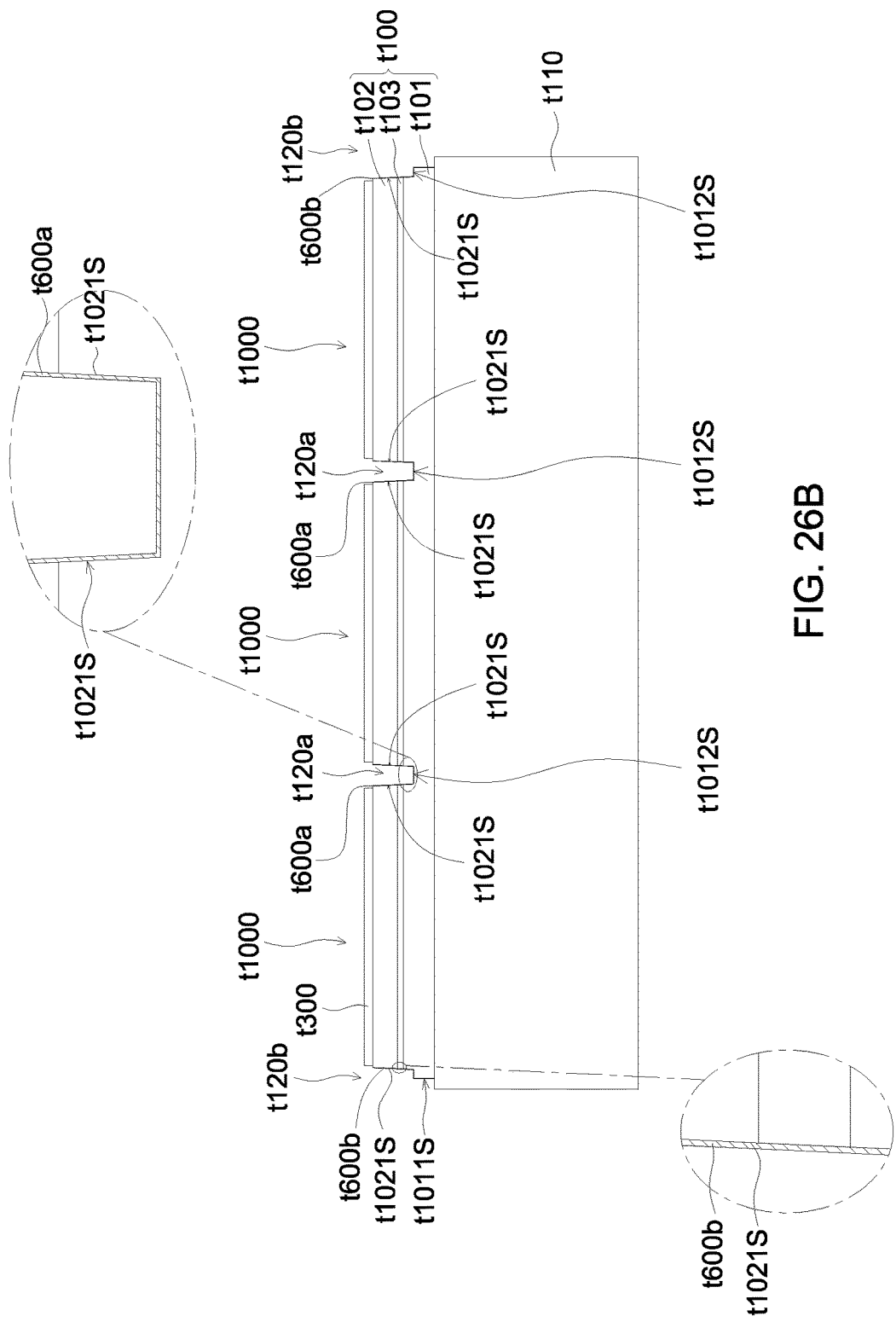

Referring to FIG. 26A and FIG. 26B, a first insulating layer t600 is formed to cover the periphery side surface t1011S of the first semiconductor layer t101, the surface t1012S of the first semiconductor layer t101 and the inclined sidewalls t1021S. In other words, the first insulating layer t600 includes a first group of first insulating regions t600a formed on the surface t1012S and the inclined sidewalls t1021S of the semiconductor construction t1000, which correspond to the plurality of first trenches t120a, and a second group of first insulating regions t600b formed on the periphery side surface t1011S, the surface t1012S of the first semiconductor layer t101 and the inclined sidewalls t1021S corresponding to the second trench t120b. A material of the first insulating layer t600 can be a non-conductive material. Herein the non-conductive material includes organic materials, such as Su8, benzocyclobutene (BCB), perfluorocyclobutane (PFCB), epoxy, acrylic resin, cyclic olefin copolymers (COC), polymethyl methacrylate (PMMA), polyethylene terephthalate (PET), polyimide (PI), polycarbonate (PC), polyetherimide, or fluorocarbon polymer, or inorganic materials, such as silicone, glass, aluminum oxide ($Al_2O_3$), silicon nitride ($SiN_x$), silicon oxide ($SiO_x$), titanium dioxide ($TiO_2$), or magnesium fluoride ($MgF_x$). The first insulating layer t600 includes a single layer or multiple layers. When the first insulating layer t600 includes multiple layers, the first insulating layer t600 can be a distributed Bragg reflector (DBR) which includes a plurality pairs of sub-layers, and each sub-layer has a refractive index different from that of adjacent sub-layers. Specifically, the first insulating layer t600 can be formed by alternately stacking a $SiO_x$ sub-layer and a $TiO_x$ sub-layer. The DBR provides a high reflectivity for particular wavelength or within a particular wavelength range by setting the refractive index difference between each pair of the sub-layers with a high refractive index and a low refractive index respectively. The thicknesses of two sub-layers in each pair can be different. The thicknesses of the sub-layers in each pair with the same material can be the same or different.

Figure 27A:
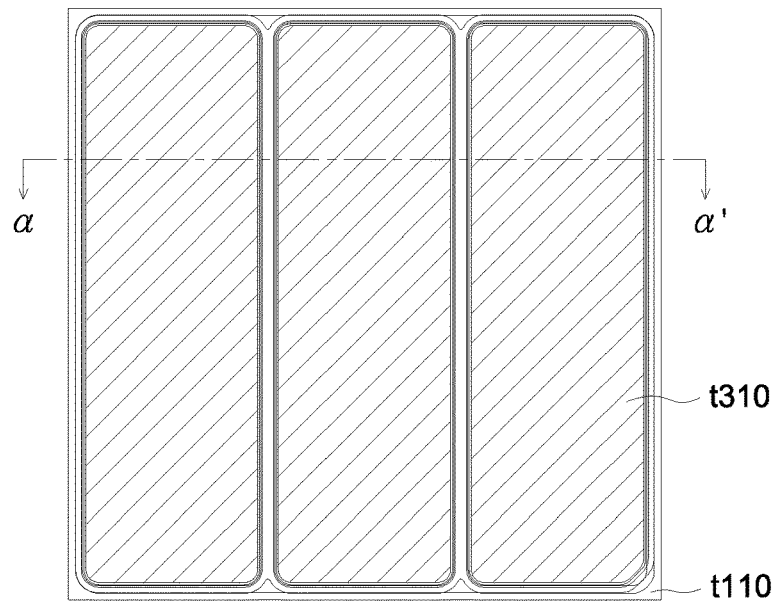
Figure 27B:
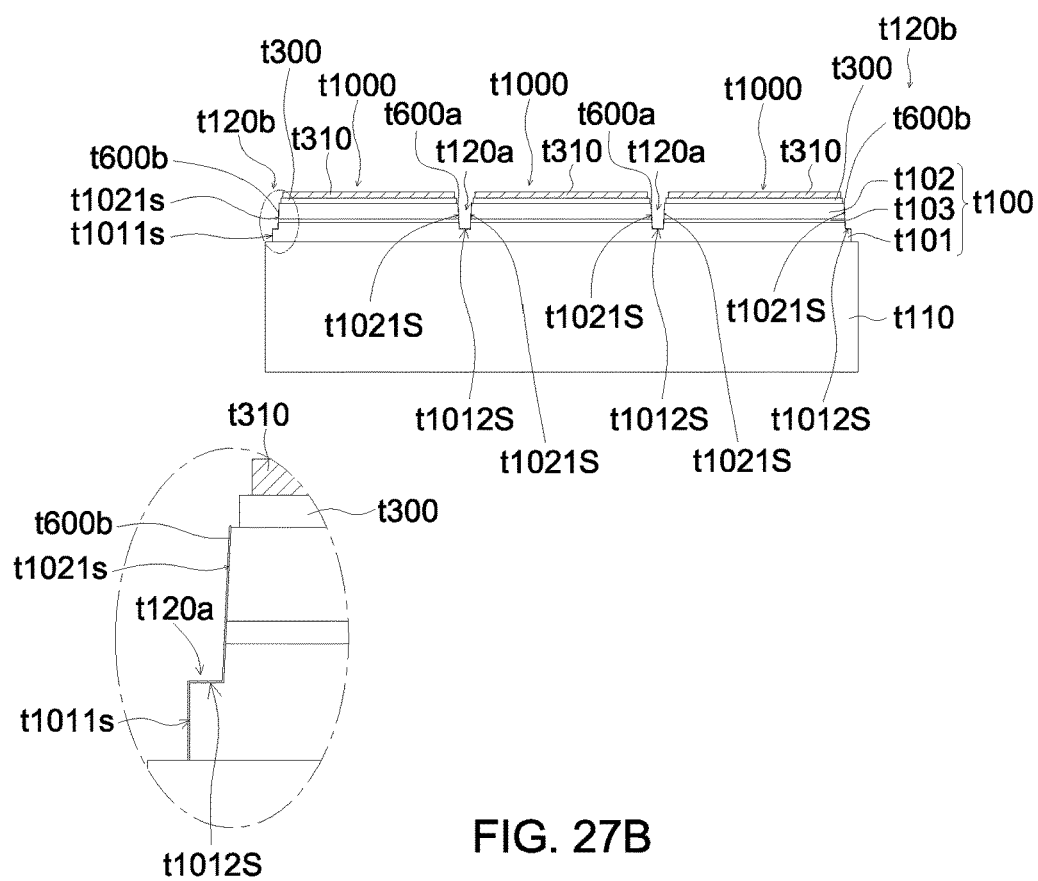

Referring to FIG. 27A and FIG. 27B, a reflective layer t310 is formed on the transparent conductive layer t300 and aligned with transparent conductive layer t300. A shape of the reflective layer t310 corresponds to a shape of the transparent conductive layer t300, and in the embodiment, the shape of the reflective layer t310 is similar to a rectangle, and corners of the reflective layer t310 are curve-like. The reflective layer t310 can include a single layer structure or a multi-layer structure, and the material of the reflective layer t310 includes a metal material with a high reflectivity for the light emitted by the active layer t103, such as silver (Ag), gold (Au), aluminum (Al), titanium (Ti), chromium (Cr), copper (Cu), nickel (Ni), or platinum (Pt) or an alloy thereof. A barrier layer (not shown) can be formed on and cover the reflective layer t310 so that the barrier layer can prevent migration, diffusion or oxidation of the reflective layer t310. The barrier layer can include a single layer structure or a multi-layer structure, and the material of the barrier layer includes chromium (Cr), platinum (Pt), titanium (Ti), tungsten (W), or zinc (Zn). When the barrier layer is the multi-layer structure, the barrier layer is alternately stacked by a first barrier layer (not shown) and a second barrier layer (not shown), for example, Cr/Pt, Cr/Ti, Cr/TiW, Cr/W, Cr/Zn, Ti/Pt, Ti/W, Ti/TiW, Ti/W, Ti/Zn, Pt/TiW, Pt/W, Pt/Zn, TiW/W, TiW/Zn, or W/Zn.

Figure 28A:
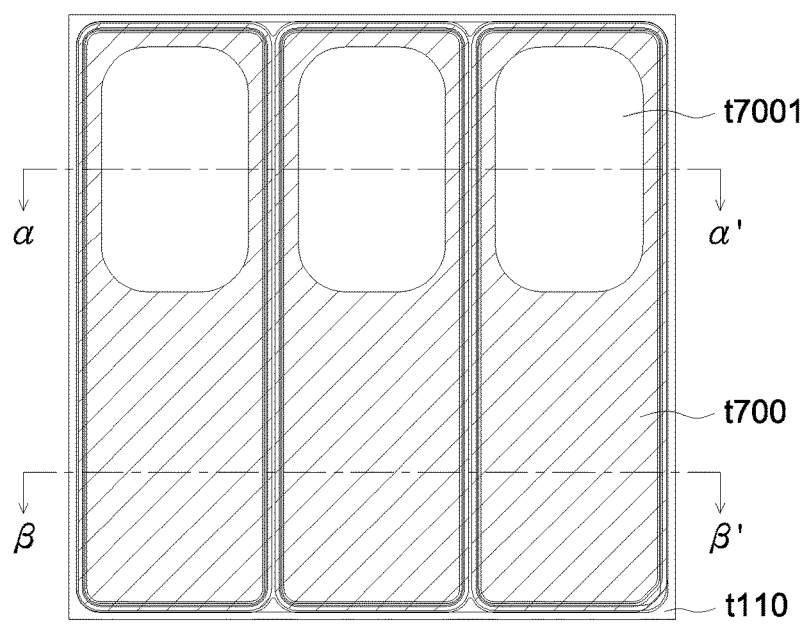
Figure 28B:
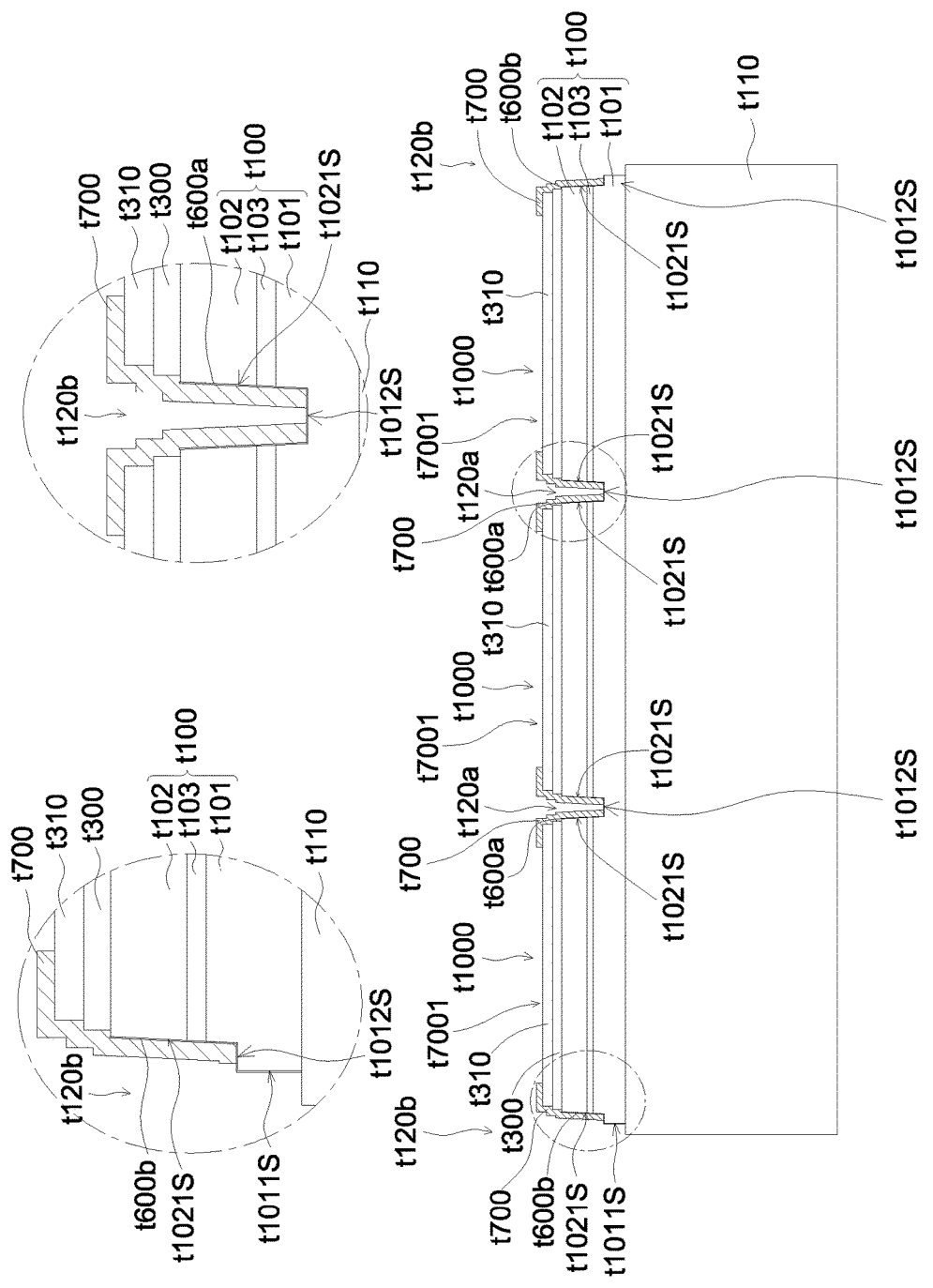
Figure 28C:
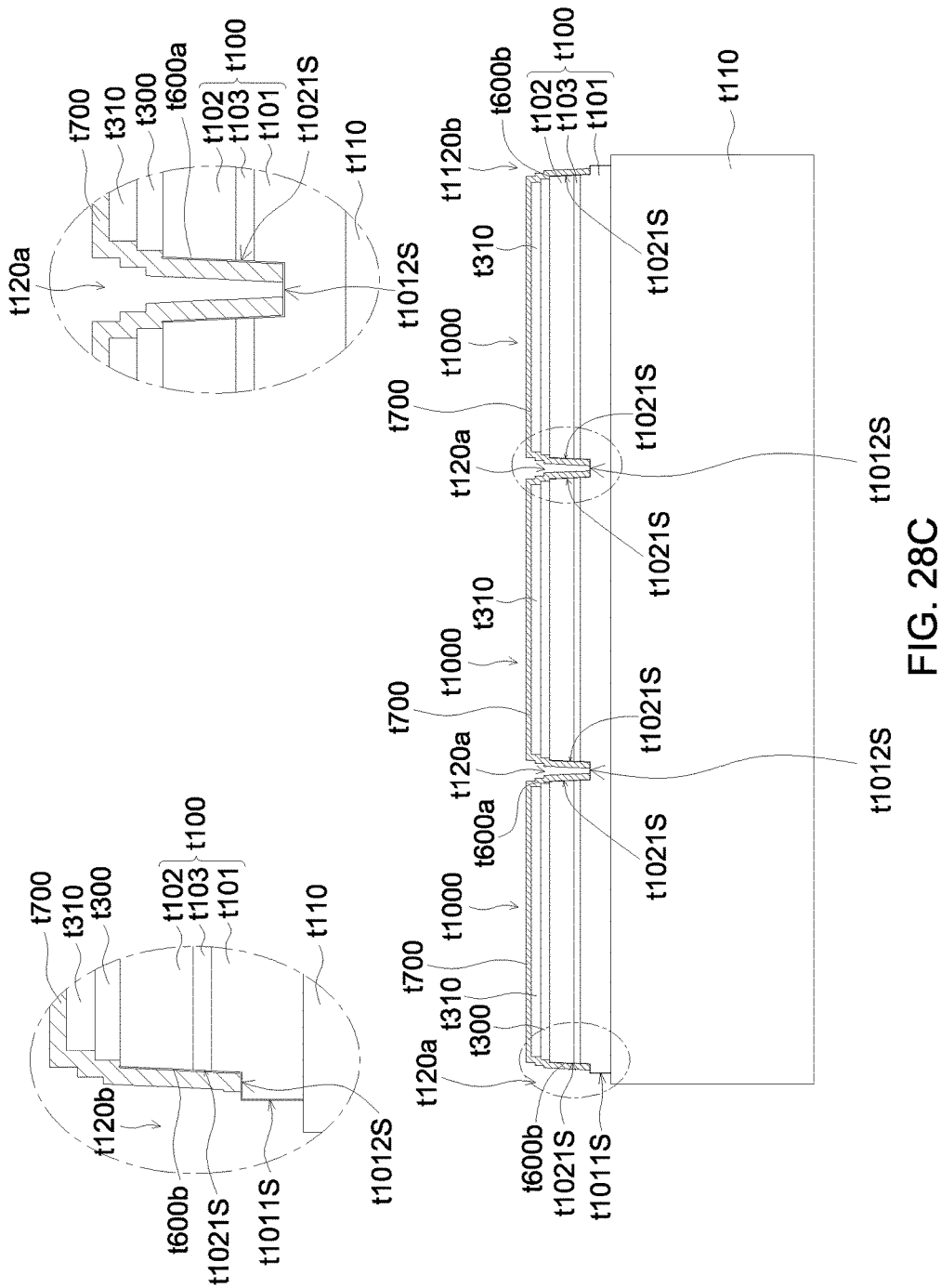

Referring to FIGS. 28A-28C, FIG. 28B and FIG. 28C are cross-sectional views taken along lines α-α' and β-β' shown in FIG. 28A. After forming the reflective layer t310, an insulating layer is formed on the plurality of semiconductor constructions t1000 to cover the reflective layer t310, the first group of first insulating regions t600a, and the second group of first insulating regions t600b. Sequentially, parts of the insulating layer are removed to expose portions of the reflective layer t310, the periphery side surface t1011S, and the surface t1012S by a photolithography and etching process to form a second insulating layer t700. Notably, at the same photolithography and etching process, a portion of the first group of first insulating regions t600a is removed away to expose the surface t1012S. In the embodiment, the second insulating layer t700 includes a group of second insulating openings t7001 to expose the reflective layer t310. A shape of the exposed reflective layer t310 corresponds to a shape of the group of second insulating openings t7001. A material of the second insulating layer t700 can be a non-conductive material. Herein the non-conductive material includes organic materials, such as Su8, benzocyclobutene (BCB), perfluorocyclobutane (PFCB), epoxy, acrylic resin, cyclic olefin copolymers (COC), polymethyl methacrylate (PMMA), polyethylene terephthalate (PET), polyimide (PI), polycarbonate (PC), polyetherimide, or fluorocarbon polymer, or inorganic materials, such as silicone, glass, aluminum oxide ($Al_2O_3$), silicon nitride ($SiN_x$), silicon oxide ($SiO_x$), titanium dioxide ($TiO_2$), or magnesium fluoride ($MgF_x$). The second insulating layer t700 includes a single layer or multiple layers. When the second insulating layer t700 includes multiple sub-layers, the second insulating layer t700 can be a distributed Bragg reflector (DBR) which includes a plurality pairs of sub-layers, and each sub-layer has a refractive index different from that of adjacent sub-layers. Specifically, the second insulating layer t700 can be formed by alternately stacking a $SiO_x$ sub-layer and a $TiO_x$ sub-layer. The DBR provides a high reflectivity for particular wavelength or within a particular wavelength range by setting the refractive index difference between each pair of the sub-layers with a high refractive index and a low refractive index respectively. The thicknesses of two sub-layers in each pair can be different. The thicknesses of the sub-layers in each pair with the same material can be the same or different.

Figure 29A:
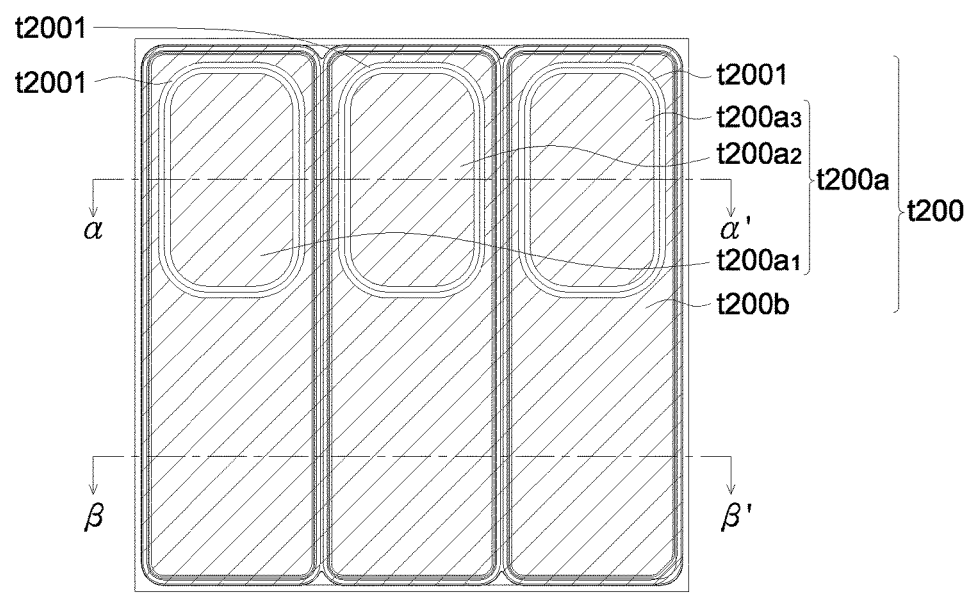

Referring to FIGS. 29A-29C, FIG. 29A is a top view, and FIG. 29B and FIG. 29C are cross-sectional views taken along lines α-α' and β-β' shown in FIG. 29A. After forming the second insulating layer t700, a patterned metal layer t200 is formed on the second semiconductor layer t102, the second insulating layer t700, and the reflective layer t310. As shown in FIGS. 29A-29C, the patterned metal layer t200 includes a first metal region t200a a second metal region t200b, and a plurality of ring-like openings t2001. Each of the first metal region t200a and the second metal region t200b can be a continuous one or divided into a plurality parts. In the embodiment, the first metal region t200a is divided into a group of sub-regions t200a1, t200a2, t200a3 by the ring-like openings t2001. The second metal region t200b of the patterned metal layer t200 is continuously formed on the second semiconductor layer t102, and fills in the plurality of first trenches t120a and the second trench t120b to cover the plurality of semiconductor constructions t1000. In a top view, the group of sub-regions t200a1, t200a2, t200a3 includes a plurality of rectangular patterns surrounded by the second metal region t200b. Since plurality of ring-like openings t2001 surrounding the group of sub-regions t200a1, t200a2, t200a3 respectively, the first metal region t200a is electrically isolated to the second metal region t200b. In the embodiment, an outline of the patterned metal layer t200 is approximately a rectangle. The group of sub-regions t200a1, t200a2, t200a3 covers the exposed portion of the reflective layer t310 corresponding to the group of second insulating openings t7001 and electrically connects to the second semiconductor layer t102 through the reflective layer t310 and the transparent conductive layer t300. Additionally, the second metal region t200b is continuously formed over the second insulating layer t700, formed and fills in the plurality of first trenches t120a and the second trench t120b, and covers the periphery side surface t1011S, the inclined side surface t1021S, and the surface t1012S of the first semiconductor layer t101, so as to contact the periphery side surface t1011S and the surface t1012S of the first semiconductor layer t101. Accordingly, the second metal region t200b electrically connects to the first semiconductor layer t101. Herein functions of the first metal region t200a and the second metal region t200b are similar to functions of the contact structures of prior embodiments.

In one embodiment of the present application similar to the embodiment described above, further referring to FIG. 24C, the second metal region t200b is continuously formed over the semiconductor stacks t100' and other layers described above, and extends to fill in the plurality of first trenches t120a' and the plurality of second trenches t120b'. The second metal region t200b covers the periphery side surface t1011S, and the inclined side surface t1021S, and discontinuously contacts the surface t1012S of the first semiconductor layer t101 in the first trenches t120a' and the second trenches t120b', so as to electrically contact the first semiconductor layer t101. Specifically, corresponding to the second metal region t200b in the first trenches t120a and the second trenches t120b shown in FIG. 29A, the first trenches t120a' and the second trenches t120b' are discontinuous, portions of the second metal region t200b directly contact the surface t1012S of the first semiconductor layer t101 via the plurality of first trenches t120a' and the plurality of second trenches t120b', and in a top view (not shown), a shape of the portions of the second metal region t200b directly contacting the surface t1012S of the first semiconductor layer t101 corresponds to a shape composed by the plurality of first trenches t120a' and the plurality of second trenches t120b'. In another one embodiment similar to the embodiment described above, further referring to FIG. 24D, the second metal region t200b is continuously formed over the semiconductor stacks t100" and other layers described above, and extends to fills in the plurality of first trenches t120a" and the plurality of second trenches t120b". The second metal region t200b covers the periphery side surface t1011S, and the inclined side surface t1021S, and discontinuously contacts the surface t1012S of the first semiconductor layer t101 in the first trenches t120a' and the second trenches t120b', so as to electrically contact the first semiconductor layer t101. Corresponding to the second metal region t200b in the first trenches t120a and the second trenches t120b shown in FIG. 29A, the first trenches t120a', and the second trenches t120b" are discontinuous. Portions of the second metal region t200b directly contact the surface t1012S of the first semiconductor layer t101 via the plurality of first trenches t120a" and the plurality of second trenches t120b", and in a top view (not shown), a shape of the portions of the second metal region t200b directly contacting the surface t1012S of the first semiconductor layer t101 corresponds to a shape composed by the plurality of first trenches t120a" and the plurality of second trenches t120b". Notably, the same reference numerals are used throughout the various embodiments to refer to the same or similar elements of an embodiment and redundant details thereof are omitted.

Figure 30A:
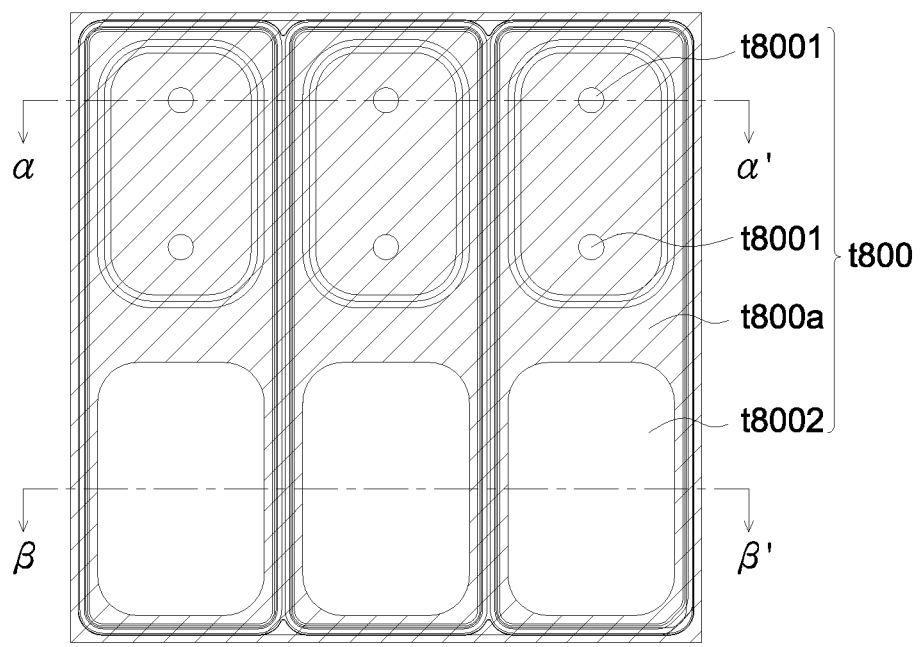
Figure 30B:
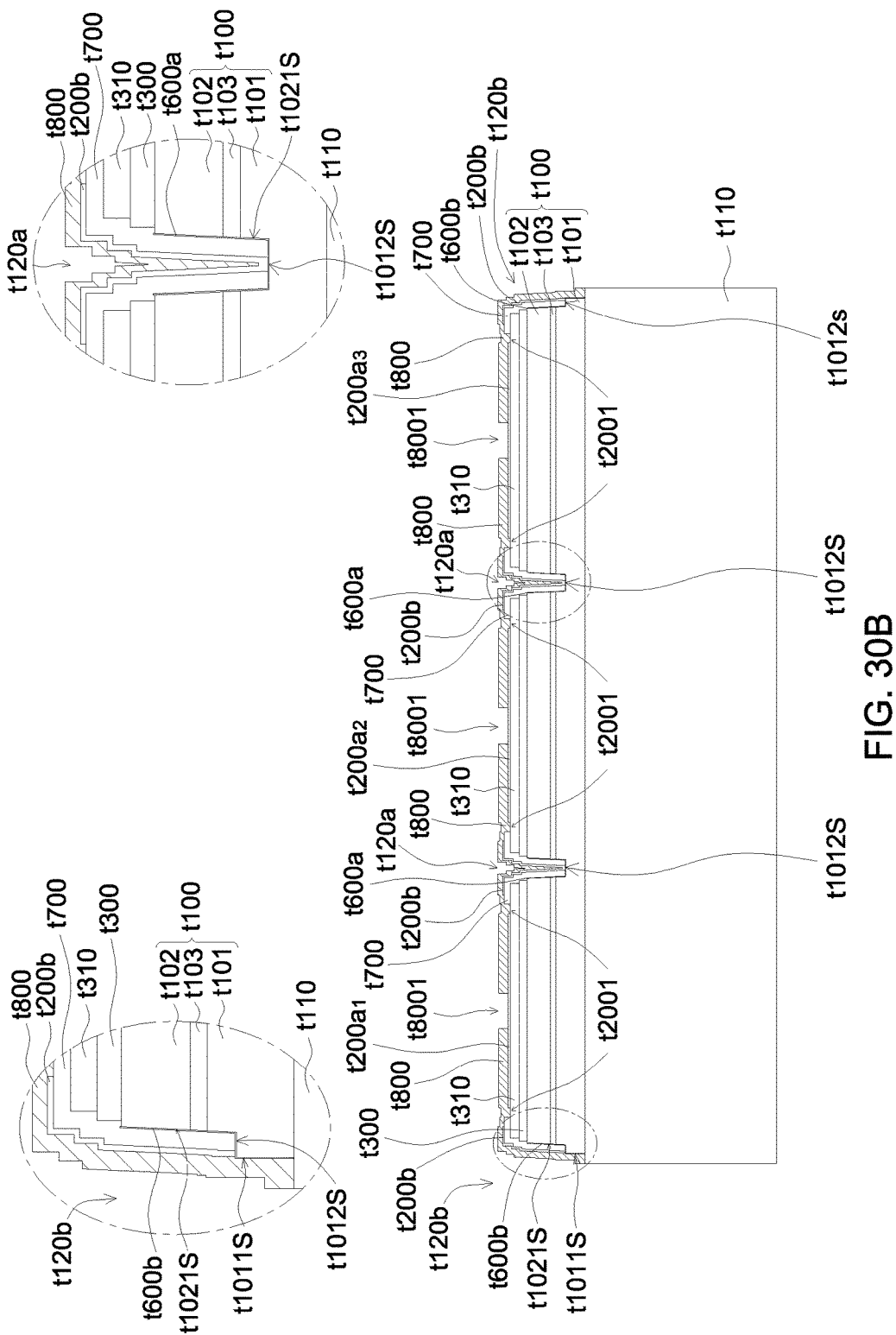
Figure 30C:
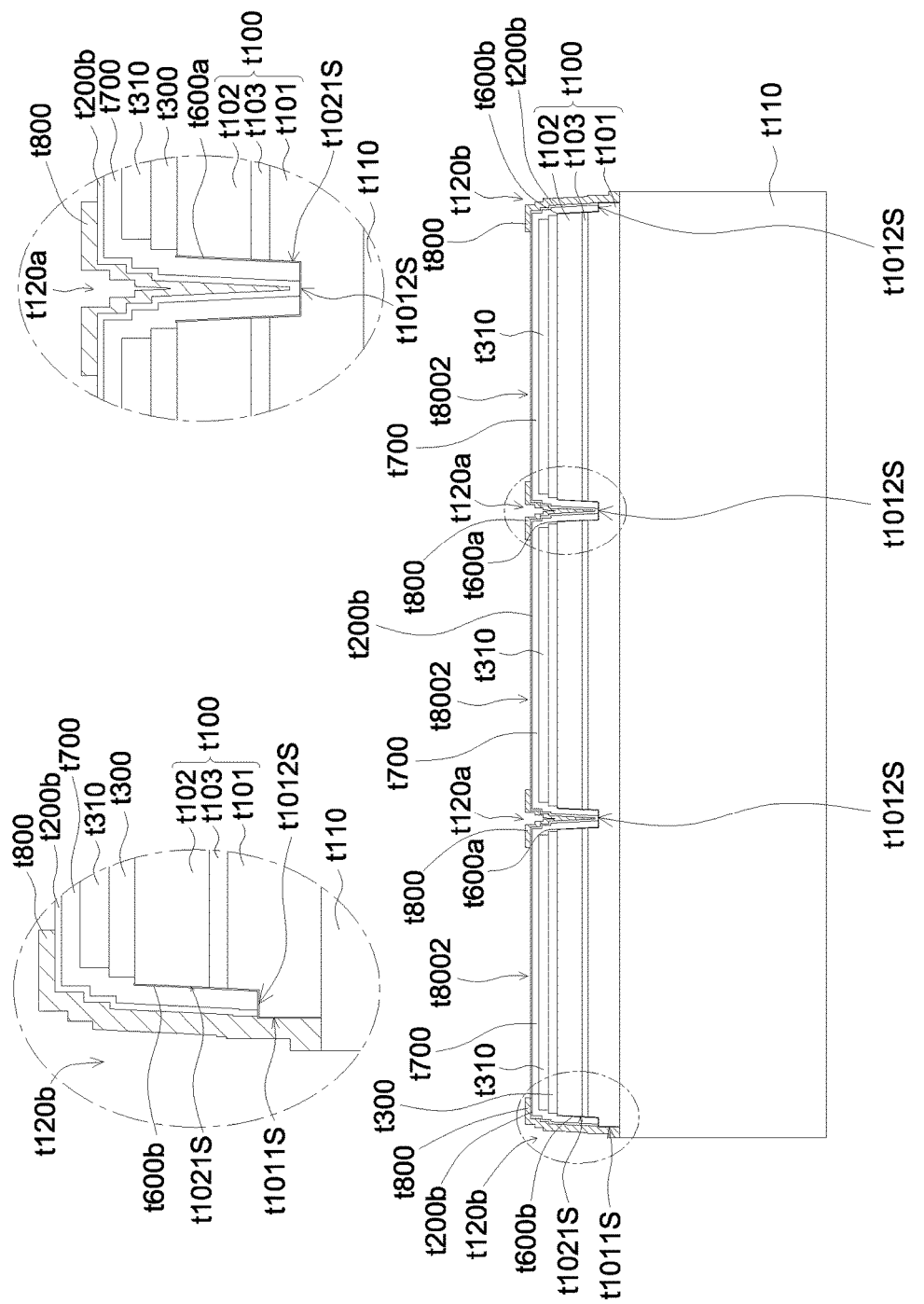

Referring to FIGS. 30A-30C, FIG. 30A is a top view and FIG. 30B and FIG. 30C are cross-sectional views taken along lines α-α' and β-β' shown in FIG. 30A. After forming the patterned metal layer t200, a third insulating layer t800 is formed to continuously cover the plurality of semiconductor constructions t1000, the inclined sidewalls t1021S of the plurality of semiconductor constructions t1000, and fills the plurality of first trenches t120a and the second trench t120b. The third insulating layer t800 includes a first insulating region t800a, a first group of third insulating openings t8001 and a second group of third insulating openings t8002 in a top view wherein the first group of third insulating openings t8001 includes one or more openings, and the second group of third insulating openings t8002 includes one or more openings. The first group of third insulating openings t8001 exposes the group of sub-regions t200a1, t200a2, t200a3 respectively, and the second group of third insulating openings t8002 exposes the second metal region t200b respectively. A material of the third insulating layer t800 can be a non-conductive material. Herein the non-conductive material includes organic materials, such as Su8, benzocyclobutene (BCB), perfluo rocyclobutane (PFCB), epoxy, acrylic resin, cyclic olefin copolymers (COC), polymethyl methacrylate (PMMA), polyethylene terephthalate (PET), polyimide (PI), polycarbonate (PC), polyetherimide, or fluorocarbon polymer, or inorganic materials, such as silicone, glass, aluminum oxide ($Al_2O_3$), silicon nitride ($SiN_x$), silicon oxide ($SiO_x$), titanium dioxide ($TiO_2$), or magnesium fluoride ($MgF_x$). The third insulating layer t800 includes a single layer or multiple layers. When the third insulating layer t800 includes multiple sub-layers, the third insulating layer t800 can be a distributed Bragg reflector (DBR) which includes a plurality pairs of sub-layers, and each sub-layer has a refractive index different from that of adjacent sub-layers. Specifically, the third insulating layer t800 can be formed by alternately stacking a $SiO_x$ sub-layer and a $TiO_x$ sub-layer. The DBR provides a high reflectivity for particular wavelength or within a particular wavelength range by setting the refractive index difference between each pair of the sub-layers with a high refractive index and a low refractive index respectively. The thicknesses of two sub-layers in each pair can be different. The thicknesses of the sub-layers in each pair with the same material can be the same or different.

Figure 31A:
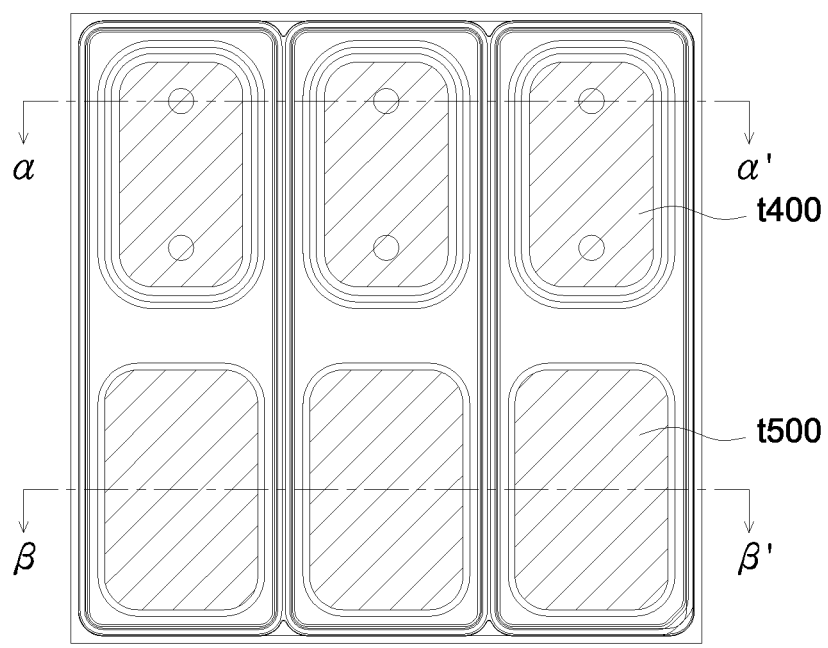
Figure 31B:
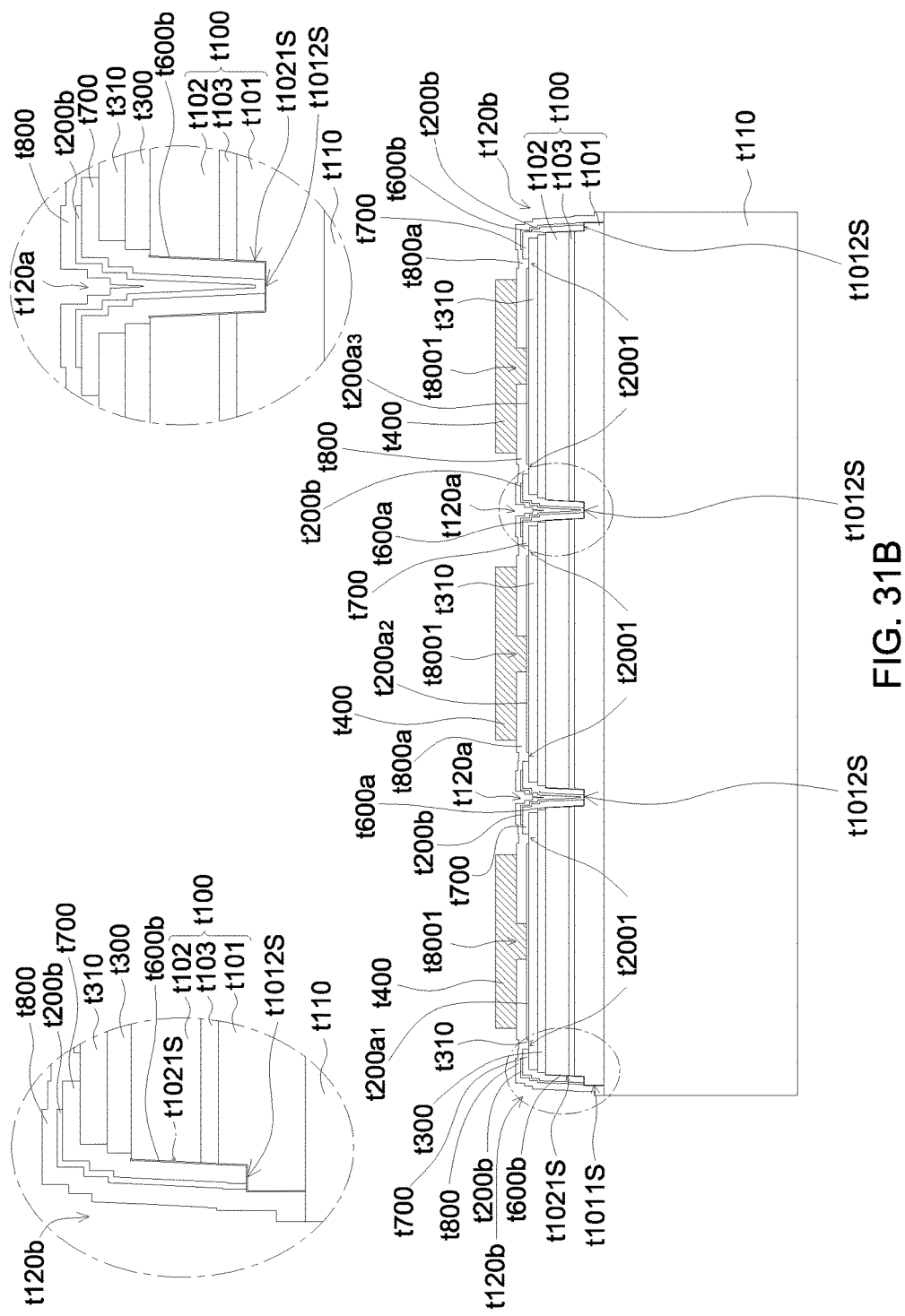
Figure 31C:
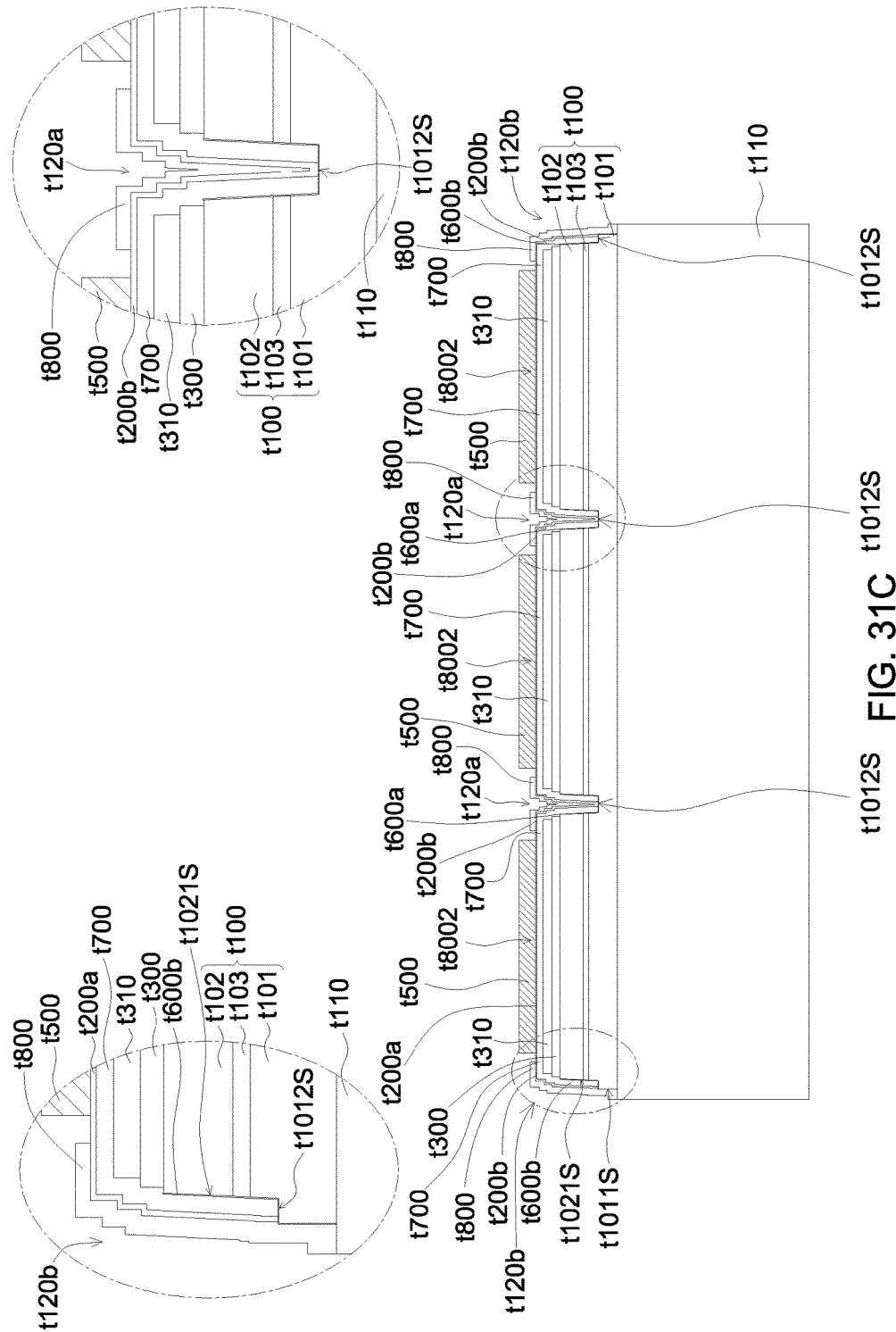

Referring to FIG. 31A, FIG. 31B, and FIG. 31C, FIG. 31A is a top view of the semiconductor light-emitting device T at the completion of the fabrication method in accordance with the embodiment of the present application and FIG. 31B and FIG. 31C are cross-sectional views taken along line α-α' and β-β' shown in FIG. 31A. The method of manufacturing the semiconductor light-emitting device T further includes forming a plurality of first pad portions t400 and a plurality of second pad portions t500 after forming the third insulating layer t800. Herein, the plurality of first pad portions t400 is formed on the third insulating layer t800 and contacts the first metal region t200a including the group of sub-regions t200a1, t200a2, t200a3 of the patterned metal layer t200 respectively through the first group of third insulating openings t8001 so that the first pad portions t400 electrically connects to the second semiconductor layer t102. Meanwhile, the plurality of second pad portions t500 is formed on the third insulating layer t800 and contacts the second metal region t200b of the patterned metal layer t200 through the second group of third insulating openings t8002 so that the second pad portions t500 electrically connects to the first semiconductor layer t101. Moreover, the plurality of first pad portions t400 is separated from the plurality of second pad portions t500. Additionally, the first pad portions t400 are separated from each other, disposed in a row and aligned with the second pad portions t500.

As shown in FIGS. 31A-31C, the semiconductor light-emitting device T includes the substrate t110, the semiconductor stack t100 formed on the substrate t110. The semiconductor stack t100 includes the first semiconductor layer t101 having the periphery side surface t1011S, the second semiconductor layer t102, and the active layer t103 formed between the first semiconductor layer t101 and the second semiconductor layer t102. In an example of the embodiment, the substrate t110 can be a growth substrate of the semiconductor stack t100, and a material of the substrate t110 includes a semiconductor material, such as gallium arsenide (GaAs), gallium phosphide (GaP), gallium nitride (GaN), silicon carbide (SiC) or aluminum nitride (AlN), or an insulating material, such as diamond, glass, quartz, or sapphire. In another example of the embodiment, the substrate t110 can be a support substrate, which is bonded to the semiconductor stack 100 through adhesive materials including organic materials, such as Su8, benzocyclobutene (BCB), perfluorocyclobutane (PFCB), epoxy, acrylic resin, cyclic olefin copolymer (COC), polymethyl methacrylate (PMMA), polyethylene terephthalate (PET), polycarbonate (PC), polyetherimide, or fluorocarbon polymer; or inorganic materials, such as silicone, glass, aluminum oxide ($Al_2O_3$), silicon nitride ($SiN_x$), silicon oxide ($SiO_2$), titanium oxide ($TiO_2$), or magnesium fluoride ($MgF_2$). The first semiconductor layer t101 and the second semiconductor layer t102, such as cladding layers, or confinement layers, include different conductivity types, electricity, polarity, or dopant elements to provide electrons and holes. The active layer t103 is formed between the first semiconductor layer t101 and the second semiconductor layer t102, so the electrons and the holes combine in the active layer t103 under an electrical current to convert electrical energy to optical energy for emitting a light. The dominant wavelength of the light is adjusted by changing physical and chemical compositions of one or more layers in the semiconductor stack t100. The material of the semiconductor stack t100 includes group III-V semiconductor materials, such as $Al_xIn_yGa_{(1-x-y)}N$ or $Al_xIn_yGa_{(1-x-y)}P$, wherein $0 \le x$, $y \le 1$; $(x+y) \le 1$. In accordance with the material of the active layer t103, the semiconductor stack t100 can emit a red light with a dominant wavelength between such as 610 nm and 650 nm, a green light with a dominant wavelength between such as 530 nm and 570 nm, a blue light with a dominant wavelength between such as 450 nm and 490 nm, or a UV light with a dominant wavelength between such as 230 nm and 400 nm. The active layer t103 includes single heterostructure (SH), double heterostructure (DH), double-side double heterostructure (DDH), or multi-quantum well (MQW) structure. The doping strategy of the active layer t103 includes un-intentionally doping, p-type dopant doping, or n-type dopant doping.

Parts of the active layer t103 and the second semiconductor layer t102 are removed to form the plurality of first trenches t120a, the second trench t120b, and the plurality of semiconductor constructions t1000. The plurality of first trenches t120a and the second trench t120b penetrate the semiconductor stack t100 to expose the surface t1012S of the first semiconductor layer t101. The second trench t120b is disposed near the outmost edge of the semiconductor stack t100, and each of the plurality of first trenches t120a is interposed between the semiconductor constructions t1000. The plurality of first trenches t120a and the second trench t120b surround the active layer t103 and the second semiconductor layer t102. Moreover, each of the plurality of first trenches t120a includes two ends, and at least one of the two ends connects to the second trench t120b. Herein a width of one of the plurality of first trenches t120a $W_1$ is greater than a width of the second trench t120b $W_2$, for example, $W_1 = 2W_2$, the first trenches t120a are parallel to each other, two ends of each of the first trenches t120a are connected to the second trench t120b. In a top view, a shape of one of the plurality first trenches t120a includes a stripe, and a shape of the second trench t120b includes a geometric shape, for example, a ring-like shape, to surround the active layer t103, the number of the second trench t120b is one, and the active layer t103 and the second semiconductor layer t102b are disposed in the second trench t120b in a top view, but the application is not limited hereto.

The transparent conductive layer t300 is formed on the second semiconductor layer t102. The transparent conductive layer t300 electrically connects to the semiconductor stack t100 when the electrical current is injected. The material of the transparent conductive layer t300 includes transparent material which is transparent to the light emitted from the active layer t103. The structure of the transparent conductive layer t300 can be one or more layers.

The first insulating layer t600 is formed to cover the periphery side surface t1011S of the first semiconductor layer t101 and the surface t1012S of the first semiconductor layer t101 in the plurality of first trenches t120a and the second trench t120b and deposited on a inclined wall t1021S of the semiconductor stack t100 to protect the epitaxial quality of the semiconductor stack t100 from being damaged by the following process. The first insulating layer t600 is patterned by lithography technique to provide the first group of first insulating regions t600a corresponding to the plurality of first trenches t120a, and the second group of first insulating regions t600b corresponding to the second trenches t120b.

The reflective layer t310 is formed on the transparent conductive layer t300 and aligned with transparent conductive layer t300 for increasing the light extraction efficiency of the semiconductor light-emitting device T. Additionally, a barrier layer (not shown) can be form on and cover the reflective layer t310 so that the barrier layer can prevent migration, diffusion, or oxidation of the reflective layer t310. In an example of the embodiment, the reflective layer t310 directly contacts the transparent conductive layer t300. A sidewall of the barrier layer can be aligned with a sidewall of the reflective layer t310 or extend to outside of a sidewall of the reflective layer t310. When the sidewall of the barrier layer is formed beyond the sidewall of the reflective layer t310, the reflective layer 310 is covered by the barrier layer, and a portion of the barrier layer directly contacts the second semiconductor layer t102 or the transparent conductive layer t300. The reflective layer t310 can include a single layer structure or a multi-layer structure, and the material of the reflective layer t310 includes metal material with high reflectivity, such as silver (Ag), gold (Au), aluminum (Al), titanium (Ti), chromium (Cr), copper (Cu), nickel (Ni), platinum (Pt), or an alloy thereof. The barrier layer can include a single layer structure or a multi-layer structure, and the material of the barrier layer includes chromium (Cr), platinum (Pt), titanium (Ti), tungsten (W), or zinc (Zn). When the barrier layer is the multi-layer structure, the barrier layer is alternately stacked by a first barrier layer (not shown) and a second barrier layer (not shown), for example, Cr/Pt, Cr/Ti, Cr/TiW, Cr/W, Cr/Zn, Ti/Pt, Ti/W, Ti/TiW, Ti/W, Ti/Zn, Pt/TiW, Pt/W, Pt/Zn, TiW/W, TiW/Zn, or W/Zn.

The second insulating layer t700 is formed to cover a portion of the reflective layer t310 and the inclined sidewalls t1021S of the plurality of semiconductor constructions t1000. The second insulating layer t700 is patterned by lithography technique to expose the periphery side surface t1011S and the surface t1012S of the first semiconductor layer t101 and provide a first group of second insulating openings t7001 wherein the first group of second insulating openings t7001 of the second insulating layer t700 exposes a portion the reflective layer t310.

The patterned metal layer t200 is formed on the second insulating layer t700 and a portion of the reflective layer t310 and fills the plurality of first trenches t120a and the second trench t120b to cover the plurality of semiconductor constructions t1000. The patterned metal layer t200 includes the first metal region t200a, the second metal region t200b, and the plurality of ring-like openings t2001. The first metal region t200a includes the group of sub-regions t200a1, t200a2, t200a3. The plurality of ring-like openings t2001 surrounds the group of sub-regions t200a1, t200a2, t200a3 respectively. In the embodiment, the group of sub-regions t200a1, t200a2, t200a3 electrically connects to the second semiconductor layer t102 through the reflective layer t310 and the transparent conductive layer t300. Additionally, the second metal region t200b is continuously formed over the second insulating layer t700, fills in the plurality of first trenches t120a and the second trench t120b and covers the periphery side surface t1011S, so as to contact the periphery side surface t1011S and the surface t1012S of the first semiconductor layer t101. Accordingly, the second metal region t200b electrically connects to the first semiconductor layer t1011S. In another embodiment, similar to above embodiments, the patterned metal layer t200 can extend to the surface of the substrate t110 not covered by the first semiconductor layer t101. The patterned metal layer t200 can be a single layer structure or a multi-layer structure. The material of the patterned metal layer t200 includes metal such as aluminum (Al), chromium (Cr), platinum (Pt), titanium (Ti), tungsten (W), or zinc (Zn).

A third insulating layer t800 is deposited on the semiconductor stack t100. The third insulating layer t800 is patterned by lithography technique to form the first insulating region t800a, the first group of third insulating openings t8001 and the second group of third insulating openings t8002 on the semiconductor stack t100. The first group of third insulating openings t8001 of the third insulating layer t800 exposes the patterned metal layer t200. The first group of third insulating openings t8001 exposes several portions of the sub-regions t200a1, t200a2, t200a3. The second group of third insulating openings t8002 exposes a plurality of portions of the second metal region t200b respectively. In one embodiment, the first group of third insulating openings t8001 and the second group of third insulating openings t8002 are formed on two sides of the semiconductor stack t100 from a top view of the semiconductor light-emitting device T. In the embodiment, a number of the first group of third insulating openings t8001 is different from that of the second group of third insulating openings t8002.

The material of the first insulating layer t600, the second insulating layer t700, and the third insulating layer t800 includes non-conductive material which includes organic materials, such as Su8, benzocyclobutene (BCB), perfluorocyclobutane (PFCB), epoxy, acrylic resin, cyclic olefin polymer (COC), polymethyl methacrylate (PMMA), polyethylene terephthalate (PET), polycarbonate (PC), polyetherimide, or fluorocarbon polymer, or inorganic materials, such as silicone, glass, aluminum oxide ($Al_2O_3$), silicon nitride ($SiN_x$), silicon oxide ($SiO_2$), titanium oxide ($TiO_2$), or magnesium fluoride ($MgF_2$). The first insulating layer t600, the second insulating layer t700, and the third insulating layer t800 can be formed by printing, evaporation or sputtering.

The plurality of first pad portions t400 is formed on the second semiconductor layer t102 and the third insulating layer t800, and contacts the first metal region t200a including the group of sub-regions t200a1, t200a2, t200a3 of the patterned metal layer t200 respectively through the first group of third insulating openings t8001 so that the first pad portions t400 electrically connects the second semiconductor layer t102 through the group of sub-regions t200a1, t200a2, t200a3. Meanwhile, the plurality of second pad portions t500 is formed on the second semiconductor layer t102 and the third insulating layer t800, and contacts the second metal region t200b of the patterned metal layer t200 through the second group of third insulating openings t8002 so that the second pad portions t500 electrically connects the first semiconductor layer t101. Notably, the plurality of first pad portions t400 or the plurality of second pad portions t500 is devoid of directly contacting the portions of the patterned metal layer t200 formed in the plurality of first trenches t120a and the second trench t120b. Moreover, a shape of the plurality of first pad portions t400 includes a plurality of first rectangles, a shape of the plurality of second pad portions t500 includes a plurality of rectangles, and the first pad portions t400 are separated from one another and also separated from the second pad portions t500. Additionally, the plurality of first pad portions t400 is disposed in a row, aligned with the second pad portions t500, and surrounded by the plurality of first trenches t120a and the second trench t120b. As mentioned above, the plurality of first trenches t120a and the second trench t120b compose a plurality of rectangles, and in a top view, each of the plurality of first pad portions t400 or each of the plurality of second pad portions t500 is disposed in the rectangles respectively. The material of the plurality of first pad portions t400 and the plurality of second pad portions t500 includes metal, such as titanium (Ti), platinum (Pt), nickel (Ni), tin (Sn), or gold (Au), or an alloy thereof. An area of one of the plurality of first pad portions t400 can be the same as or different from an area of one of the plurality of second pad portions t500.

In the light-emitting device T of the application, the patterned metal layer t200 in the trenches t120a and t120b can spread current uniformly. Accordingly, the reliability can be improved and the forward voltage can be decreased.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A semiconductor light-emitting device, comprising:
   a substrate;
   a first semiconductor layer, a second semiconductor layer, and an active layer between the first semiconductor layer and the second semiconductor layer formed on the substrate;
   a plurality of semiconductor constructions formed on the substrate, respectively comprising the first semiconductor layer, the second semiconductor layer, and the active layer;
   a plurality of first trenches penetrating the second semiconductor :layer and the active layer to expose the first semiconductor layer;
   a second trench penetrating the second semiconductor layer and the active layer to expose a periphery region of the first semiconductor layer, wherein the second trench is disposed near an outmost edge of the active layer, and surrounds the plurality of semiconductor constructions and the plurality of first trenches, wherein the first semiconductor layer of each of the plurality of semiconductor constructions are connected to each other through the first semiconductor layer exposed by the plurality of first trenches and the second trench in a cross-sectional view of the semiconductor light-emitting device, and the second semiconductor layer of each of the plurality of semiconductor constructions are separated from each other by one of the plurality of first trenches in a top view of the semiconductor light-emitting device;

a patterned metal layer formed on the plurality of semiconductor constructions and filling in the plurality of first trenches and the second trench;

a plurality of first pad portions physically separated from each other, respectively formed on the second semiconductor layer of each of the plurality of semiconductor constructions; and a plurality of second pad portions physically separated from each other, respectively formed on the second semiconductor layer of each of the plurality of semiconductor constructions, wherein the periphery region of first semiconductor layer comprises a top surface exposed by the second trench and a periphery side surface connecting to the top surface of the first semiconductor layer of the periphery region, wherein the periphery side surface is an exposed outermost side surface of the first semiconductor layer of the periphery region, and wherein the patterned metal layer comprises a plurality of first metal regions physically separated from each other, respectively formed on the second semiconductor layer of each of the plurality of semiconductor constructions, and a second metal region electrically isolated to the plurality of first metal regions, and portions of the second metal region are formed in the plurality of first trenches and the second trench.

2. The semiconductor light-emitting device of claim 1, wherein a width of one of the plurality of first trenches is greater than a width of the second trench.

3. The semiconductor light-emitting device of claim 1, wherein the plurality of first pad portions is aligned with the plurality of second pad portions.

4. The semiconductor light-emitting device of claim 1, wherein in a top view, a shape composed by the plurality of first trenches and the second trench comprises a plurality of rectangles, and the plurality of first pad portions and the plurality of second pad portions are respectively disposed in the plurality of rectangles.

5. The semiconductor light-emitting device of claim 1, wherein the plurality of first trenches is parallel to one another in the top view of the semiconductor light-emitting device.

6. The semiconductor light-emitting device of claim 1, further comprising a transparent conductive layer formed on the second semiconductor layers of each of the plurality of semiconductor constructions.

7. The semiconductor light-emitting device of claim 6, wherein the transparent conductive layer comprises indium tin oxide (ITO) or indium zinc oxide (IZO).

8. The semiconductor light-emitting device of claim 6, further comprising a reflective layer formed on the transparent conductive layer of the plurality of semiconductor constructions.

9. The semiconductor light-emitting device of claim 1, further comprising a reflective layer formed on the second semiconductor layers of the plurality of semiconductor constructions.

10. The semiconductor light-emitting device of claim 9, further comprising a second insulating layer covers the plurality of semiconductor constructions, wherein the second insulating layer comprises a plurality of second insulating openings respectively exposing the reflective layer of the plurality of semiconductor constructions.

11. The semiconductor light-emitting device of claim 10, wherein the second insulating layer comprises a distributed Bragg reflector (DBR) which includes a plurality pairs of sub-layers, and each sub-layer has a refractive index different from that of adjacent sub-layers.

12. The semiconductor light-emitting device of claim 1, further comprising a first insulating layer covering the periphery side surface.

13. The semiconductor light-emitting device of claim 1, wherein the plurality of first trenches are connected to the second trench in the top view of the semiconductor light-emitting device.

14. A semiconductor light-emitting device, comprising:
a substrate;
a first semiconductor layer formed on the substrate;
a plurality of semiconductor constructions formed on the substrate, respectively comprising the first semiconductor layer, a second semiconductor layer, and an active layer between the first semiconductor layer and the second semiconductor layer;
a plurality of first trenches exposing the first semiconductor layer;
a second trench exposing a periphery region of the first semiconductor layer, wherein the second trench is disposed near an outmost edge of the active layer, and surrounds the plurality of semiconductor constructions and the plurality of first trenches, wherein the first semiconductor layer of each of the plurality of semiconductor constructions are connected to each other through the first semiconductor layer exposed by the plurality of first trenches and the second trench in a cross-sectional view of the semiconductor light-emitting device, and the second semiconductor layer of each of the plurality of semiconductor constructions are separated from each other in a top view of the semiconductor light-emitting device;
a patterned metal layer formed on the plurality of semiconductor constructions and filling in the plurality of first trenches and the second trench;
a plurality of first pad portions respectively formed on the second semiconductor layer of each of the plurality of semiconductor constructions;
a plurality of second pad portions respectively formed on the second semiconductor layer of each of the plurality of semiconductor constructions,
wherein the periphery region of first semiconductor layer comprises a top surface exposed by the second trench and a periphery side surface connecting to the top surface of the first semiconductor layer of the periphery region,
wherein the periphery side surface is an exposed outermost side surface of the first semiconductor layer of the periphery region, and
wherein the patterned metal layer comprises a plurality of first metal regions respectively formed on the second semiconductor layers of the plurality of semiconductor constructions, and a second metal region electrically isolated to the plurality of first metal regions, and portions of the second metal region are formed in the plurality of first trenches and the second trench; and
a third insulating layer covering the plurality of semiconductor constructions, wherein the third insulating layer comprises a first group of third insulating openings respectively exposing the plurality of first metal regions, and a second group of third insulating openings respectively exposing the second metal region of the plurality of semiconductor constructions.

15. The semiconductor light-emitting device of claim 14, wherein the plurality of first pad portions is aligned with the plurality of second pad portions.

16. The semiconductor light-emitting device of claim 14, further comprising a transparent conductive layer formed on the second semiconductor layers of each of the plurality of semiconductor constructions.

17. The semiconductor light-emitting device of claim 14, further comprising a reflective layer formed on the second semiconductor layers of the plurality of semiconductor constructions.

18. The semiconductor light-emitting device of claim 17, further comprising a second insulating layer covering the plurality of semiconductor constructions, wherein the second insulating layer comprises a plurality of second insulating openings respectively exposing the reflective layer of the plurality of semiconductor constructions.

19. The semiconductor light-emitting device of claim 14, wherein the plurality of first trenches are connected to the second trench in the top view of the semiconductor light-emitting device.

* * * * *